(12) United States Patent
Kanematsu et al.

(10) Patent No.: US 12,300,450 B2
(45) Date of Patent: May 13, 2025

(54) CONTROL SYSTEM AND INTERRUPTER SYSTEM

(71) Applicant: PANASONIC INTELLECTUAL PROPERTY MANAGEMENT CO., LTD., Osaka (JP)

(72) Inventors: Kenji Kanematsu, Osaka (JP); Shinya Kimoto, Osaka (JP); Yoshihisa Fukuda, Osaka (JP); Kazuhisa Kinoshita, Mie (JP); Shun Ito, Hyogo (JP); Kazuhiro Kodama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/434,433

(22) Filed: Feb. 6, 2024

(65) Prior Publication Data
US 2024/0177946 A1 May 30, 2024

Related U.S. Application Data

(63) Continuation of application No. 17/260,507, filed as application No. PCT/JP2019/028555 on Jul. 19, 2019, now Pat. No. 11,935,712.

(30) Foreign Application Priority Data

Jul. 31, 2018 (JP) ................................. 2018-144274

(51) Int. Cl.
*H01H 3/28* (2006.01)
*G01R 19/165* (2006.01)
(Continued)

(52) U.S. Cl.
CPC ......... *H01H 3/28* (2013.01); *G01R 19/16538* (2013.01); *H01H 1/221* (2013.01);
(Continued)

(58) Field of Classification Search
None
See application file for complete search history.

(56) References Cited

U.S. PATENT DOCUMENTS 3,248,627 A 4/1966 Shockroo et al.
4,292,611 A 9/1981 Bresson et al.
(Continued)

FOREIGN PATENT DOCUMENTS

JP 39-14336 7/1964
JP 49-43162 4/1974
(Continued)

OTHER PUBLICATIONS

International Search Report (ISR) from International Searching Authority (Japan Patent Office) in International Pat. Appl. No. PCT/JP2019/028555, dated Oct. 8, 2019, together with an English language translation.
(Continued)

*Primary Examiner* — Bernard Rojas
(74) *Attorney, Agent, or Firm* — Greenblum & Bernstein, P.L.C.

(57) ABSTRACT

An interrupter system includes a first coil and an interrupter electrically connected to the first coil. The interrupter includes: a first terminal; a second terminal electrically connected to the first terminal; a third terminal electrically separated from the first terminal and the second terminal; a heat generating element electrically connected to the third terminal; and an explosive configured to be ignited by the heat generating element to produce a gas for interrupting an electrical connection between the first terminal and the second terminal. The first coil is electrically connected to the heat generating element via the third terminal. Moreover, the first coil is configured to, when an abnormal current flows between the first terminal and the second terminal, generate
(Continued)

an electric power for igniting the explosive from the abnormal current.

10 Claims, 40 Drawing Sheets

(51) Int. Cl.
*H01H 1/22* (2006.01)
*H01H 1/54* (2006.01)
*H01H 3/32* (2006.01)
*H01H 9/54* (2006.01)
*H01H 37/52* (2006.01)
*H01H 71/16* (2006.01)
*H01H 71/24* (2006.01)
*H01H 71/28* (2006.01)
*H01H 73/04* (2006.01)
*H01H 83/22* (2006.01)

(52) U.S. Cl.
CPC ............. *H01H 1/54* (2013.01); *H01H 3/32* (2013.01); *H01H 9/54* (2013.01); *H01H 37/52* (2013.01); *H01H 71/16* (2013.01); *H01H 71/2409* (2013.01); *H01H 71/28* (2013.01); *H01H 73/04* (2013.01); *H01H 83/223* (2013.01); *H01H 2071/249* (2013.01); *H01H 2221/022* (2013.01)

(56) References Cited

U.S. PATENT DOCUMENTS

| | | |
|---|---|---|
| 5,856,905 A | 1/1999 | Eckel et al. |
| 6,600,640 B1 | 7/2003 | Buscher et al. |
| 8,860,537 B2 | 10/2014 | Sora |
| 10,395,870 B2 | 8/2019 | Bobert |
| 2012/0106017 A1* | 5/2012 | Schumacher .......... H02H 5/083 361/114 |
| 2012/0188032 A1 | 7/2012 | Wu |
| 2013/0229742 A1* | 9/2013 | Auguet ................. B60L 3/0046 361/114 |
| 2014/0065452 A1* | 3/2014 | Hjerpe .................. B60L 3/0046 429/61 |
| 2016/0181038 A1 | 6/2016 | Shimizu et al. |
| 2016/0343524 A1 | 11/2016 | Gaudinat et al. |
| 2016/0351363 A1 | 12/2016 | Gaudinat et al. |
| 2017/0076890 A1 | 3/2017 | Hori et al. |
| 2018/0147941 A1 | 5/2018 | Kube |
| 2018/0166244 A1* | 6/2018 | Kobayashi ............ H01H 50/54 |

FOREIGN PATENT DOCUMENTS

| | | |
|---|---|---|
| JP | 54-146868 | 10/1979 |
| JP | S57-151865 | 9/1982 |
| JP | 62-168742 | 10/1987 |
| JP | 07-105819 | 4/1995 |
| JP | H09-148160 | 6/1997 |
| JP | 2001-526445 | 12/2001 |
| JP | 2017-054774 | 3/2017 |
| JP | 2017-507469 | 3/2017 |
| WO | WO-2020153245 A1 * | 7/2020 |

OTHER PUBLICATIONS

Extended European Search Report (EESR) from European Patent Office (EPO) in European Patent Appl. No. 19844825.0, dated Oct. 6, 2021.
Office Action from Japan Patent Office (JPO) in Japanese Patent Appl. No. 2020-533434, dated Sep. 12, 2023, together with an English language translation.
Office Action from Japan Patent Office (JPO) in Japanese Patent Appl. No. 2024-008137, dated Aug. 6, 2024, together with an English language translation.

* cited by examiner

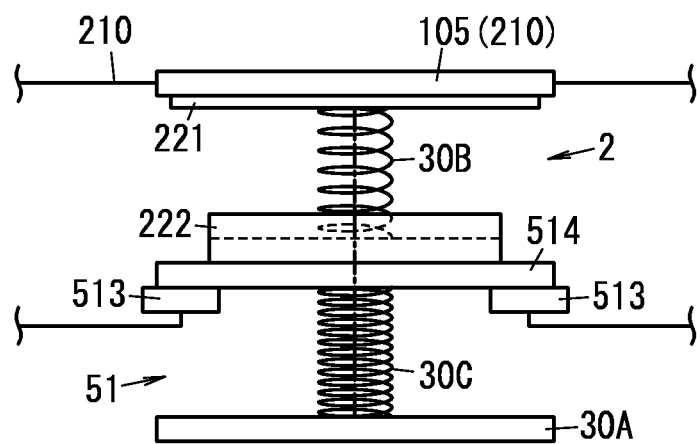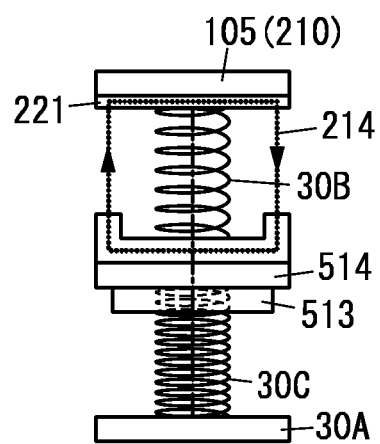

CONTROL SYSTEM AND INTERRUPTER SYSTEM

CROSS REFERENCE TO RELATED APPLICATIONS

This is a continuation of U.S. patent application Ser. No. 17/260,507, filed Jan. 14, 2021, which is a National Stage Entry of International Pat. Appl. No. PCT/JP2019/028555, filed Jul. 19, 2019, which claims priority to Japanese Pat. Appl. No. 2018-144274, filed Jul. 31, 2018. The entire disclosure of each of the above-identified documents, including the specification, drawings and claims, is incorporated herein by reference in its entirety.

TECHNICAL FIELD

The present disclosure generally relates to a control system and an interrupter system, and more particularly relates to a control system for controlling an interrupter that interrupts an electric circuit and an interrupter system including the control system.

BACKGROUND ART

Patent Literature 1 discloses a conduction cutoff device. The conduction cutoff device of Patent Literature 1 is applicable to an electric circuit. The electric circuit includes, as its constituent components, a storage battery and an electrical device. In this electric circuit, the electrical device is activated with power supplied from the storage battery. The conduction cutoff device of Patent Literature 1 cuts off conduction between the constituent components of the electric circuit by cutting an electrical conductor.

The electric circuit is used as a piece of onboard equipment for a vehicle. The conduction cutoff device cuts off conduction between constituent components of the electric circuit (such as the storage battery and the electrical device) in cases of crash of vehicles. The vehicle is equipped with a crash sensor for detecting any crash and an electronic control unit for receiving a signal from the crash sensor. On detecting a crash of vehicles based on an output signal of the crash sensor, the electronic control unit activates the conduction cutoff device. Activating the conduction cutoff device causes the supply of power from the storage battery to the electrical device to be cut off.

In the electric circuit of Patent Literature 1, the electronic control unit detects any crash of vehicles based on the output signal of the crash sensor to activate the conduction cutoff device. Thus, in the electric circuit of Patent Literature 1, it takes some time for the electronic control unit to determine whether there is any crash or not, thus possibly causing a delay in activation of the conduction cutoff device.

CITATION LIST

Patent Literature

Patent Literature 1: JP 2017-54774 A

SUMMARY OF INVENTION

In view of the foregoing background, it is therefore an object of the present disclosure to provide a control system and an interrupter system contributing to shorten the time it takes to activate an interrupter.

Solution to Problem

A control system according to an aspect of the present disclosure is designed to control an interrupter. The interrupter is started by a startup current to interrupt a main electric circuit. The startup current flows through an auxiliary electric circuit and has a current valve equal to or greater than a predetermined value. The control system includes a driving unit and a driven unit. The driving unit includes an intermediate electrical path to be connected to the main electric circuit. The driven unit is to be connected to the auxiliary electric circuit. When an abnormal current having a current value equal to or greater than a prescribed value flows through the intermediate electrical path, the driving unit uses, as a drive source for driving the driven unit, the abnormal current flowing through the intermediate electrical path. The driven unit supplies the auxiliary electric circuit with the startup current by being driven by the driving unit.

An interrupter system according to another aspect of the present disclosure includes the control system described above and the interrupter.

BRIEF DESCRIPTION OF DRAWINGS

FIG. 16A is a configuration diagram illustrating a state of another exemplary driving unit and contact device that have not started to operate yet in the control system;

FIG. 16B is a configuration diagram of the driving unit and the contact device as viewed from a direction perpendicular to the viewing direction in FIG. 16A;

DESCRIPTION OF EMBODIMENTS

Note that embodiments and their variations to be described below are only examples of the present disclosure and should not be construed as limiting. Rather, those embodiments and variations may be readily modified in various manners depending on a design choice or any other factor without departing from a true spirit and scope of the present disclosure.

(1) First Embodiment (1.1) Overview

A control system 800 and interrupter system 900 according to a first embodiment will be described with reference to FIGS. 1-4.

Figure 1:
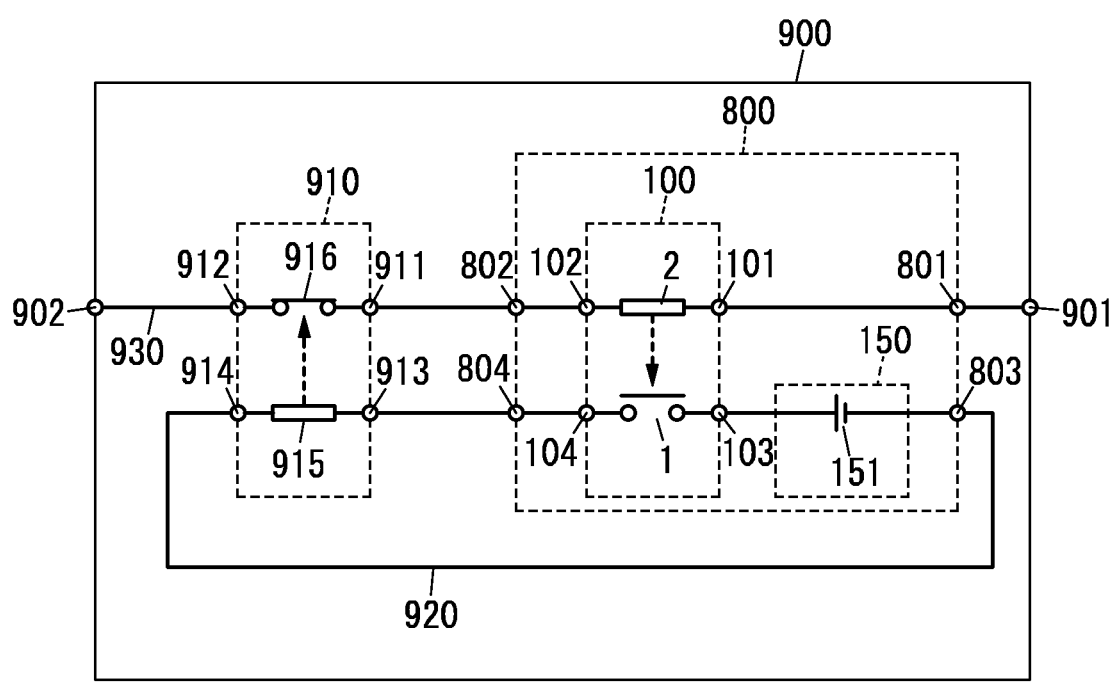
FIG. 1 is a configuration diagram of an interrupter system including a control system according to a first embodiment.

As shown in FIG. 1, an interrupter system 900 according to this embodiment includes a control system 800 and an interrupter 910. The interrupter 910 is started by a startup current (i.e., a current having a current value equal to or greater than a predetermined value) to interrupt a main electric circuit 930. The startup current flows through an auxiliary electric circuit 920 and has a current valve equal to or greater than the predetermined value.

The control system 800 controls the interrupter 910. The control system 800 includes a driven unit 1 and a driving unit 2. The driven unit 1 is connected to the auxiliary electric circuit 920. The driving unit 2 includes an intermediate electrical path 210 to be connected to the main electric circuit 930. The intermediate electrical path 210 forms part of the main electric circuit 930. The driven unit 1 is driven by the driving unit 2. Note that in FIG. 1, the driven unit 1 is illustrated as a normally open contact.

As shown in FIG. 1, the control system 800 (specifically, the driven unit 1) is connected to the interrupter 910 through the auxiliary electric circuit 920. In addition, the control system 800 (specifically, the driving unit 2) is connected to the interrupter 910 through the main electric circuit 930. In the control system 800, when an abnormal current (i.e., a current having a current value equal to or greater than a prescribed value) flows through the main electric circuit 930, the abnormal current flows through the intermediate electrical path 210 of the driving unit 2. In this control system 800, the driving unit 2 drives the driven unit 1 using the abnormal current flowing through the intermediate electrical path 210 as a drive source. The driven unit 1 supplies the auxiliary electric circuit 920 with the startup current by being driven by the driving unit 2. This causes the interrupter 910 to be activated and interrupt the main electric circuit 930. Note that unless the driven unit 1 is driven by the driving unit 2, the driven unit 1 supplies the auxiliary electric circuit 920 with no startup current.

The abnormal current may be an overcurrent, a short-circuit current, or any other current that flows through the main electric circuit 930 due to a short-circuit of, for example, a constituent component of the main electric circuit 930 when an accident happens to a vehicle 300 equipped with the interrupter system 900, for example.

More specifically, the control system 800 according to this embodiment includes a switch system 100 and a current supply source 150 as shown in FIG. 1.

The current supply source 150 is a power supply for supplying the startup current to the auxiliary electric circuit 920 and is connected to the auxiliary electric circuit 920. Note that the current supply source 150 does not have to be one of constituent elements of the control system 800.

The switch system 100 includes the driven unit 1 and the driving unit 2 described above. The switch system 100 (specifically, the driven unit 1) is connected to the auxiliary electric circuit 920. The switch system 100 (specifically, the driving unit 2) is connected to the main electric circuit 930. The switch system 100 operates using, as its drive source, the abnormal current flowing through the intermediate electrical path 210 of the driving unit 2 (i.e., the abnormal current flowing through the main electric circuit 930). That is to say, in the switch system 100, energy conversion is performed such that a magnetic field or heat caused by the abnormal current flowing through the intermediate electrical path 210 of the driving unit 2 mechanically drives the driven unit 1. When the driving unit 2 operates, the control system 800 supplies the startup current from the current supply source 150 to the interrupter 910 through the auxiliary electric circuit 920. On the other hand, in the switch system 100, when the abnormal current does not flow through the main electric circuit 930 (i.e., either when no current flows or when the current value thereof is smaller than the prescribed value), the driving unit 2 is not activated and the auxiliary electric circuit 920 is not supplied with the startup current (i.e., a current having a current value equal to or greater than the predetermined value). A specific configuration for the switch system 100 will be described later.

As described above, the control system 800 according to this embodiment is activated and supplies the startup current to the auxiliary electric circuit 920 (i.e., has the startup current supplied from the current supply source 150) when the abnormal current flows through the main electric circuit 930. When the auxiliary electric circuit 920 is supplied with the startup current, the interrupter 910 interrupts the main electric circuit 930. That is to say, unlike the electronic control unit of Patent Literature 1, there is no need for the control system 800 according to this embodiment to perform the crash determination processing using a processor, for example. This shortens the time it takes to start the interrupter 910 (i.e., to allow the interrupter 910 to start operating) compared to the electric circuit of Patent Literature 1.

(1.2) Details (1.2.1) Power Supply System

Figure 2:
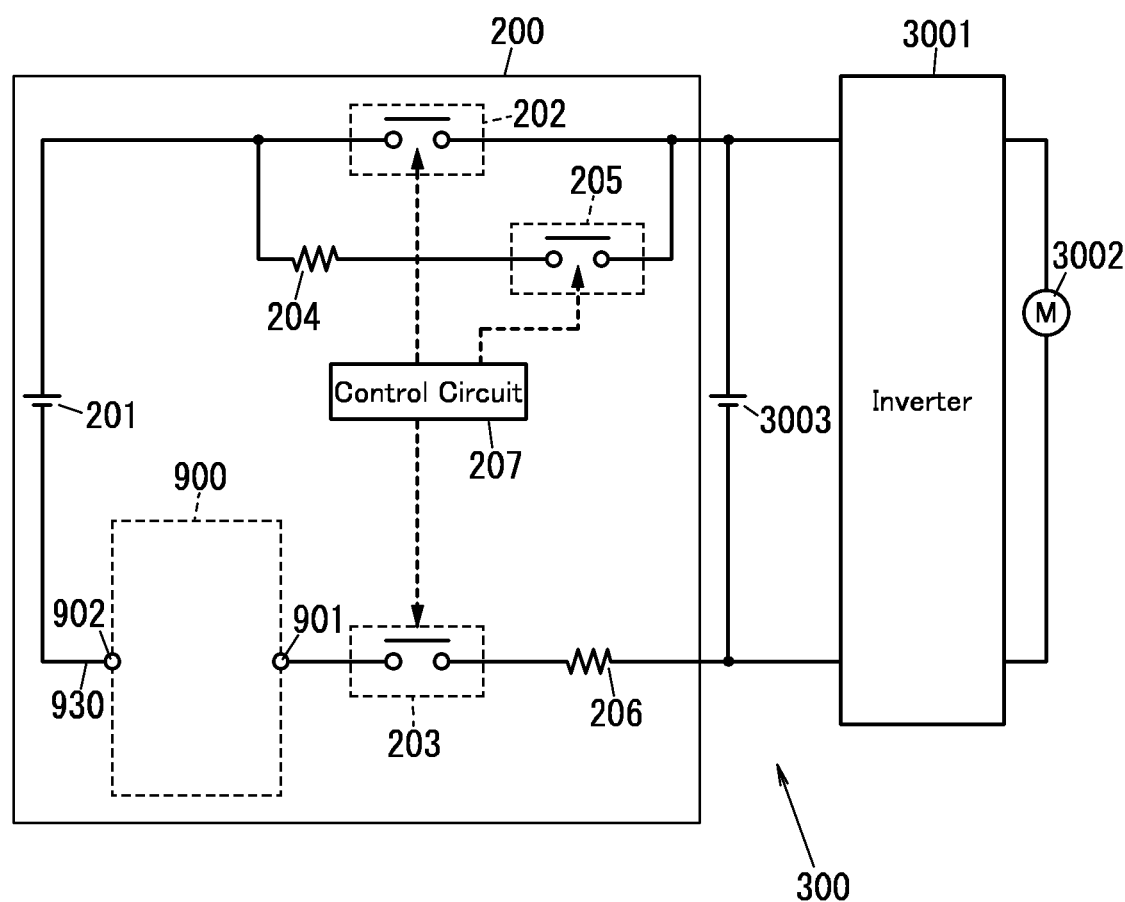
FIG. 2 is a configuration diagram of a power supply system and vehicle including the interrupter system.

The interrupter system 900 is used in, for example, a power supply system 200 and forms part of the power supply system 200 as shown in FIG. 2.

The power supply system 200 may be installed in, for example, a vehicle 300 such as an electric vehicle and drives a motor 3002, which is connected thereto via an inverter 3001, thereby making the vehicle 300 travel. In the vehicle 300, a pre-charge capacitor 3003 is connected to the inverter 3001 in parallel as shown in FIG. 2.

During powering, the inverter 3001 converts DC power supplied from the power supply system 200 into AC power and supplies the AC power to the motor 3002. During regeneration, the inverter 3001 converts the AC power supplied from the motor 3002 into DC power and supplies the DC power to the power supply system 200. The motor 3002 may be a three-phase AC synchronous motor, for example.

The power supply system 200 includes not only the interrupter system 900 but also a battery 201, a first main relay 202, a second main relay 203, a pre-charge resistor 204, a pre-charge relay 205, a current sensor (shunt resistor) 206, and a control circuit 207 as well.

The battery 201, the first main relay 202, the second main relay 203, the current sensor 206, and the interrupter system 900 are connected in series through the main electric circuit 930.

The battery 201 includes a plurality of battery cells that are connected in series. As the battery cells, nickel hydrogen battery cells or lithium-ion battery cells, for example, may be used.

A first end of the first main relay 202 is connected to the positive electrode of the battery 201 and a second end thereof is connected to a first input terminal (high-potential input terminal) of the inverter 3001.

A first end of the second main relay 203 is connected to a first end 901 of the interrupter system 900 and a second end of the second main relay 203 is connected to a second input terminal (low-potential input terminal) of the inverter 3001 via the current sensor 206. A second end 902 of the interrupter system 900 is connected to the negative electrode of the battery 201.

A series circuit of the pre-charge resistor 204 and the pre-charge relay 205 is connected to the first main relay 202 in parallel.

The control circuit 207 controls the operations of the first main relay 202, the second main relay 203, and the pre-charge relay 205. The control circuit 207 may be implemented as, for example, an electronic control unit (ECU) for the vehicle 300.

When the motor 3002 starts to be powered, the control circuit 207 closes the pre-charge relay 205 and the second main relay 203 to charge the pre-charge capacitor 3003. This reduces the supply of an inrush current to the motor 3002. When the pre-charge capacitor 3003 is charged fully, the control circuit 207 opens the pre-charge relay 205 and closes the first main relay 202 to start the supply of power from the power supply system 200 to the motor 3002.

In addition, based on the current detected by the current sensor 206, the control circuit 207 detects any error that has occurred on the main electric circuit 930. When any error occurs on the main electric circuit 930, the control circuit 207 operates (i.e., opens) at least one of the first main relay 202 or the second main relay 203 to interrupt the main electric circuit 930. For example, on detecting that the magnitude of the current detected by the current sensor 206 has been greater than a threshold value continuously for a predetermined amount of time, the control circuit 207 opens at least one of the first main relay 202 or the second main relay 203, thus interrupting the main electric circuit 930. In that case, when the opened relay (which may be the first main relay 202 and/or the second main relay 203) is closed again by the control circuit 207, for example, the main electric circuit 930 becomes electrically continuous again to resume the supply of power from the power supply system 200 to the motor 3002.

The interrupter system 900 operates independently of the control circuit 207. The interrupter system 900 is connected to the main electric circuit 930. The interrupter system 900 normally (in a normal state) makes the main electric circuit 930 electrically continuous. When an abnormal current (i.e., a current having a current value equal to or greater than a prescribed value) flows through the main electric circuit 930, the interrupter system 900 interrupts the main electric circuit 930 (independently of the control circuit 207).

(1.2.2) Interrupter System

Next, a configuration for the interrupter system 900 will be described with reference to FIG. 1.

As described above, the interrupter system 900 includes the control system 800 and the interrupter 910.

The control system 800 includes a first end 801 and a second end 802, both of which are connected to the main electric circuit 930. The control system 800 further includes a third end 803 and a fourth end 804, both of which are connected to the auxiliary electric circuit 920.

The interrupter 910 includes a first end 911 and a second end 912, both of which are connected to the main electric circuit 930. The interrupter 910 further includes a third end 913 and a fourth end 914, both of which are connected to the auxiliary electric circuit 920.

As shown in FIG. 1, on the main electric circuit 930, the first end 801 of the control system 800 is connected to the first end 901 of the interrupter system 900. The second end 802 of the control system 800 is connected to the first end 911 of the interrupter 910. The second end 912 of the interrupter 910 is connected to the second end 902 of the interrupter system 900.

On the auxiliary electric circuit 920, the third end 803 of the control system 800 is connected to the fourth end 914 of the interrupter 910. The fourth end 804 of the control system 800 is connected to the third end 913 of the interrupter 910.

The interrupter 910 is a switch device which may be started by a current and activated by explosion occurring in the device, for example. For example, the interrupter 910 may be started by a startup current (i.e., a current having a current value equal to or greater than a predetermined value) flowing through the auxiliary electric circuit 920 and may interrupt the main electric circuit 930 by using energy produced by an explosion (combustion) occurring in the device.

The interrupter 910 according to this embodiment may be an interrupter that uses an initiator, for example. The interrupter 910 includes a gas producer 915 and an electrical conductor 916. The gas producer 915 includes a heat generating element connected between the third end 913 and fourth end 914 of the interrupter 910 and a fuel (explosive) arranged around the heat generating element. The electrical conductor 916 is connected between the first end 911 and second end 912 of the interrupter 910. In FIG. 1 and other drawings, the electrical conductor 916 is illustrated as a normally closed contact. In the interrupter 910, when the startup current flows through the heat generating element of the gas producer 915 through the auxiliary electric circuit 920, the heat generating element generates heat to increase the temperature of the explosive. When the temperature of the explosive exceeds its firing point, the explosive explodes (burns) to rupture (cut off) the electrical conductor with the energy of the explosion (i.e., pressure of the gas). This cuts off the electrical path between the first end 911 and second end 912 of the interrupter 910, thus interrupting the main electric circuit 930.

Note that the interrupter 910 does not have to have this configuration. Rather the interrupter 910 just needs to be configured to be started by the startup current (i.e., a current having a current value equal to or greater than a predetermined value) flowing through the auxiliary electric circuit 920 to interrupt the main electric circuit 930. Alternatively, the interrupter 910 may also be an electromagnetic relay including a contact device connected to the main electric circuit 930 and an electromagnet device connected to the auxiliary electric circuit 920, for example.

The control system 800 operates using the abnormal current flowing through the intermediate electrical path 210 of the driving unit 2 as a drive source to supply the startup current to the auxiliary electric circuit 920. The control system 800 according to this embodiment includes the switch system 100 and the current supply source 150 as described above.

The current supply source 150 is connected to the auxiliary electric circuit 920. The current supply source 150 is connected between the third end 803 of the control system 800 and a third end 103 of the switch system 100. The current supply source 150 according to this embodiment includes a constant voltage source 151 that supplies a predetermined voltage. The output voltage of the constant voltage source 151 is not limited to any particular value but may be DC 12 V, for example.

The switch system 100 includes a first end 101 and a second end 102 both connected to the main electric circuit 930 and the third end 103 and a fourth end 104 both connected to the auxiliary electric circuit 920. The first end 101 of the switch system 100 is connected to the first end 801 of the control system 800. The second end 102 of the switch system 100 is connected to the second end 802 of the control system 800. The third end 103 of the switch system 100 is connected to the third end 803 of the control system 800 via the current supply source 150. The fourth end 104 of the switch system 100 is connected to the fourth end 804 of the control system 800.

(1.2.3) Switch System

Next, a specific configuration for the switch system 100 according to this embodiment will be described with reference to FIGS. 3 and 4.

Figure 3:
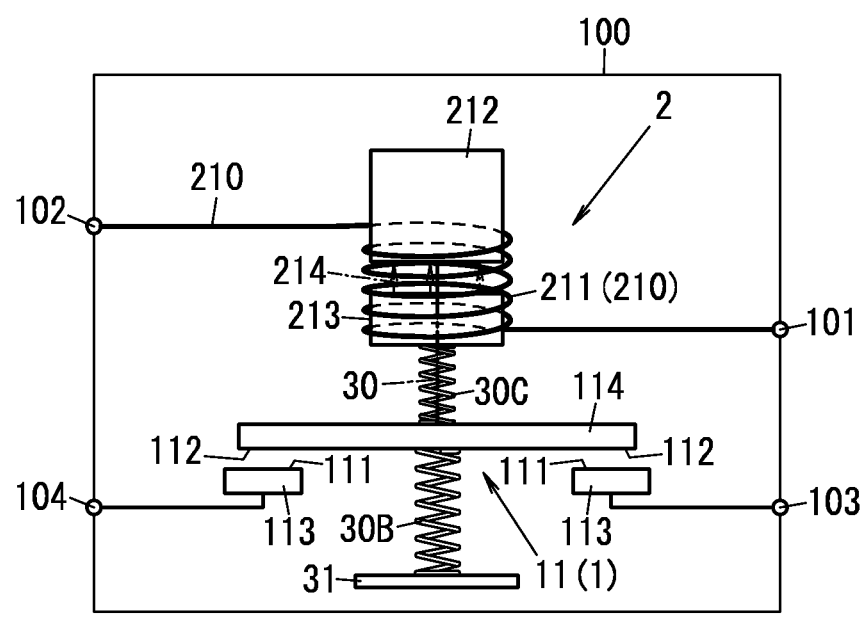
FIG. 3 is a configuration diagram illustrating a state of a switch system that has not started to operate yet in the control system.

As shown in FIG. 3, the switch system 100 of the control system 800 includes the driven unit 1 and the driving unit 2. The driven unit 1 is connected between the third end 103 and fourth end 104 of the switch system 100. In other words, the driven unit 1 is connected to the auxiliary electric circuit 920. The driven unit 1 is connected to the current supply source 150 in series. The driven unit 1 is driven by the driving unit 2 to change the auxiliary electric circuit 920 from an open state to a closed state. The driving unit 2 is connected between the first end 101 and second end 102 of the switch system 100. In other words, the intermediate electrical path 210 of the driving unit 2 is connected to the main electric circuit 930. The driving unit 2 causes the driven unit 1 to be closed by the abnormal current flowing through the intermediate electrical path 210.

The driven unit 1 according to this embodiment includes a contact device 11. The contact device 11 includes a pair of fixed contacts 111 (a pair of first contacts) and a pair of moving contacts 112 (a pair of second contacts).

The pair of fixed contacts 111 may be provided for a pair of fixed terminals 113, for example. One of the pair of fixed terminals 113 is connected to the third end 103 of the switch system 100. The other of the pair of fixed terminals 113 is connected to the fourth end 104 of the switch system 100.

The pair of moving contacts 112 may be provided for a plate-shaped moving contactor 114 made of an electrically conductive material, for example. The pair of moving contacts 112 may be provided at both longitudinal ends of the moving contactor 114, for example.

The moving contactor 114 is movable between an in-contact position and an out-of-contact position with respect to the respective fixed terminals 113. As used herein, the "in-contact position" refers to a position of the moving contactor 114 where the pair of moving contacts 112 are in contact with the pair of fixed contacts 111, respectively. The out-of-contact position refers herein to a position of the moving contactor 114 where the pair of moving contacts 112 are out of contact with the pair of fixed contacts 111. In other words, each of the moving contacts 112 is movable between a closed position where the moving contact 112 is in contact with its associated fixed contact 111 and an open position where the moving contact 112 is out of contact with the fixed contact 111. As shown in FIG. 3, a contact pressure spring 30B is arranged between the moving contactor 114 and a part of a housing (or a contact holder 31). The moving contactor 114 is held at the out-of-contact position by the contact pressure spring 30B.

The driving unit 2 causes the moving contactor 114 to move from the out-of-contact position to the in-contact position using, as a drive source, the abnormal current flowing through the intermediate electrical path 210 of the driving unit 2. In other words, the driving unit 2 causes the moving contacts 112 to move from the open position to the closed position by using, as a drive source, the abnormal current flowing through the main electric circuit 930.

The driving unit 2 according to this embodiment drives the driven unit 1 using electromagnetic action by a magnetic field generated by the abnormal current flowing through the intermediate electrical path 210. More specifically, the driving unit 2 according to this embodiment includes an excitation coil 211, a mover 212, and a stator 213 as shown in FIG. 3.

The excitation coil 211 is connected between the first end 101 and second end 102 of the switch system 100. In other words, the excitation coil 211 forms at least part of the intermediate electrical path 210 and is connected to the main electric circuit 930. The mover 212 is made of a magnetic material. The mover 212 is movable between a first position (i.e., the position shown in FIG. 3) and a second position (i.e., the position shown in FIG. 4). The mover 212 is held at the first position by the spring force received from the contact pressure spring 30B via the moving contactor 114 and a shaft 30. The stator 213 is made of a magnetic material. Another contact pressure spring 30C is arranged between the stator 213 and the moving contactor 114.

The stator 213 and the mover 212 are arranged to face each other. At least part of the magnetic flux (magnetic field) 214 generated by the excitation coil 211 passes through the stator 213, the mover 212, and the gap between the stator 213 and the mover 212 in one direction (e.g., upward in the example illustrated in FIG. 3).

Figure 4:
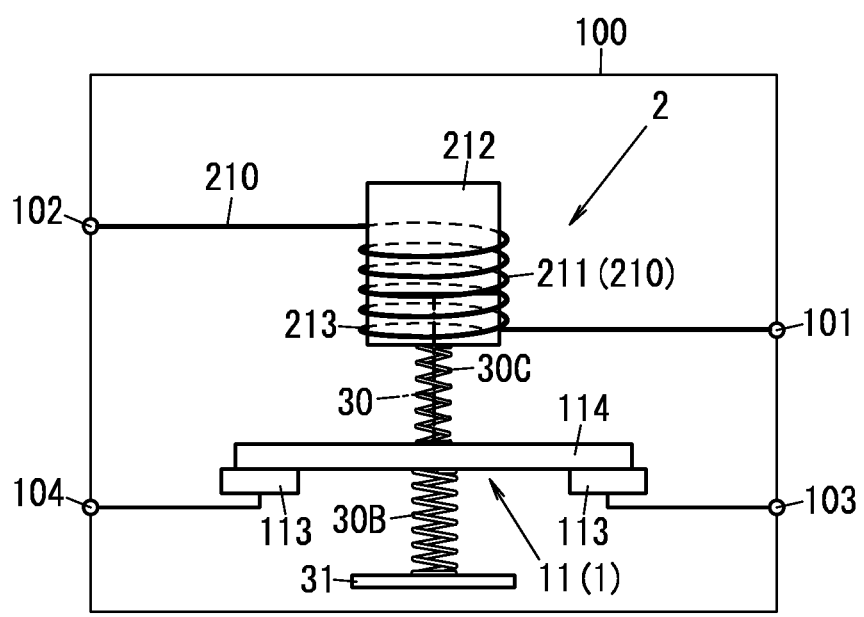
FIG. 4 is a configuration diagram illustrating a state of the switch system that has started to operate.

In the driving unit 2, the mover 212 is attracted toward the stator 213 by the magnetic field generated by the excitation coil 211 when the abnormal current flows through the excitation coil 211, thus causing the mover 212 to move from the first position (i.e., the position shown in FIG. 3) to the second position (i.e., the position shown in FIG. 4).

The moving contactor 114 of the contact device 11 is coupled to the mover 212 via the shaft 30 with a bar shape. Thus, as the mover 212 moves, the moving contactor 114 also moves accordingly. In other words, as the mover 212 moves, the moving contacts 112 also move accordingly.

Also, when the mover 212 is located at the first position, the moving contactor 114 assumes the out-of-contact position. In other words, when the mover 212 is located at the first position, the moving contacts 112 assume the open position where the moving contacts 112 are out of contact with the fixed contacts 111 (see FIG. 3; OFF state of the contact device 11). Meanwhile, when the mover 212 is located at the second position, the moving contactor 114 assumes the in-contact position. In other words, when the mover 212 is located at the second position, the moving contacts 112 assume the closed position where the moving contacts 112 are in contact with the fixed contacts 111 (see FIG. 4; ON state of the contact device 11).

(1.2.4) Operation

The configuration described above allows the switch system 100 to hold the mover 212 at the first position mainly under the spring force applied by the contact pressure spring 30B when the abnormal current does not flow through the main electric circuit 930 (when no current flows or when the current value is smaller than the prescribed value). This allows the moving contacts 112 to be held at the open position, thus opening the auxiliary electric circuit 920.

On the other hand, when the abnormal current flows through the main electric circuit 930, the abnormal current also flows through the excitation coil 211 to excite the excitation coil 211 and the mover 212 is attracted toward the stator 213 and caused to move from the first position to the second position. Accordingly, the moving contacts 112 move from the open position to the closed position, thus short-circuiting the third end 103 and fourth end 104 of the switch system 100 together. As a result, the startup current is supplied from the current supply source 150 to the heat generating element of the interrupter 910, thus activating the interrupter 910 and interrupting the main electric circuit 930.

In the control system 800 and interrupter system 900 according to this embodiment, when the abnormal current flows through the main electric circuit 930, the abnormal current also flows through the intermediate electrical path 210 of the driving unit 2. The switch system 100 uses, as a drive source for causing the mover 212 to move to the second position, the abnormal current flowing through the intermediate electrical path 210 to close the auxiliary electric circuit 920. This causes the startup current to be supplied from the current supply source 150 to the auxiliary electric circuit 920, thus activating the interrupter 910 and interrupting the main electric circuit 930.

As can be seen, this embodiment eliminates the need to perform crash determination processing using a processor, for example, which would be required by the electronic control unit of Patent Literature 1, for example. This shortens the time it takes to start the interrupter 910 (i.e., the time it takes for the interrupter 910 to start operating) compared to the electric circuit of Patent Literature 1. In addition, this also allows the interrupter 910 to operate even when the electronic control unit goes out of order, for example.

Also, according to a configuration in which a processor such as the control circuit 207 detects the abnormal current via the current sensor 206 and sends a control signal to the interrupter 910 to activate the interrupter 910, the control circuit 207 needs to determine whether or not any abnormal current has been generated. In contrast, this embodiment eliminates the need to perform the determination processing using the processor, for example. This contributes to shortening the time it takes to activate the interrupter 910 (i.e., the time it takes for the interrupter 910 to start operating) compared to such a configuration as well.

In addition, this embodiment is implementable as a simple configuration including the driven unit 1 and the driving unit 2. Furthermore, according to this embodiment, the driven unit 1 is opened and closed by spatially (or physically) moving the moving contacts 112, thus enabling the driven unit 1 to be opened and closed almost without fail and with increased reliability.

(1.3) Variations

Next, variations of the first embodiment will be enumerated one after another. In the following description, the embodiment described above will be hereinafter sometimes referred to as a "basic example."

(1.3.1) First Variation

As a first variation of this embodiment, the driving unit 2 of the switch system 100 in the control system 800 may include a first yoke 221 and a second yoke 222 as shown in FIGS. 5A, 5B, 6A, and 6B.

The first yoke 221 and the second yoke 222 are made of a magnetic material.

The first yoke 221 is fixed relative to a wiring member 105 connected between the first end 101 and second end 102 of the switch system 100. The wiring member 105 forms at least part of the intermediate electrical path 210 of the driving unit 2. That is to say, the wiring member 105 forms part of the main electric circuit 930. The wiring member 105 is a plate member made of an electrically conductive material, for example. In other words, the first yoke 221 is fixed relative to the wiring member 105 connected to the main electric circuit 930. Note that the first yoke 221 may be fixed (positioned) relative to the wiring member 105 and may be fixed to a housing, for example.

The second yoke 222 is arranged to face the first yoke 221 with the wiring member 105 interposed between themselves. The second yoke 222 is movable between a first position (i.e., the position shown in FIGS. 5A and 5B) and a second position (i.e., the position shown in FIGS. 6A and 6B).

The second yoke 222 is held at the first position by a permanent magnet 30A and a contact pressure spring 30B, for example. The permanent magnet 30A is fixed relative to the wiring member 105. The permanent magnet 30A is fixed relative to the wiring member 105 such that the second yoke 222 is located between the permanent magnet 30A and the first yoke 221. The wiring member 105 and the permanent magnet 30A may be held by a holding member fixed to the housing, for example. The permanent magnet 30A attracts the second yoke 222 made of a magnetic material (upward in FIGS. 5A and 5B) with its magnetic force. That is to say, the second yoke 222 receives, from the permanent magnet 30A, force that causes the second yoke 222 to go away from the first yoke 221 (i.e., upward in FIGS. 5A and 5B). The contact pressure spring 30B is arranged between the wiring member 105 and the second yoke 222. The second yoke 222 receives, from the contact pressure spring 30B, elastic force that causes the second yoke 222 to go away from the wiring member 105 (i.e., upward in FIGS. 5A and 5B). Another contact pressure spring 30C is arranged between the first yoke 221 and the moving contactor 114. The contact pressure spring 30C may be in a natural state (i.e., has a natural length), for example, in FIGS. 5A and 5B.

When a current flows through the wiring member 105, at least part of a magnetic flux (magnetic field) 214 (see FIG. 5B) generated by the current flowing through the wiring member 105 passes through the first yoke 221 and the second yoke 222. This produces attractive force between the first yoke 221 and the second yoke 222 and the second yoke 222 receives, from the first yoke 221, force in such a direction as causing the second yoke 222 to come toward the first yoke 221 (i.e., downward force in FIGS. 5A and 5B). Nevertheless, if the current value of the current flowing through the wiring member 105 is smaller than the prescribed value, then the force produced upward in FIGS. 5A and 5B by the permanent magnet 30A and the contact pressure spring 30B is greater than the force produced downward in FIGS. 5A and 5B by the attractive force. The position of the permanent magnet 30A, the elastic force of the contact pressure spring 30B, and other parameters are set to satisfy this relation. Thus, the second yoke 222 is held at the first position (i.e., the position shown in FIGS. 5A and 5B).

Figure 5A:
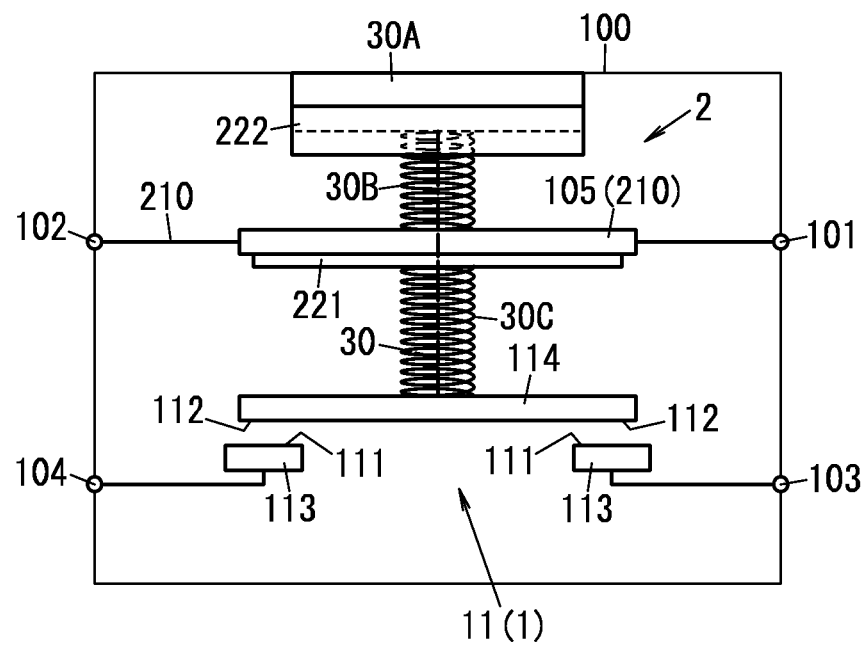
FIG. 5A is a configuration diagram illustrating a state of a switch system that has not started to operate yet in a control system according to a first variation of the first embodiment.
Figure 5B:
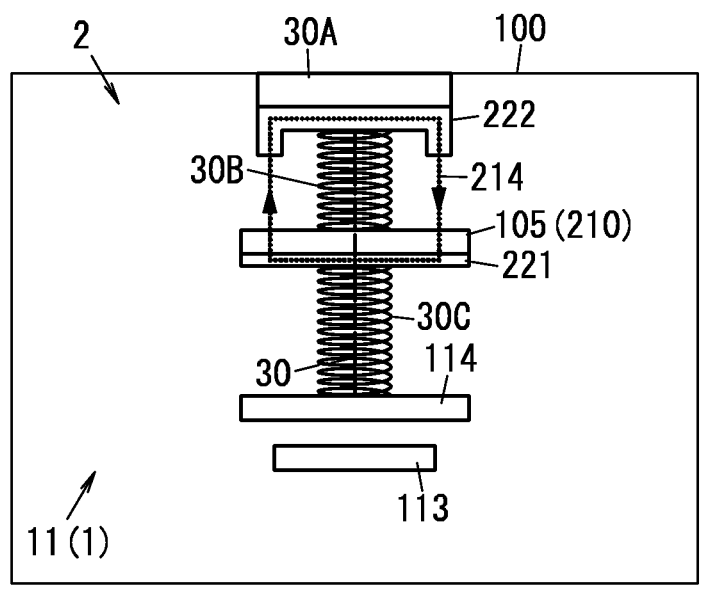
FIG. 5B is a configuration diagram of the switch system as viewed from a direction perpendicular to the viewing direction in FIG. 5A.
Figure 6A:
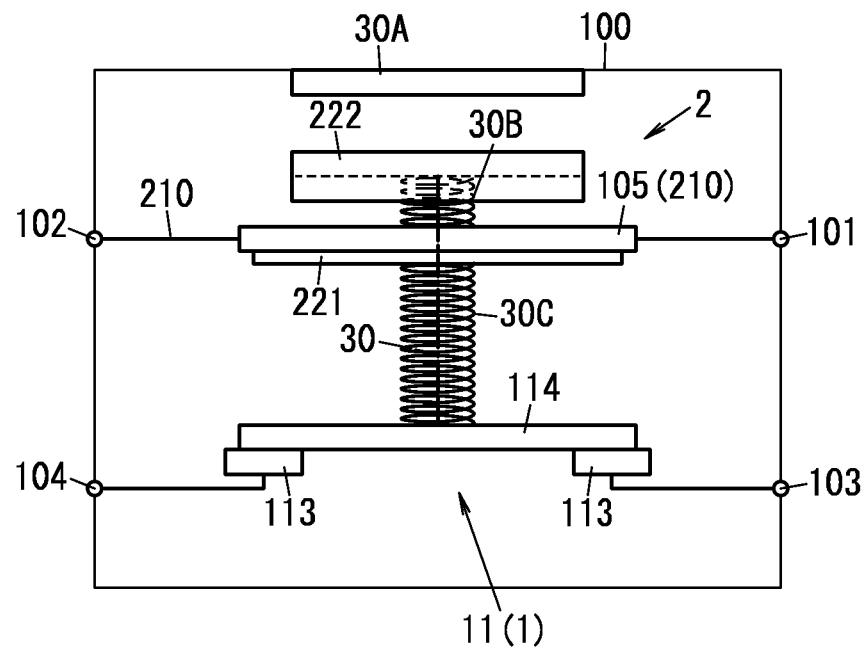
FIG. 6A is a configuration diagram illustrating a state of the switch system that has started to operate.
Figure 6B:
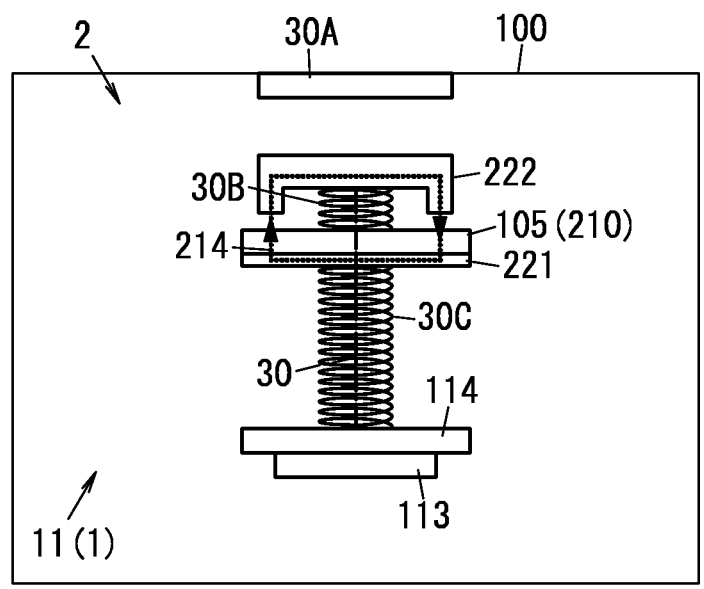
FIG. 6B is a configuration diagram of the switch system as viewed from a direction perpendicular to the viewing direction in FIG. 6A.

When the current value of the current flowing through the wiring member 105 becomes equal to or greater than the prescribed value (stated otherwise, when the abnormal current flows through the wiring member 105), the attractive force exceeds the force applied by the permanent magnet 30A and the contact pressure spring 30B to cause the second yoke 222 to be attracted toward the first yoke 221 (i.e., move downward in FIGS. 5A and 5B). This causes the second yoke 222 to move to the second position. That is to say, the second yoke 222 is attracted toward the first yoke 221 by the magnetic field generated by the abnormal current flowing through the wiring member 105 to move from the first position (i.e., the position shown in FIGS. 5A and 5B) to the second position (i.e., the position shown in FIGS. 6A and 6B).

The moving contactor 114 of the contact device 11 is coupled to the second yoke 222 by the bar-shaped shaft 30. Thus, as the second yoke 222 moves, the moving contactor 114 moves accordingly. In other words, as the second yoke 222 moves, the moving contacts 112 also move accordingly.

When the second yoke 222 is located at the first position, the moving contactor 114 assumes the out-of-contact position. In other words, when the second yoke 222 is located at the first position, the moving contacts 112 assume the open position where the moving contacts 112 are out of contact with the fixed contacts 111 (see FIGS. 5A and 5B) Meanwhile, when the second yoke 222 is located at the second position, the moving contactor 114 assumes the in-contact position. In other words, when the second yoke 222 is located at the second position, the moving contacts 112 assume the closed position where the moving contacts 112 are in contact with the fixed contacts 111.

In the switch system 100 according to this variation, when the abnormal current flows through the main electric circuit 930, the abnormal current also flows through the intermediate electrical path 210 of the driving unit 2. The switch system 100 according to this variation closes the auxiliary electric circuit 920 by using the abnormal current as a drive source that causes the second yoke 222 to move to the second position. Thus, the control system 800 and interrupter system 900 including the switch system 100 according to this variation may also shorten the time it takes to activate the interrupter 910 using a simple configuration.

(1.3.2) Second Variation

Figure 7:
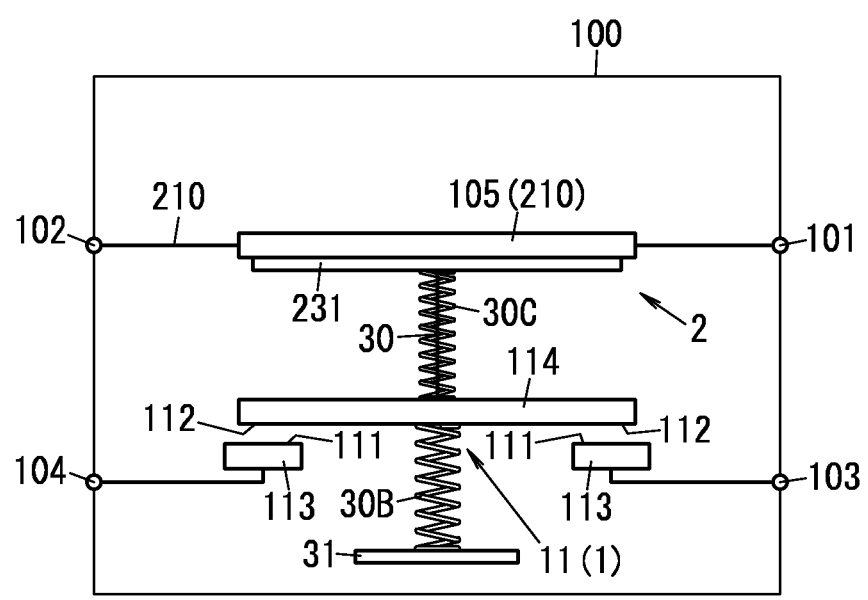
FIG. 7 is a configuration diagram illustrating a state of a switch system that has not started to operate yet in a control system according to a second variation of the first embodiment.
Figure 8:
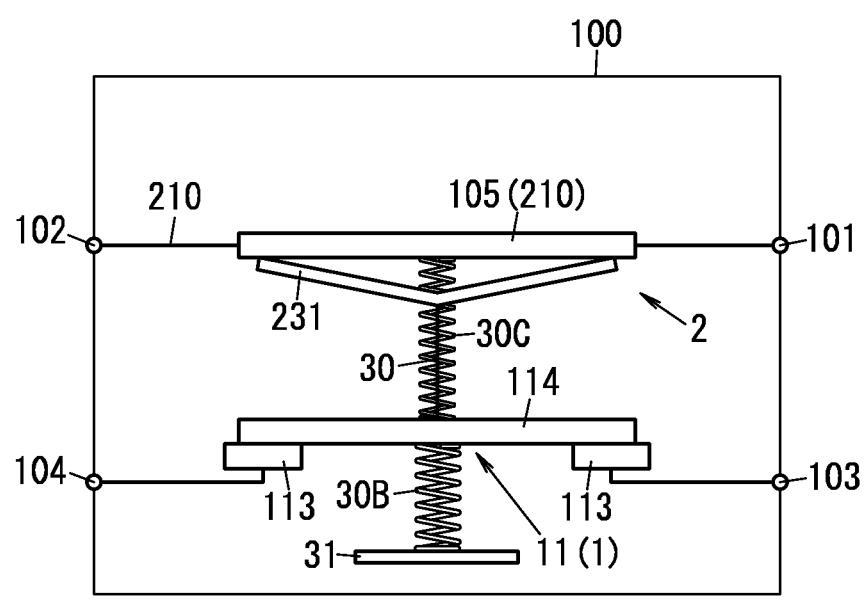
FIG. 8 is a configuration diagram illustrating a state of the switch system that has started to operate.

According to a second variation of this embodiment, the driving unit 2 of the switch system 100 in the control system 800 may drive the driven unit 1 by using heat generated by the abnormal current flowing through the intermediate electrical path 210. For example, the driving unit 2 may include a bimetallic plate 231 as shown in FIGS. 7 and 8.

The bimetallic plate 231 is formed by bonding together two metallic plates with different thermal expansion coefficients and is bent as the temperature varies.

The bimetallic plate 231 is in contact with the wiring member 105 connected between the first end 101 and second end 102 of the switch system 100. The wiring member 105 is a plate member which forms at least part of the intermediate electrical path 210 of the driving unit 2 and which is made of an electrically conductive material, for example. The wiring member 105 is a member, of which the thermal expansion coefficient is sufficiently smaller than the thermal expansion coefficient of the two metallic plates of the bimetallic plate 231 (i.e., a member that is deformable less easily than the bimetallic plate 231 as the temperature varies).

The bimetallic plate 231 is heated and bent due to the heat generated by the abnormal current flowing through the wiring member 105. In other words, the bimetallic plate 231 is deformed from a first shape (see FIG. 7) into a second shape (see FIG. 8) by the abnormal current flowing through the main electric circuit 930 (intermediate electrical path 210). The first shape may be a linear shape in a side view, for example. The second shape may be a V-shape in a side view, for example.

The contact pressure spring 30B is arranged between the moving contactor 114 of the contact device 11 and a part 31 of the housing. In addition, the moving contactor 114 is coupled to a central region of the bimetallic plate 231 via the bar-shaped shaft 30. Thus, as the bimetallic plate 231 is deformed, the moving contactor 114 moves by overcoming the spring force applied by the contact pressure spring 30B. In other words, as the bimetallic plate 231 is deformed, the moving contacts 112 move. Another contact pressure spring 30C is arranged between the moving contactor 114 and the wiring member 105.

When the bimetallic plate 231 has the first shape, the moving contactor 114 assumes the out-of-contact position. In other words, when the bimetallic plate 231 has the first shape, the moving contacts 112 assume the open position where the moving contacts 112 are out of contact with the fixed contacts 111 (see FIG. 7) Meanwhile, when the bimetallic plate 231 has the second shape, the moving contactor 114 assumes the in-contact position. In other words, when the bimetallic plate 231 has the second shape, the moving contacts 112 assume the closed position where the moving contacts 112 are in contact with the fixed contacts 111 (see FIG. 8).

In the switch system 100 according to this variation, when the abnormal current flows through the main electric circuit 930, the abnormal current also flows through the intermediate electrical path 210 of the driving unit 2. The switch system 100 according to this variation closes the auxiliary electric circuit 920 by using the abnormal current flowing through the intermediate electrical path 210 as a drive source that deforms the bimetallic plate 231 into the second shape. Thus, the control system 800 and interrupter system 900 including the switch system 100 according to this variation may also shorten the time it takes to activate the interrupter 910 using a simple configuration.

(1.3.3) Third Variation

Figure 9:
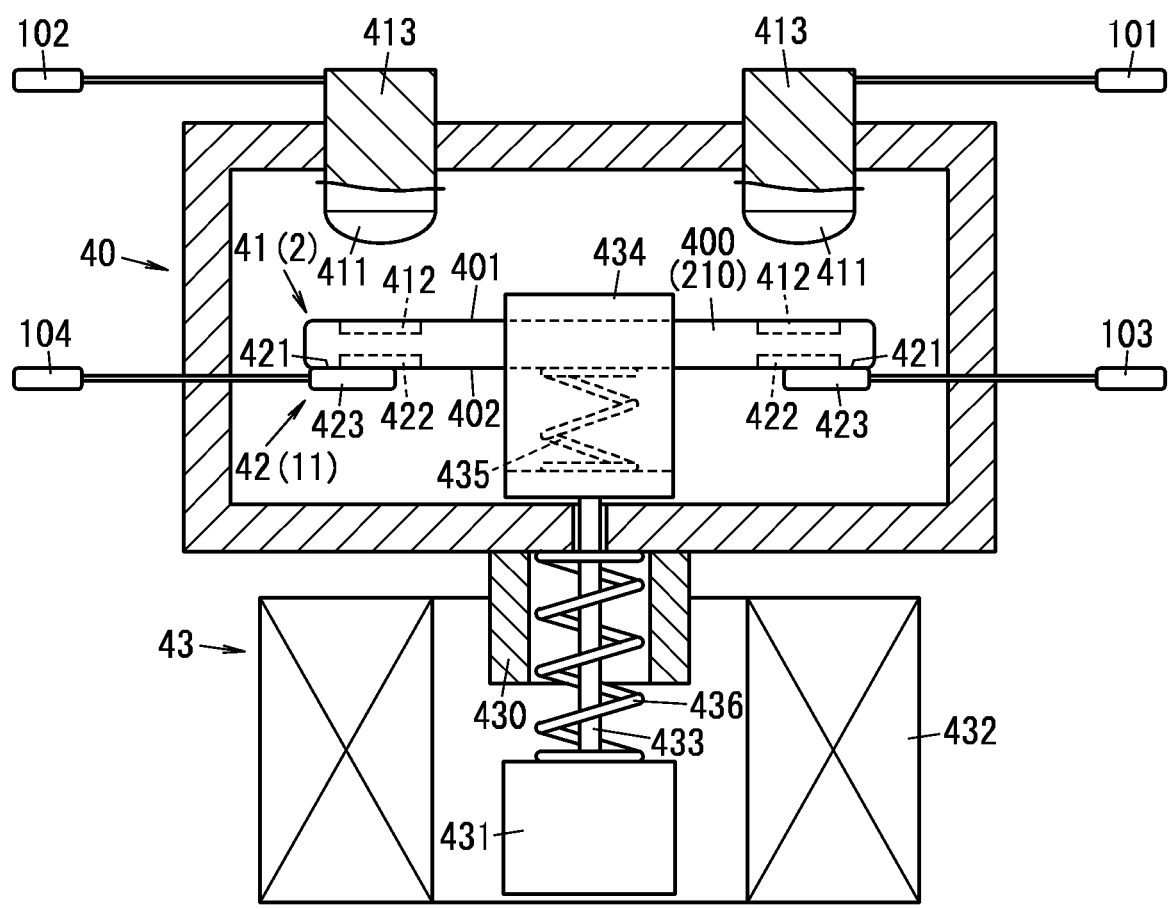
FIG. 9 is a schematic cross-sectional view illustrating a state of an electromagnetic relay for use in a switch system for a control system according to a third variation of the first embodiment when an excitation coil thereof is not energized.
Figure 10:
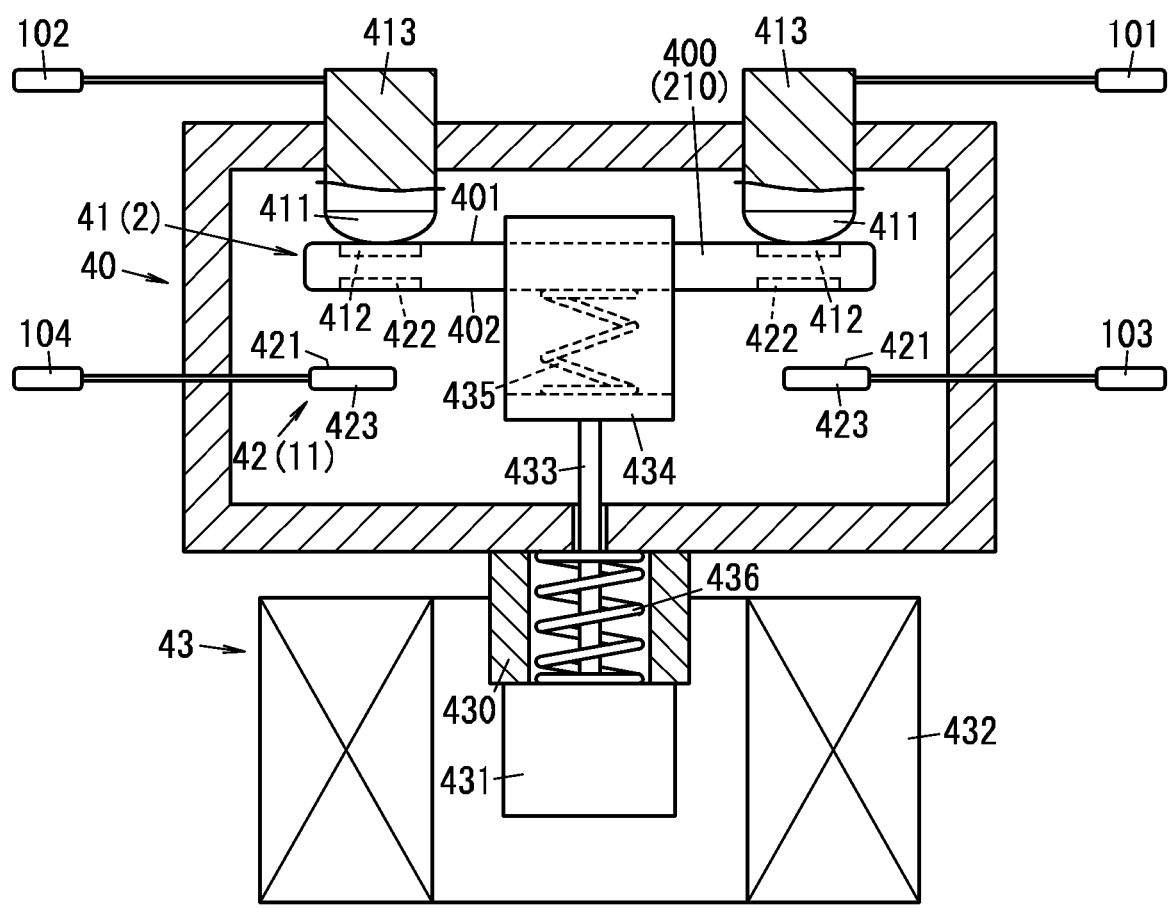
FIG. 10 is a schematic cross-sectional view illustrating a state of the electromagnetic relay when its excitation coil is energized.
Figure 11:
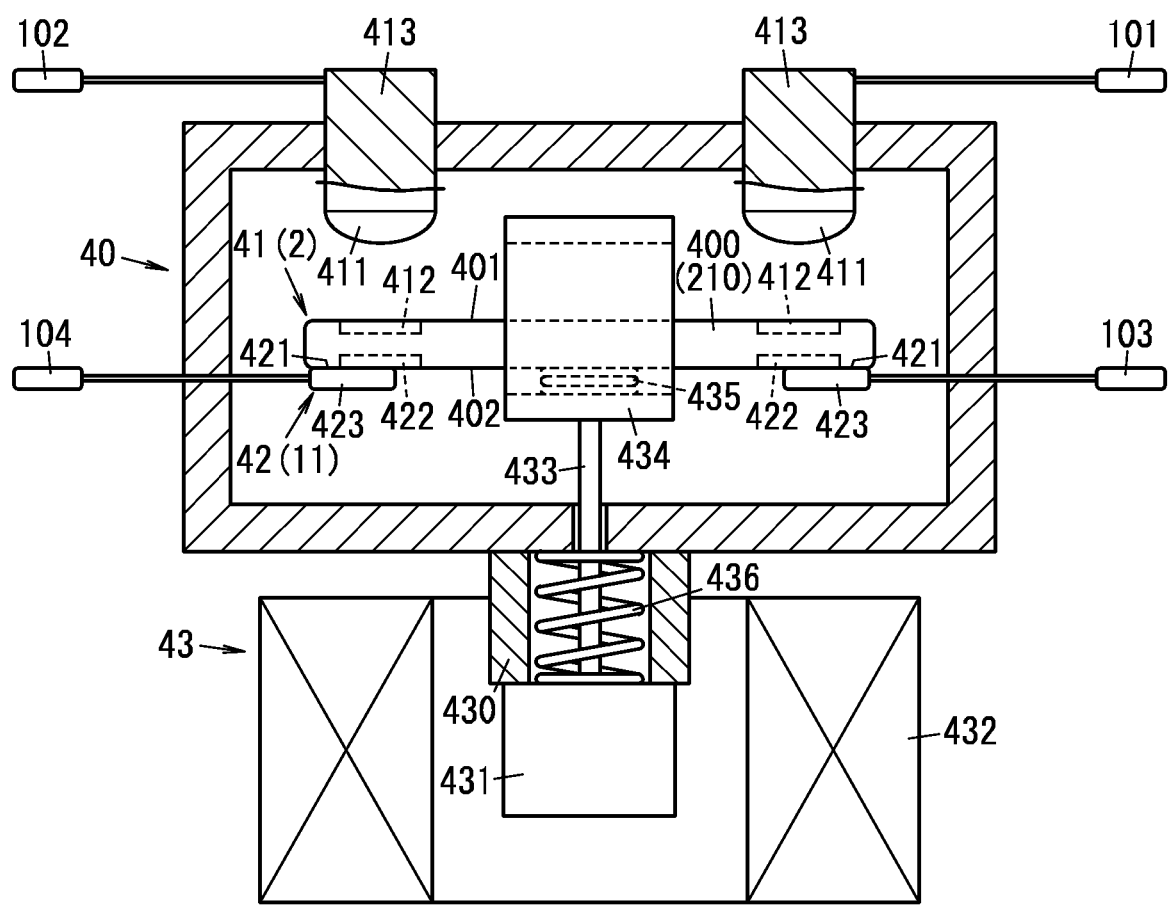
FIG. 11 is a schematic cross-sectional view illustrating a state of the electromagnetic relay in a situation where an abnormal current flows through a moving contactor when the excitation coil is energized.

According to a third variation of this embodiment, the driving unit 2 of the switch system 100 in the control system 800 may drive the driven unit 1 using electromagnetic repulsion caused by the abnormal current flowing through the intermediate electrical path 210. For example, as shown in FIGS. 9-11, the switch system 100 may be implemented as an electromagnetic relay 40 including a main contact device 41 and an auxiliary contact device 42. In this variation, the main contact device 41 corresponds to the driving unit 2 and the auxiliary contact device 42 corresponds to the driven unit 1 (contact device 11). Optionally, the main contact device 41 of the electromagnetic relay 40 may be used in common as either the first main relay 202 or the second main relay 203 of the power supply system 200.

As shown in FIGS. 9-11, the electromagnetic relay 40 according to this variation includes not only the main contact device 41 and the auxiliary contact device 42 but also an electromagnet device 43.

The main contact device 41 includes a pair of main fixed contacts 411 and a pair of main moving contacts 412. The pair of main fixed contacts 411 may be provided for a pair of main fixed terminals 413 made of an electrically conductive material, for example. One of the pair of main fixed terminals 413 is connected to the first end 101 of the switch system 100. The other of the pair of main fixed terminals 413 is connected to the second end 102 of the switch system 100. The pair of main moving contacts 412 may be provided for a first surface 401 of a plate-shaped moving contactor 400 made of an electrically conductive material, for example. The pair of main moving contacts 412 may be provided at both longitudinal ends of the moving contactor 400 to face the pair of main fixed contacts 411. The moving contactor 400 is movable relative to the respective main fixed terminals 413 between a position where the pair of main moving contacts 412 are in contact with the pair of main fixed contacts 411, respectively, and a position where the pair of main moving contacts 412 are out of contact with the pair of main fixed contacts 411, respectively.

The auxiliary contact device 42 (contact device 11) includes a pair of auxiliary fixed contacts 421 (first contacts) and a pair of auxiliary moving contacts 422 (second contacts). The pair of auxiliary moving contacts 422 may be provided for a second surface 402 of the moving contactor 400, for example. In this variation, the second surface 402 of the moving contactor 400 is a surface opposite from the first surface 401 along the thickness of the moving contactor 400. The pair of auxiliary moving contacts 422 may be provided at both longitudinal ends of the moving contactor 400, for example. The pair of auxiliary fixed contacts 421 may be provided for a pair of auxiliary fixed terminals 423 made of an electrically conductive material, for example. One of the pair of auxiliary fixed terminals 423 is connected to the third end 103 of the switch system 100. The other of the pair of auxiliary fixed terminals 423 is connected to the fourth end 104 of the switch system 100.

In this electromagnetic relay 40, when the pair of main moving contacts 412 are in contact with the pair of main fixed contacts 411, respectively, the pair of auxiliary moving contacts 422 are out of contact with the pair of auxiliary fixed contacts 421 (see FIG. 10). Meanwhile, when the moving contactor 400 moves a predetermined distance or more (downward in FIG. 10) from this state, the pair of main moving contacts 412 go out of contact with the pair of main fixed contacts 411, and the pair of auxiliary moving contacts 422 come into contact with the pair of auxiliary fixed contacts 421, respectively (see FIGS. 9 and 11). That is to say, the auxiliary moving contacts 422 (second contacts) of the auxiliary contact device 42 (contact device 11) are movable between a closed position where the auxiliary moving contacts 422 are in contact with the auxiliary fixed contacts 421 (first contacts) and an open position where the auxiliary moving contacts 422 are out of contact with the auxiliary fixed contacts 421 (first contacts).

The electromagnet device 43 includes a stator 430, a mover 431, an excitation coil 432, a shaft 433, a holder 434, a contact pressure spring 435, and a return spring 436.

The stator 430 is a fixed iron core. The mover 431 is a moving iron core and is movable between a position where the mover 431 has come closer toward the stator 430 and a position where the mover 431 has gone away from the stator 430. The stator 430 and the mover 431 are arranged inside the excitation coil 432. In this electromagnet device 43, the mover 431 is attracted by a magnetic flux generated by the excitation coil 432 when the excitation coil 432 is energized, and thereby caused to move toward the stator 430. Meanwhile, when the excitation coil 432 stops being energized, the spring force applied by the return spring 436 causes the mover 431 to move downward. The energization of the excitation coil 432 may be controlled by the control circuit 207, for example. The shaft 433 transmits the driving force generated by the electromagnet device 43 to the moving contactor 400. An upper end of the shaft 433 is fixed to the holder 434, while a lower end of the shaft 433 is fixed to the mover 431. The holder 434 is formed in the shape of a rectangular frame and has a through hole through which the moving contactor 400 is passed. The contact pressure spring 435 is arranged between a lower plate of the holder 434 and the moving contactor 400 and biases the moving contactor 400 upward in FIG. 9. The return spring 436 is arranged inside the stator 430 to bias the mover 431 downward in FIG. 9.

In the electromagnetic relay 40, while the excitation coil 432 is not energized (see FIG. 9), the mover 431 and the holder 434 are pressed downward mainly by the spring force applied by the return spring 436. At this time, the moving contactor 400 is also pressed downward by the holder 434 to bring the main moving contacts 412 out of contact with the main fixed contacts 411. That is to say, in this state, the electrical path between the pair of main fixed terminals 413 is interrupted.

When the excitation coil 432 is energized (see FIG. 10), the mover 431 is attracted and lifted by the magnetic flux generated by the excitation coil 432. At this time, the moving contactor 400 is pressed upward by the lower plate of the holder 434 via the contact pressure spring 435 to bring the main moving contacts 412 into contact with the main fixed contacts 411. That is to say, in this state, the electrical path between the pair of main fixed terminals 413 is electrically continuous.

In this variation, when the abnormal current flows through the moving contactor 400 constituting the intermediate electrical path 210 while the excitation coil 432 is energized (i.e., while the electrical path between the pair of main fixed terminals 413 is electrically continuous), electromagnetic repulsion is produced in the moving contactor 400 in such a direction as to bring the main moving contacts 412 out of contact with the main fixed contacts 411. When subjected to this electromagnetic repulsion, the moving contactor 400 moves downward in FIG. 10 to bring the pair of auxiliary moving contacts 422 into contact with the pair of auxiliary fixed contacts 421 (see FIG. 11). This makes the electrical path between the pair of auxiliary fixed contacts 421 electrically continuous via the moving contactor 400, thus supplying the startup current from the current supply source 150 to the auxiliary electric circuit 920.

In the switch system 100 according to this variation, when the abnormal current flows through the main electric circuit 930, the abnormal current also flows through the intermediate electrical path 210 (moving contactor 400) of the driving unit 2 (main contact device 41). The switch system 100 according to this variation closes the auxiliary electric circuit 920 by using the abnormal current flowing through the intermediate electrical path 210 as a drive source that causes the moving contactor 400 to move. Thus, the control system 800 and interrupter system 900 including the switch system 100 according to this variation may also shorten the time it takes to activate the interrupter 910 using a simple configuration.

Note that the switch system 100 suitably includes a decision mechanism. As used herein, the decision mechanism is a mechanism that allows the auxiliary electric circuit 920 to be supplied with the startup current only when the excitation coil 432 is energized and the auxiliary contact device 42 is electrically continuous. That is to say, the decision mechanism prevents the auxiliary electric circuit 920 from being supplied with the startup current even when the electrical path between the auxiliary fixed contacts 421 becomes electrically continuous via the moving contactor 400 with the excitation coil 432 not energized. The decision mechanism may be implemented as the same mechanism as that of the second auxiliary contact device 63 and second operation control unit 64 according to the ninth variation to be described later.

(1.3.4) Fourth Variation

In the switch system 100 of the control system 800 according to each of the basic example and first to third variations described above, the driven unit 1 is implemented as a contact device 11 having a so-called "Form A contact (normally open contact) structure" in which the second contact (moving contact 112) is normally OFF (i.e., out of contact with the first contact (fixed contact 111)) and in which the second contact turns ON (i.e., comes into contact with the first contact) by being driven by the driving unit 2 (see FIG. 1). In contrast, in the switch system 100 according to this variation, the driven unit 1 includes a contact device 51 having a so-called "Form B contact (normally closed contact) structure" and a signal inverter circuit 52 (see FIG. 12). In this case, the contact device 51 is a device in which the second contact (moving contact 512) is normally ON (i.e., in contact with the first contact (fixed contact 511)) and in which the second contact turns OFF (i.e., goes out of contact with the first contact) by being driven by the driving unit 2. Also, in this variation, the signal inverter circuit 52 allows no startup current to be supplied from the current supply source 150 to the auxiliary electric circuit 920 while the contact device 51 is ON without being driven by the driving unit 2. On the other hand, when the contact device 51 turns OFF by being driven by the driving unit 2, the signal inverter circuit 52 allows the startup current to be supplied from the current supply source 150 to the auxiliary electric circuit 920.

Figure 12:
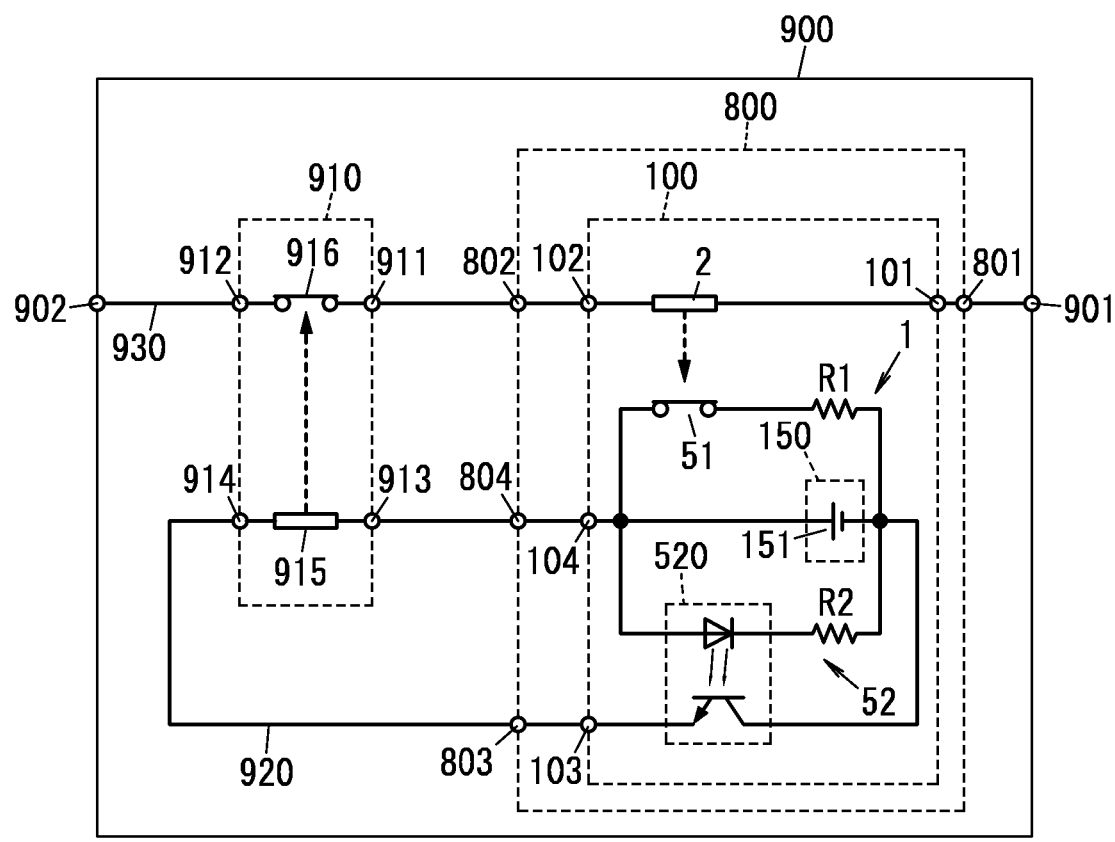
FIG. 12 is a configuration diagram of an interrupter system including a control system according to a fourth variation of the first embodiment.

In the example illustrated in FIG. 12, the signal inverter circuit 52 includes a first resistor R1, a second resistor R2, and a photocoupler 520. The first resistor R1 is connected to the contact device 51 in series between both terminals of the current supply source 150. In addition, a series circuit of the second resistor R2 and a photodiode of the photocoupler 520 is connected between both terminals of the current supply source 150. A phototransistor of the photocoupler 520 is connected to the gas producer 915 of the interrupter 910 in series between both terminals of the current supply source 150. In this case, the resistance value of the second resistor R2 is set to be sufficiently larger than the resistance value of the first resistor R1. Thus, while the contact device 51 is ON, almost no current flows through the second resistor R2 and the phototransistor of the photocoupler 520 is OFF.

Next, the operation of the switch system 100 according to this variation will be described in comparison with that of the switch system 100 according to the basic example with reference to the flowcharts of FIGS. 13A and 13B.

Figure 13A:
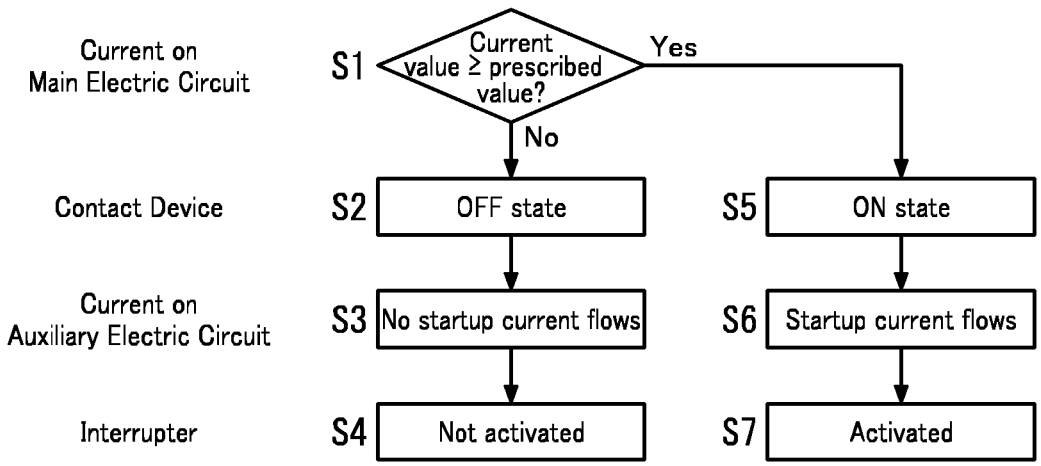
FIG. 13A is a flowchart showing a procedure of operation of the control system according to the first embodiment.

In the switch system 100 according to the basic example, as shown in the flowchart of FIG. 13A, when no abnormal current flows through the main electric circuit 930 (if the answer is NO in S1), the contact device 11 is in OFF state (S2) and the auxiliary electric circuit 920 is interrupted. In this state, the current value of the current flowing through the auxiliary electric circuit 920 is zero, no startup current is supplied to the auxiliary electric circuit 920 (S3), and the interrupter 910 is not activated.

When the current value of the current flowing through the main electric circuit 930 becomes equal to or greater than the prescribed value (if the answer is YES in S1) to cause the abnormal current to flow through the main electric circuit 930, the contact device 11 turns ON (S5) to make the electrical path between the third end 103 and fourth end 104 of the switch system 100 short-circuited. This allows the startup current to be supplied from the current supply source 150 to the auxiliary electric circuit 920 (S6) and also supplied to the heat generating element of the interrupter 910 to activate the interrupter 910 (S7) and thereby interrupt the main electric circuit 930.

Figure 13B:
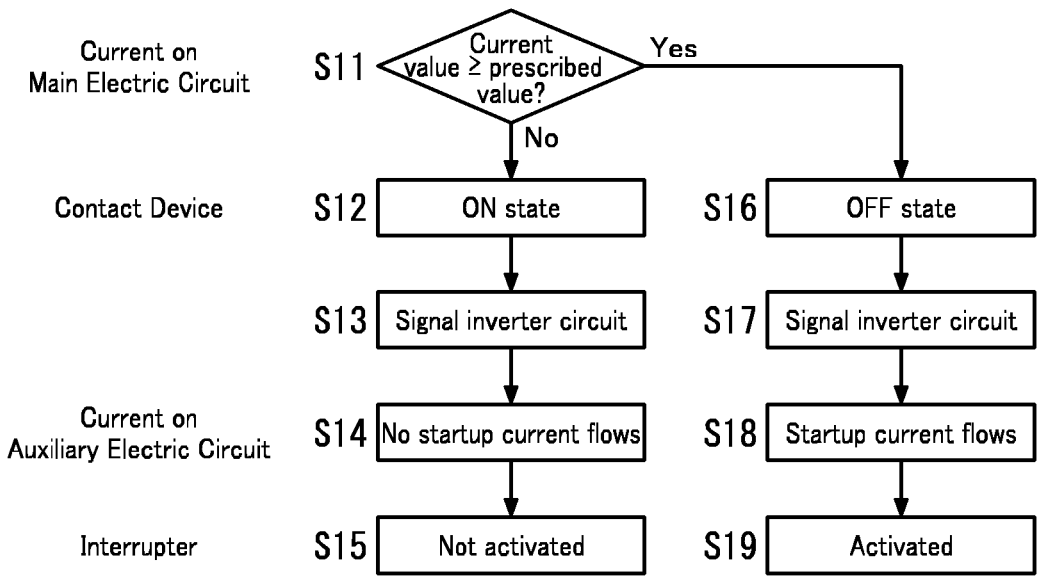
FIG. 13B is a flowchart showing a procedure of operation of the control system according to the fourth variation of the first embodiment.

In contrast, in the switch system 100 according to this variation, when no abnormal current flows through the main electric circuit 930 (if the answer is NO in S11), the contact device 51 is ON (S12) as shown in the flowchart of FIG. 13B. At this time, the signal inverter circuit 52 according to this variation inverts the state (ON/OFF state) of the contact device 51 and the state (electrically continuous or interrupted state) of the auxiliary electric circuit 920 (S13). That is to say, according to this variation, while the contact device 51 is ON, the current supplied from the current supply source 150 flows through the first resistor R1 via the contact device 51 but hardly flows through the second resistor R2 and the photodiode. This turns the phototransistor OFF and interrupts the auxiliary electric circuit 920. Thus, no startup current is supplied from the current supply source 150 to the auxiliary electric circuit 920 (S14) to keep the interrupter 910 inactive (S15). That is to say, when the current flowing through the contact device 51 is equal to or greater than a predetermined threshold value, the signal inverter circuit 52 allows no startup current to be supplied to the auxiliary electric circuit 920.

Thereafter, when the current value of the current flowing through the main electric circuit 930 becomes equal to or greater than the prescribed value (if the answer is YES in S11) to allow the abnormal current to flow through the main electric circuit 930, the contact device 51 turns OFF (S16). At this time, the signal inverter circuit 52 inverts the state (ON/OFF state) of the contact device 51 and the state (electrically continuous or interrupted state) of the auxiliary electric circuit 920 (S17). That is to say, when the contact device 51 turns OFF, the current supplied from the current supply source 150 starts to flow through the photodiode via the second resistor R2. When a current, of which the magnitude is equal to or greater than a predetermined one, flows through the photodiode, the phototransistor is turned ON. This allows the startup current to be supplied from the current supply source 150 to the auxiliary electric circuit 920 (S18) and also supplied to the heat generating element of the interrupter 910 to activate the interrupter 910 (S19) and thereby interrupt the main electric circuit 930. That is to say, when the current flowing through the contact device 51 is smaller than the predetermined threshold value, the signal inverter circuit 52 allows the startup current to be supplied to the auxiliary electric circuit 920.

As described above, according to this variation, the driven unit 1 includes the contact device 51 having the Form B contact structure. That is to say, according to this variation, when the driven unit 1 is driven by the driving unit 2, the second contact moves from the closed position where the second contact is in contact with the first contact to the open position where the second contact is out of contact with the first contact, thus allowing the startup current to be supplied to the auxiliary electric circuit 920. With this regard, if the driven unit 1 includes the contact device 11 having the Form A contact structure as in the basic example and the first to third variations, when the second contact comes into contact with the first contact by being driven by the driving unit 2, the second contact may physically collide against the first contact to possibly cause a so-called "bounceback." This could cause a delay in the timing to start supplying a current from the current supply source 150 to the auxiliary electric circuit 920. In contrast, according to this variation, when the driven unit 1 (contact device 51) is driven by the driving unit 2, the second contact just goes out of contact with the first contact to cause no physical collision. Thus, this variation reduces the bounceback when the driven unit 1 is driven by the driving unit 2.

Next, specific examples of the driving unit 2 and contact device 51 (driven unit 1) according to this variation are shown in FIGS. 14 and 15, FIGS. 16A, 16B, 17A, and 17B, and FIGS. 18 and 19.

In each of the examples shown in FIGS. 14-19, the contact device 51 includes a pair of fixed contacts 511 (a pair of first contacts) and a pair of moving contacts 512 (a pair of second contacts). The pair of fixed contacts 511 are provided for a pair of fixed terminals 513. The pair of moving contacts 512 are provided for a moving contactor 514 with a plate shape.

Figure 14:
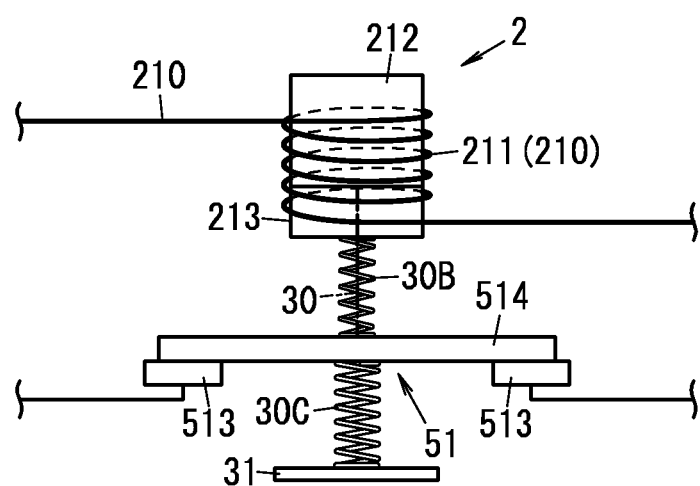
FIG. 14 is a configuration diagram illustrating a state of an exemplary driving unit and contact device that have not started to operate yet in the control system.
Figure 15:
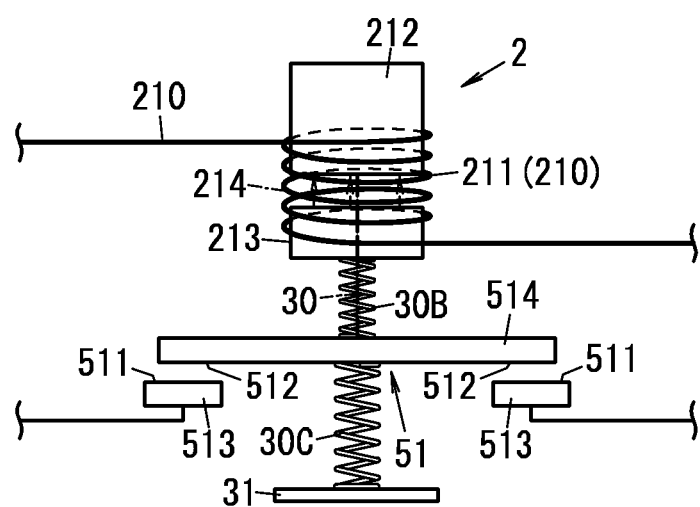
FIG. 15 is a configuration diagram illustrating a state of the driving unit and contact device that have started to operate.
Figure 17A:
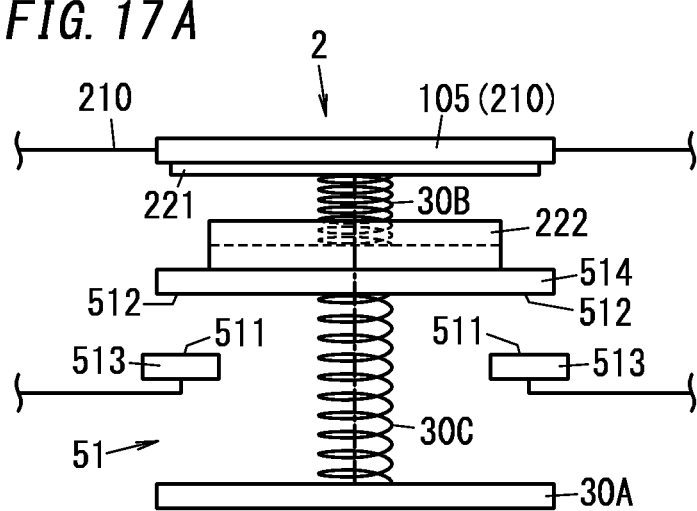
FIG. 17A is a configuration diagram illustrating a state of the driving unit and contact device that have started to operate.
Figure 17B:
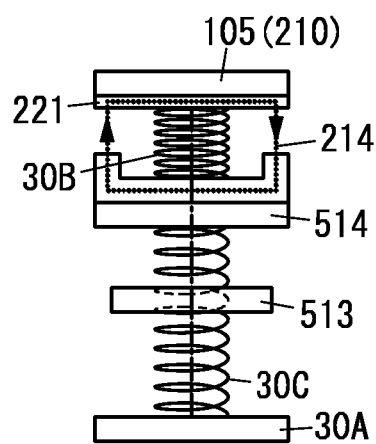
FIG. 17B is a configuration diagram of the driving unit and the contact device as viewed from a direction perpendicular to the viewing direction in FIG. 17A.

In the example shown in FIGS. 14 and 15, the driving unit 2, as well as the driving unit 2 according to the basic example, includes the excitation coil 211, the mover 212, and the stator 213. The excitation coil 211 forms at least part of the intermediate electrical path 210. The mover 212 is movable between a first position (i.e., the position where the mover 212 has come closer toward the stator 213; see FIG. 14) and a second position (i.e., the position where the mover 212 has gone away from the stator 213; see FIG. 15). The mover 212 is held at the first position by receiving force (downward in FIG. 14) from the contact pressure spring 30B arranged between the mover 212 and the stator 213. Note that another contact pressure spring 30C is arranged between a part 31 of the housing and the moving contactor 514. The driving unit 2 brings the mover 212 out of contact with the stator 213 with the magnetic field generated by the excitation coil 211 when the abnormal current flows through the excitation coil 211, thus causing the mover 212 to move from the first position (i.e., the position shown in FIG. 14) to the second position (i.e., the position shown in FIG. 15). This causes the moving contactor 514 to move from an in-contact position where the moving contacts 512 are in contact with the fixed contacts 511 to an out-of-contact position where the moving contacts 512 are out of contact with the fixed contacts 511.

In the example shown in FIGS. 16A, 16B, 17A, and 17B, the driving unit 2, as well as the driving unit 2 according to the first variation, includes a first yoke 221 and a second yoke 222. The first yoke 221 is fixed relative to the wiring member 105 that forms at least part of the intermediate electrical path 210. The second yoke 222 is coupled to the moving contactor 514. The second yoke 222 is arranged to face the first yoke 221 and is movable between a first position (i.e., the position shown in FIGS. 16A and 16B) and a second position (i.e., the position shown in FIGS. 17A and 17B). The second yoke 222 is held at the first position by the permanent magnet 30A and the contact pressure spring 30B, for example. The permanent magnet 30A attracts the second yoke 222 (downward in FIGS. 16A and 16B) with its magnetic force. The contact pressure spring 30B is arranged between the first yoke 221 and the second yoke 222. The contact pressure spring 30B applies biasing force that causes the second yoke 222 to go away from the first yoke 221 (i.e., downward in FIGS. 16A and 16B) to the second yoke 222. Another contact pressure spring 30C is arranged between the second yoke 222 and the permanent magnet 30A. In the driving unit 2, when the current value of the current flowing through the wiring member 105 is smaller than the prescribed value, then the second yoke 222 is held at the first position mainly by the attractive force of the permanent magnet 30A and the downward force applied by the contact pressure spring 30B. On the other hand, when the current value of the current flowing through the wiring member 105 becomes equal to or greater than the prescribed value, the attractive force between the first yoke 221 and the second yoke 222 increases to cause the second yoke 222 to move from the first position (i.e., the position shown in FIGS. 16A and 16B) to the second position (i.e., the position shown in FIGS. 17A and 17B). Thus, the moving contactor 514 moves from the in-contact position where the moving contacts 512 are in contact with the fixed contacts 511 to the out-of-contact position where the moving contacts 512 are out of contact with the fixed contacts 511.

Figure 18:
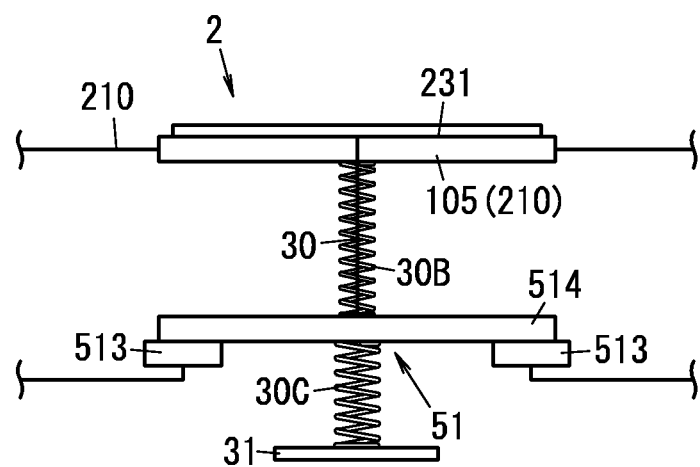
FIG. 18 is a configuration diagram illustrating a state of still another exemplary driving unit and contact device that have not started to operate yet in the control system.
Figure 19:
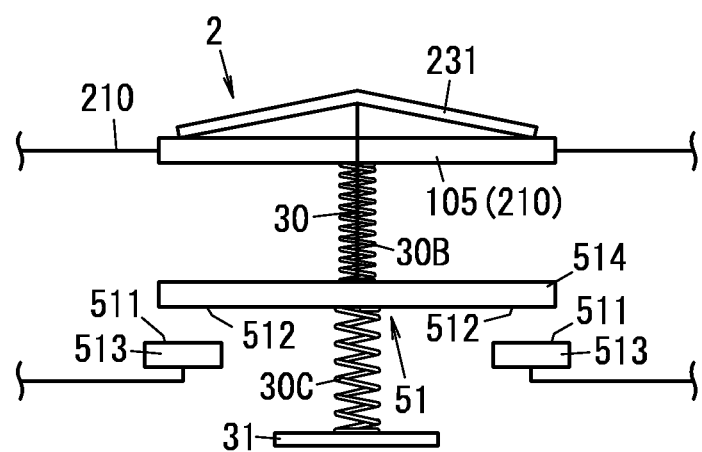
FIG. 19 is a configuration diagram illustrating a state of the driving unit and contact device that have started to operate.

In the example illustrated in FIGS. 18 and 19, the driving unit 2, as well as the driving unit 2 according to the second variation, includes the bimetallic plate 231.

The bimetallic plate 231 is in contact with the wiring member 105 that forms at least part of the intermediate electrical path 210. The contact pressure spring 30B is arranged between the wiring member 105 and the moving contactor 514. The contact pressure spring 30C is arranged between the moving contactor 514 and the part 31 of the housing. The bimetallic plate 231 is heated and bent due to the heat generated by the abnormal current flowing through the wiring member 105. As a result, the bimetallic plate 231 is deformed from a first shape (see FIG. 18) into a second shape (see FIG. 19). The first shape may be a linear shape in a side view, for example. The second shape may be an inverted V-shape in a side view, for example. In the driving unit 2, when the abnormal current flows through the wiring member 105, the bimetallic plate 231 is deformed from the first shape into the second shape. This causes the moving contactor 514 coupled to the bimetallic plate 231 via the shaft 30 to move from the in-contact position where the moving contacts 512 are in contact with the fixed contacts 511 to the out-of-contact position where the moving contacts 512 are out of contact with the fixed contacts 511. Note that the bimetallic plate 231 is kept in the first shape by the contact pressure spring 30B even when heated slightly.

Figure 20:
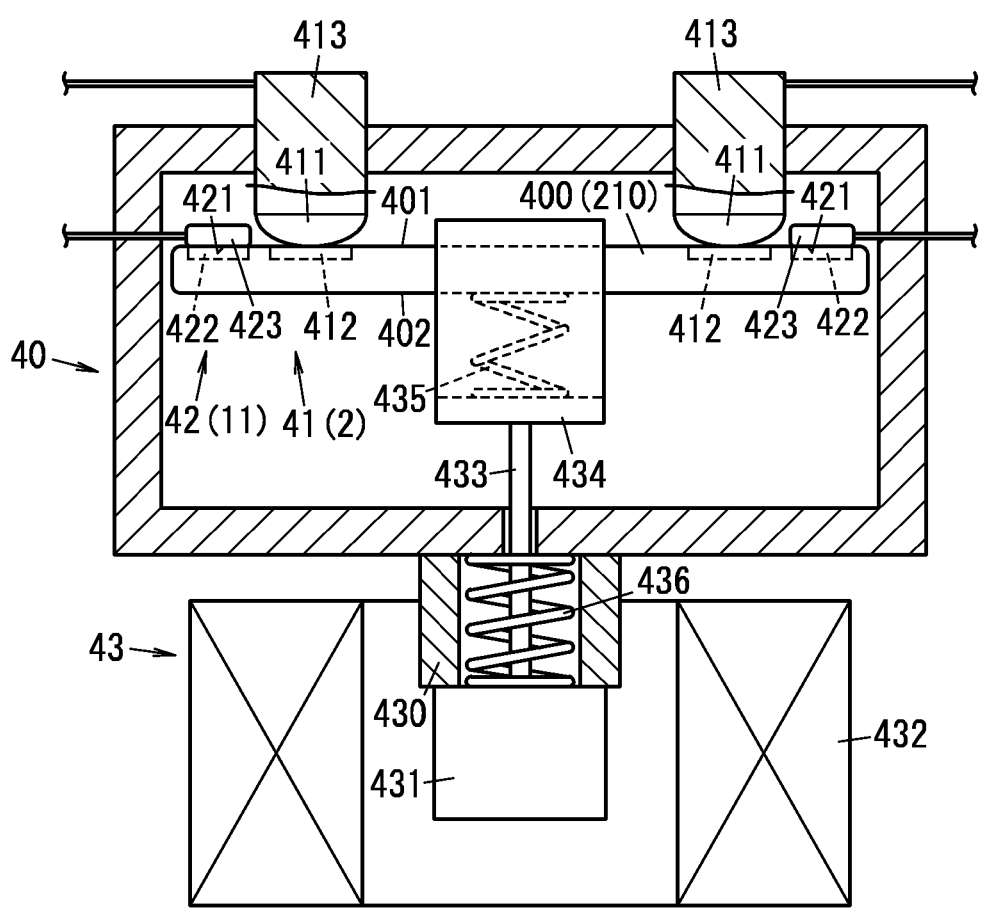
FIG. 20 is a schematic cross-sectional view illustrating a state of an electromagnetic relay for use in the control system when its excitation coil is energized.

Naturally, just like the driving unit 2 according to the third variation, the driving unit 2 may also be configured to drive the driven unit 1 with the electromagnetic repulsion produced by the abnormal current flowing through the intermediate electrical path 210. For example, the auxiliary contact device 42 (contact device 11) may be configured such that when the main moving contacts 412 of the main contact device 41 are in contact with the main fixed contacts 411, the auxiliary moving contacts 422 of the auxiliary contact device 42 also come into contact with the auxiliary fixed contacts 421 as shown in FIG. 20. In FIG. 20, the moving contactor 400 suitably includes: a first electrically conductive portion that connects the pair of main moving contacts 412 together; a second electrically conductive portion that connects the pair of auxiliary moving contacts 422 together; and an insulating portion that electrically insulates the first electrically conductive portion from the second electrically conductive portion.

In the configuration according to this variation, while the contact device 51 is ON, the current is supplied from the single current supply source 150 to both the photodiode and the interrupter 910 (the gas producer 915) as shown in FIG. 12. However, this is only an example of the present disclosure and should not be construed as limiting. Alternatively, a second current supply source for supplying a current to the photodiode may be provided separately from a first current supply source for supplying a current to the interrupter 910.

Optionally, the driven unit 1 may include a relay device, an intelligent power device (IPD) or any other suitable device instead of the photocoupler 520.

(1.3.5) Fifth Variation

Figure 21:
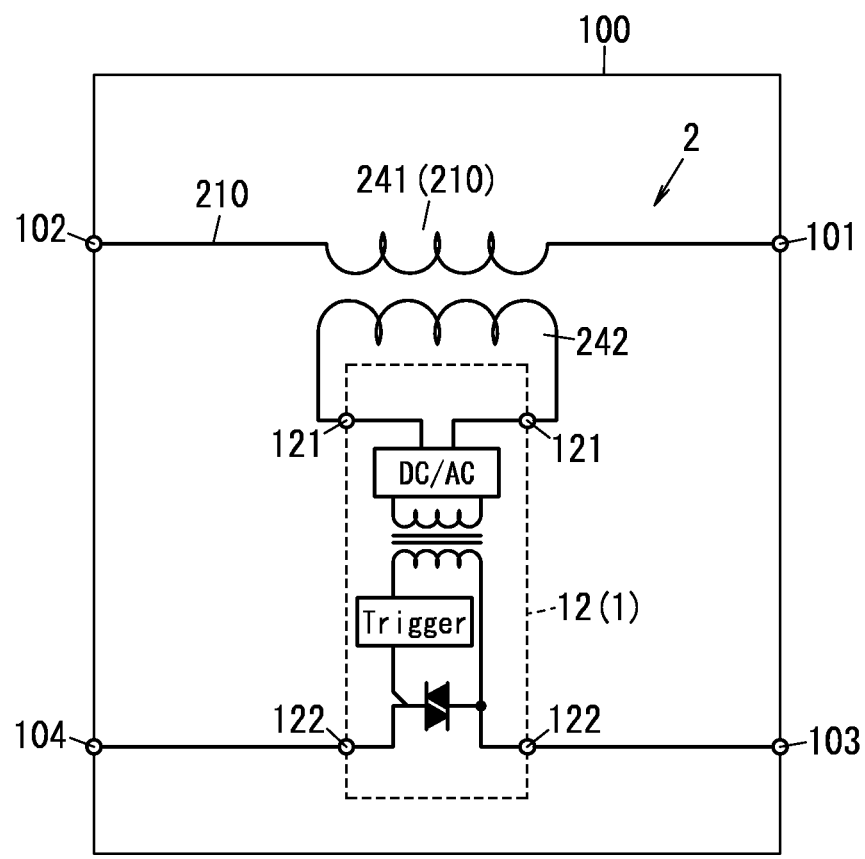
FIG. 21 is a configuration diagram of a switch system for a control system according to a fifth variation of the first embodiment.

According to a fifth variation of this embodiment, in the switch system 100 of the control system 800, the driven unit 1 may include a semiconductor relay (solid-state relay (SSR)) 12 and the driving unit 2 may include a first winding 241 and a second winding 242 as shown in FIG. 21.

The first winding 241 is connected between the first end 101 and second end 102 of the switch system 100. The first winding 241 forms at least part of the intermediate electrical path 210 of the driving unit 2. In other words, the first winding 241 is connected to the main electric circuit 930. The second winding 242 is electromagnetically coupled to the first winding 241. The first winding 241 and the second winding 242 may be wound around the same iron core and electromagnetically coupled together, for example. A transformer is formed by the first winding 241 and the second winding 242.

The semiconductor relay 12 includes a pair of input ends 121 and a pair of output ends 122. The pair of input ends 121 are respectively connected to both ends of the second winding 242. One of the pair of output ends 122 is connected to the third end 103 of the switch system 100 and the other of the pair of output ends 122 is connected to the fourth end 104 of the switch system 100. As shown in FIG. 21, the semiconductor relay 12 according to this embodiment is implemented as a transformer-coupled SSR including a DC/AC converter, a transformer, a trigger circuit, and a thyristor.

When a current flows through the first winding 241, an induced current flows through the second winding 242. In this case, when the current value of the current flowing through the second winding 242 is equal to or less than a predetermined threshold value, the semiconductor relay 12 is OFF. On the other hand, when the abnormal current flows through the first winding 241, the semiconductor relay 12 is turned ON by an induced current (i.e., a current having a current value equal to or greater than the threshold value) flowing through the second winding 242 due to the abnormal current. When the semiconductor relay 12 turns ON, the electrical path between the third end 103 and fourth end 104 of the switch system 100 is short-circuited. This causes the startup current to be supplied from the current supply source 150 to the heat generating element of the interrupter 910 to activate the interrupter 910 and thereby interrupt the main electric circuit 930.

In other words, the semiconductor relay 12 is driven by the induced current generated in the second winding 242 due to the abnormal current flowing through the first winding 241 to close the auxiliary electric circuit 920.

In the switch system 100 according to this variation, when the abnormal current flows through the main electric circuit 930, the abnormal current also flows through the intermediate electrical path 210 of the driving unit 2. The switch system 100 according to this variation closes the auxiliary electric circuit 920 by using, as a drive source that turns the semiconductor relay 12 ON, the abnormal current flowing through the intermediate electrical path 210. Thus, the control system 800 and interrupter system 900 including the switch system 100 according to this variation may also shorten the time it takes to activate the interrupter 910 using a simple configuration.

Note that the semiconductor relay 12 does not have to be the transformer-coupled SSR but may also be any other semiconductor relay such as a reed-relay coupled SSR or a photo-coupled SSR.

(1.3.6) Sixth Variation

Figure 22:
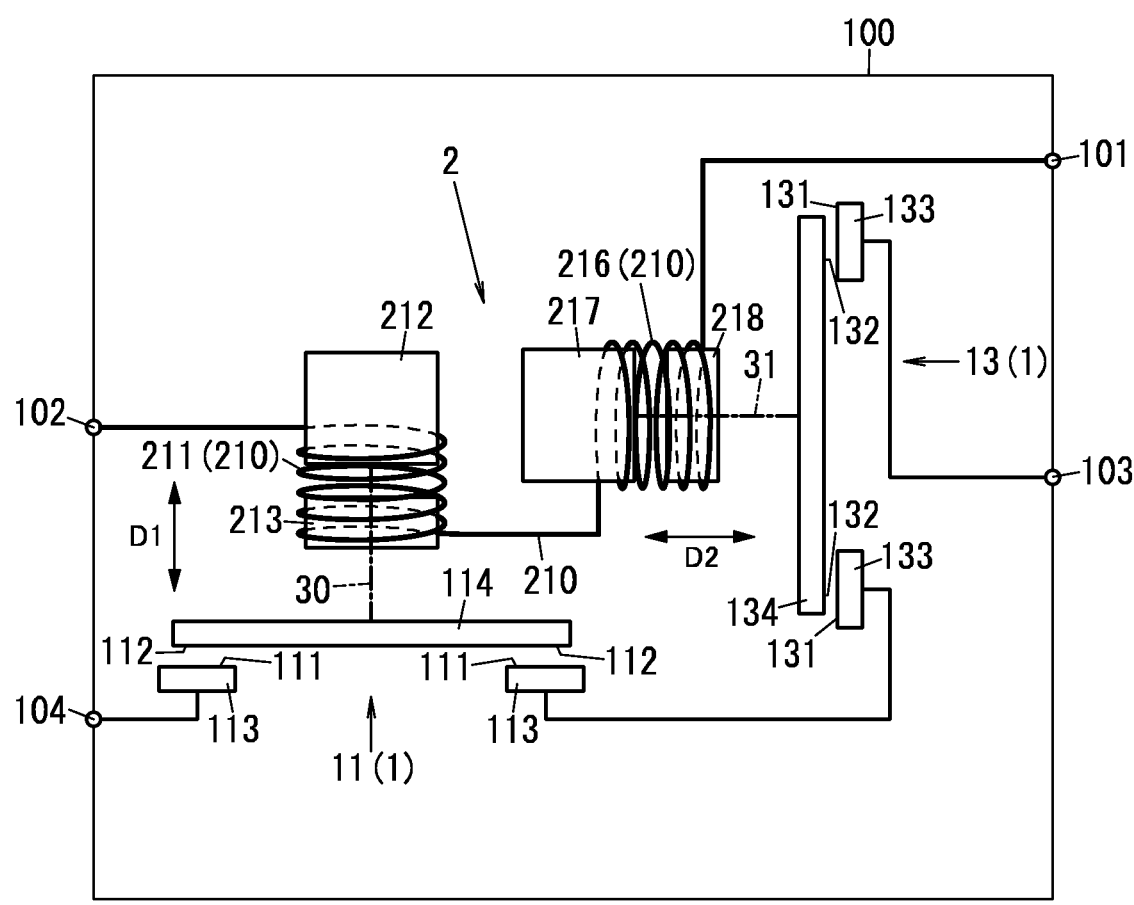
FIG. 22 is a configuration diagram of a switch system for a control system according to a sixth variation of the first embodiment.

According to a sixth variation of this embodiment, the driven unit 1 of the switch system 100 in the control system 800 may include a contact device (first contact device) 11 and a second contact device 13 as shown in FIG. 22.

The first contact device 11 includes a pair of first contacts (a pair of first fixed contacts) 111 and a pair of second contacts (a pair of first moving contacts) 112.

The pair of first fixed contacts 111 may be provided for a pair of fixed terminals (first fixed terminals) 113 made of an electrically conductive material, for example. One of the pair of first fixed terminals 113 is connected to the fourth end 104 of the switch system 100. The other of the pair of first fixed terminals 113 is connected to one of a pair of second fixed terminals 133 of the second contact device 13.

The pair of first moving contacts 112 may be provided for a plate-shaped moving contactor (first moving contactor) 114 made of an electrically conductive material, for example. The pair of first moving contacts 112 may be provided at both longitudinal ends of the first moving contactor 114, for example.

The first moving contactor 114 is movable between an in-contact position and an out-of-contact position with respect to the respective first fixed terminals 113. As used herein, the "in-contact position" refers to a position of the first moving contactor 114 where the pair of first moving contacts 112 are in contact with the pair of first fixed contacts 111, respectively. The out-of-contact position refers herein to a position of the first moving contactor 114 where the pair of first moving contacts 112 are out of contact with the pair of first fixed contacts 111. In other words, each of the first moving contacts 112 is movable between a closed position where the first moving contact 112 is in contact with its associated first fixed contact 111 and an open position where the first moving contact 112 is out of contact with the first fixed contact 111.

The second contact device 13 includes a pair of second fixed contacts 131 and a pair of second moving contacts 132.

The pair of second fixed contacts 131 may be provided for a pair of second fixed terminals 133 made of an electrically conductive material, for example. One of the pair of second fixed terminals 133 is connected to the other of the pair of first fixed terminals 113 of the first contact device 11. The other of the pair of second fixed terminals 133 is connected to the third end 103 of the switch system 100.

The pair of second moving contacts 132 may be provided for a plate-shaped second moving contactor 134 made of an electrically conductive material, for example. The pair of second moving contacts 132 may be provided at both longitudinal ends of the second moving contactor 134, for example.

The second moving contactor 134 is movable between an in-contact position and an out-of-contact position with respect to the respective second fixed terminals 133. As used herein, the "in-contact position" refers to a position of the second moving contactor 134 where the pair of second moving contacts 132 are in contact with the pair of second fixed contacts 131, respectively. The out-of-contact position refers herein to a position of the second moving contactor 134 where the pair of second moving contacts 132 are out of contact with the pair of second fixed contacts 131. In other words, each of the second moving contacts 132 is movable between a closed position where the second moving contact 132 is in contact with its associated second fixed contact 131 and an open position where the second moving contact 132 is out of contact with the second fixed contact 131.

The driving unit 2 according to this variation includes an excitation coil (first excitation coil) 211, a mover (first mover) 212, and a stator (first stator) 213 for driving the first contact device 11. The driving unit 2 according to this variation further includes a second excitation coil 216, a second mover 217, and a second stator 21 for driving the second contact device 13. A first end of the first excitation coil 211 is connected to the second end 102 of the switch system 100. A second end of the first excitation coil 211 is connected to a first end of the second excitation coil 216. A second end of the second excitation coil 216 is connected to the first end 101 of the switch system 100. The first excitation coil 211 and the second excitation coil 216 form at least part of the intermediate electrical path 210 of the driving unit 2. Thus, the same current as the one flowing through the first excitation coil 211 flows through the second excitation coil 216.

The first mover 212 is made of a magnetic material. The first mover 212 is movable between a first position (i.e., the position shown in FIG. 22) and a second position. The first mover 212 is held at the first position by a contact pressure spring (not shown). The first stator 213 is made of a magnetic material.

In the driving unit 2 according to this variation, the first mover 212 is attracted toward the first stator 213 by the magnetic field generated by the first excitation coil 211 when the abnormal current flows through the first excitation coil 211, thus causing the first mover 212 to move from the first position (see FIG. 22) to the second position.

The second mover 217 is made of a magnetic material. The second mover 217 is movable between a third position (i.e., the position shown in FIG. 22) and a fourth position. The second mover 217 is held at the third position by a second contact pressure spring (not shown). The second stator 218 is made of a magnetic material.

In the driving unit 2 according to this variation, the second mover 217 is attracted toward the second stator 218 by the magnetic field generated by the second excitation coil 216 when the abnormal current flows through the second excitation coil 216, thus causing the second mover 217 to move from the third position (see FIG. 22) to the fourth position.

That is to say, according to this variation, when no abnormal current flows through the main electric circuit 930 (intermediate electrical path 210), the first mover 212 is held at the first position by the spring force applied by the first contact pressure spring and the second mover 217 is held at the third position by the spring force applied by the second contact pressure spring. This allows the first moving contacts 112 to be held at the open position and the second moving contacts 132 to be held at the open position, thus making the auxiliary electric circuit 920 opened.

On the other hand, when the abnormal current flows through the main electric circuit 930, the abnormal current also flows through the first excitation coil 211 to cause the first excitation coil 211 to be excited and cause the first mover 212 to be attracted toward the first stator 213 and move from the first position to the second position. As a result, the first moving contacts 112 move from the open position to the closed position. In addition, when the abnormal current flows through the main electric circuit 930, the abnormal current also flows through the second excitation coil 216 to cause the second excitation coil 216 to be excited and cause the second mover 217 to be attracted toward the second stator 218 and move from the third position to the fourth position. As a result, the second moving contacts 132 move from the open position to the closed position. This makes the third end 103 and fourth end 104 of the switch system 100 short-circuited together.

In this case, the first moving contactor 114 according to this variation moves in a first direction D1 as shown in FIG. 22. Meanwhile, the second moving contactor 134 moves in a second direction D2 perpendicular to the first direction D1. That is to say, in the switch system 100 according to this variation, the direction (first direction D1) in which the first moving contacts 112 move is different from the direction (second direction D2) in which the second moving contacts 132 move.

As can be seen, according to this variation, the direction in which the first moving contacts 112 move (i.e., the direction in which the first moving contactor 114 moves) is different from the direction in which the second moving contacts 132 move (i.e., the direction in which the second moving contactor 134 moves).

In the control system 800, when a housing that houses the system or any other member is subjected to impact applied in a direction aligned with the first direction D1, the first moving contactor 114 may move in the direction aligned with the first direction D1 to possibly bring the first moving contacts 112 into contact with the first fixed contacts 111. Even so, the chances of the impact causing the second moving contactor 134 to move in a direction aligned with the second direction D2 to bring the second moving contacts 132 into contact with the second fixed contacts 131 are slim. Thus, this variation reduces the chances of the auxiliary electric circuit 920 being closed unnecessarily due to impact, for example, and also reduces the chances of the startup current flowing unnecessarily through the auxiliary electric circuit 920.

Optionally, to drive the second contact device 13, the driving unit 2 may include either a third yoke and a fourth yoke or a second bimetallic plate instead of the second excitation coil 216, the second mover 217, and the second stator 218. The relation between the third and fourth yokes and the second contact device 13 is the same as the relation between the first and second yokes 221, 222 and the contact device 11 and description thereof will be omitted herein. Likewise, the relation between the second bimetallic plate and the second contact device 13 is the same as the relation between the bimetallic plate 231 and the contact device 11, and description thereof will be omitted herein.

(1.3.7) Seventh Variation

Figure 23:
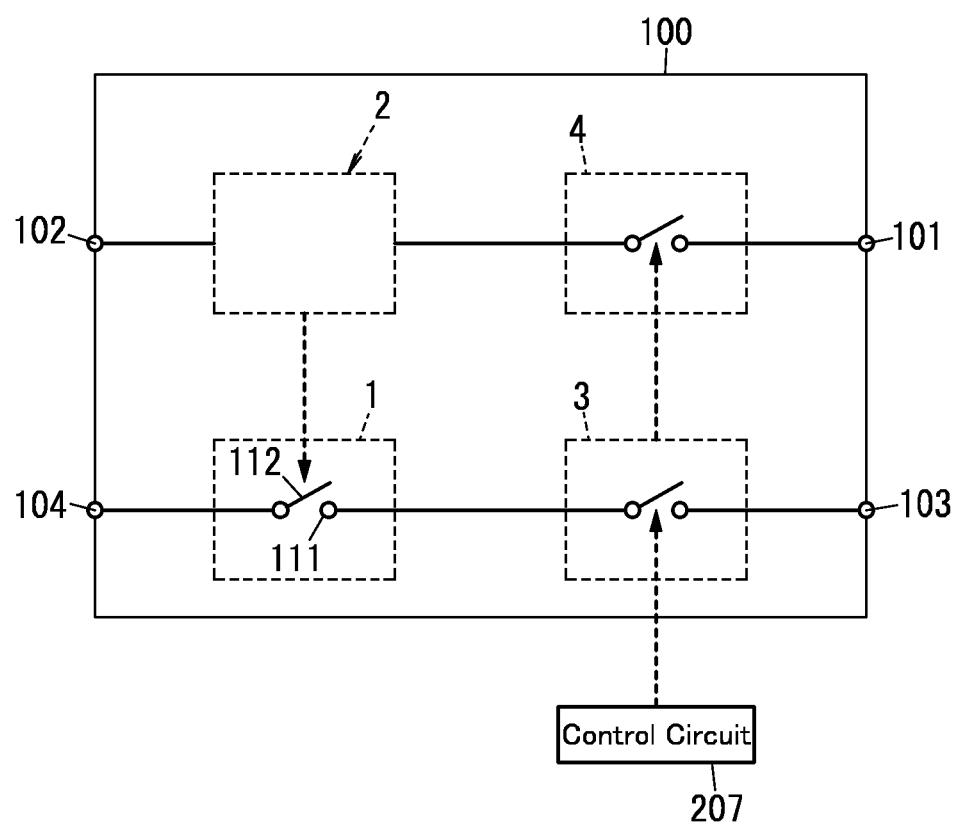
FIG. 23 is a configuration diagram of a switch system for a control system according to a seventh variation of the first embodiment.

According to a seventh variation of this embodiment, the switch system 100 of the control system 800 may include the driven unit (first switch unit) 1, the driving unit 2, a second switch unit 3, and a third switch unit 4 as shown in FIG. 23. The driven unit 1 and the driving unit 2 have the same configuration as their counterparts of the basic example described above, and description thereof will be omitted herein.

The second switch unit 3 is connected, on the auxiliary electric circuit 920, to the first switch unit 1 in series. Specifically, a series circuit of the first switch unit 1 and the second switch unit 3 is connected between the third end 103 and fourth end 104 of the switch system 100. The second switch unit 3 opens and closes the auxiliary electric circuit 920. Since the first switch unit 1 and the second switch unit 3 are connected to the auxiliary electric circuit 920, the startup current is allowed to flow through the auxiliary electric circuit 920 only when the first switch unit 1 and the second switch unit 3 are both closed.

The third switch unit 4 is connected to the main electric circuit 930. Specifically, a series circuit of the third switch unit 4 and the driving unit 2 is connected between the first end 101 and second end 102 of the switch system 100.

The second switch unit 3 opens and closes the auxiliary electric circuit 920 in synch with opening and closing of the main electric circuit 930 by the third switch unit 4. Specifically, when the third switch unit 4 closes the main electric circuit 930, the second switch unit 3 closes the auxiliary electric circuit 920. When the third switch unit 4 opens the main electric circuit 930, the second switch unit 3 opens the auxiliary electric circuit 920.

In a specific example, the third switch unit 4 connected to the main electric circuit 930 and the second switch unit 3 connected to the auxiliary electric circuit 920 may be respectively implemented as a main contact device and auxiliary contact device of an electromagnetic relay. For example, when the coil of the electromagnet device of the electromagnetic relay is energized, the third switch unit (main contact device) 4 is closed. At the same time, the second switch unit (auxiliary contact device) 3 is also closed. When the coil is not energized, each of the third switch unit 4 and the second switch unit 3 is opened. That is to say, the second switch unit 3 is opened and closed as the third switch unit 4 is opened and closed. Opening and closing of the third switch unit 4 and the second switch unit 3 (i.e., whether the coil should be energized or not) may be controlled by the control circuit 207, for example.

According to this variation, in a normal condition in which the interrupter 910 is not activated, the control circuit 207 controls the electrically conductive and non-conductive states of the main electric circuit 930 by opening and closing the third switch unit 4. When the third switch unit (main contact device) 4 is closed by the control circuit 207, the second switch unit (auxiliary contact device) 3 is also closed. In this state, when the abnormal current flows through the main electric circuit 930, the driving unit 2 closes the first switch unit 1 using the abnormal current flowing through the intermediate electrical path 210 of the driving unit 2 as a drive source. This causes the startup current to flow through the auxiliary electric circuit 920 and thereby allows the interrupter 910 to interrupt the main electric circuit 930.

On the other hand, when the third switch unit 4 is opened by the control circuit 207 to allow no current to flow through the main electric circuit 930 in the normal condition, the first switch unit 1 could be closed due to some factor such as impact other than the one applied by the driving unit 2. Even in such a situation, no startup current flows through the auxiliary electric circuit 920 according to this variation because the second switch unit 3 is opened by the control circuit 207. That is to say, according to this variation, when no current flows through the main electric circuit 930 in the normal condition (i.e., when no power is supplied from the power supply system 200 to a load such as a motor 3002), no startup current flows through the auxiliary electric circuit 920. Thus, this variation reduces the chances of the startup current flowing unnecessarily through the auxiliary electric circuit 920 to activate the interrupter 910 erroneously.

Optionally, the third switch unit 4 (main contact device) may be used in common as either the first main relay 202 or the second main relay 203 of the power supply system 200. That is to say, the power supply system 200 may include only the first main relay 202 and the second main relay 203 as relays to be connected to the main electric circuit 930. In addition, either the first main relay 202 or the second main relay 203 may include the third switch unit 4 serving as the main contact device and the second switch unit 3 serving as the auxiliary contact device.

Note that the third switch unit 4 and the second switch unit 3 do not have to be respectively implemented as a main contact device and an auxiliary contact device of an electromagnetic relay. Rather the second switch unit 3 has only to be configured to open and close as the third switch unit 4 opens and closes.

(1.3.8) Eighth Variation

Figure 24:
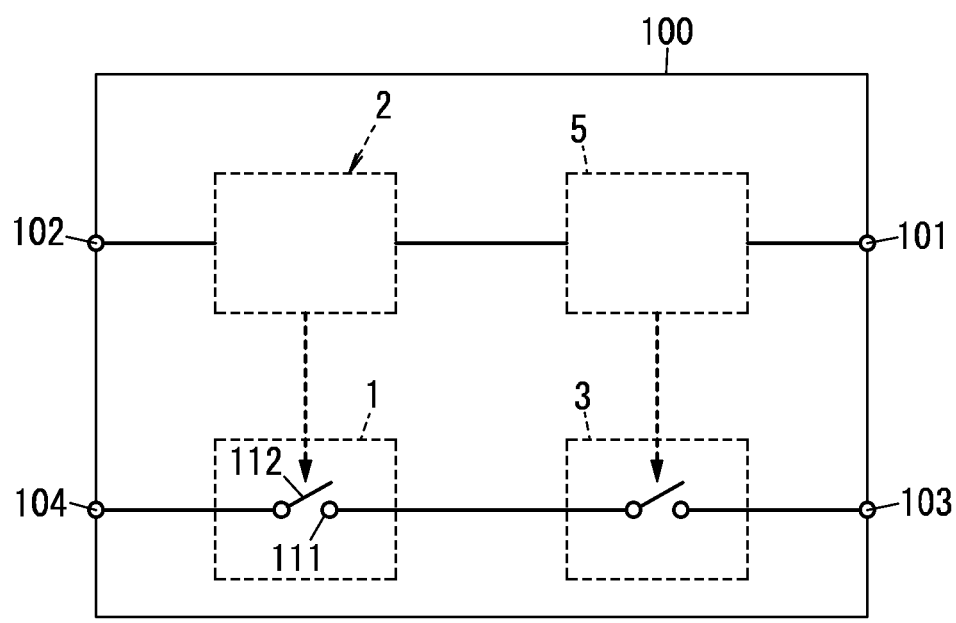
FIG. 24 is a configuration diagram of a switch system for a control system according to an eighth variation of the first embodiment.

According to an eighth variation of this embodiment, the switch system 100 of the control system 800 may include the driven unit (first switch unit) 1, the driving unit (first driving unit) 2, another driven unit (second switch unit) 3, and a second driving unit 5 as shown in FIG. 24. The first switch unit 1 and the first driving unit 2 have the same configuration as the driven unit 1 and driving unit 2 of the first embodiment described above, and description thereof will be omitted herein.

The second switch unit 3 is connected, on the auxiliary electric circuit 920, to the first switch unit 1 in series. Specifically, a series circuit of the first switch unit 1 and the second switch unit 3 is connected between the third end 103 and fourth end 104 of the switch system 100. The second switch unit 3 opens and closes the auxiliary electric circuit 920. Since the first switch unit 1 and the second switch unit 3 are connected to the auxiliary electric circuit 920, the startup current is allowed to flow through the auxiliary electric circuit 920 only when the first switch unit 1 and the second switch unit 3 are both closed.

The second driving unit 5 closes the second switch unit 3 by using, as a drive source, the abnormal current flowing through an intermediate electrical path of the second driving unit 5. When the magnitude of the abnormal current flowing through the intermediate electrical path of the second driving unit 5 is equal to or less than a second prescribed value, the second driving unit 5 closes the second switch unit 3. As used herein, the second prescribed value is larger than a first prescribed value as the prescribed value defining the abnormal current. That is to say, the first prescribed value and the second prescribed value are different from each other.

More specifically, a series circuit of the first driving unit 2 and the second driving unit 5 is connected between the first end 101 and second end 102 of the switch system 100. When the current value of the current flowing through the intermediate electrical path 210 of the first driving unit 2 is greater than the first prescribed value (i.e., when the abnormal current flows through the main electric circuit 930), the first driving unit 2 is activated to close the first switch unit 1. On the other hand, when the current value of the current flowing through the intermediate electrical path of the second driving unit 5 is greater than the first prescribed value (i.e., when the abnormal current flows through the main electric circuit 930) and less than the second prescribed value, the second driving unit 5 is activated to close the second switch unit 3.

The second driving unit 5 may include a voltage divider circuit for dividing the voltage to be applied to the main electric circuit 930, for example. The second driving unit 5 compares the divided voltage obtained by the voltage divider circuit with a predetermined reference voltage. The second driving unit 5 closes the second switch unit 3 only when the divided voltage is less than the reference voltage.

According to this variation, when the current flowing through the intermediate electrical path 210 of the first driving unit 2 is equal to or greater than a prescribed value (first prescribed value), the first driving unit 2 closes the first switch unit 1. Meanwhile, when the current flowing through the intermediate electrical path of the second driving unit 5 is equal to or less than a second prescribed value (>the first prescribed value), the second driving unit 5 closes the second switch unit 3. That is to say, according to this variation, only when the current flowing through the main electric circuit 930 falls within a predetermined range between a lower limit (first prescribed value) and an upper limit (second prescribed value), the startup current flows through the auxiliary electric circuit 920. This variation allows a variety of control to be performed.

(1.3.9) Ninth Variation

A ninth variation of this embodiment will be described with reference to FIGS. 25-27. According to this variation, the switch system 100 of the control system 800 includes a contact device (first auxiliary contact device) 11, a main contact device 61, a first operation control unit 62, a second auxiliary contact device 63, and a second operation control unit 64.

The first auxiliary contact device 11 includes a pair of fixed contacts (a pair of first auxiliary fixed contacts) 111 and a pair of moving contacts (a pair of first auxiliary moving contacts) 112.

The pair of first auxiliary fixed contacts 111 may be provided for a pair of fixed terminals (first auxiliary fixed terminals) 113 made of an electrically conductive material, for example. One of the pair of first auxiliary fixed terminals 113 is connected to the fourth end 104 of the switch system 100. The other of the pair of first auxiliary fixed terminals 113 is connected to one of a pair of second auxiliary fixed terminals 633 of the second auxiliary contact device 63.

The pair of first auxiliary moving contacts 112 may be provided for a plate-shaped moving contactor (first auxiliary moving contactor) 114 made of an electrically conductive material, for example. The pair of first auxiliary moving contacts 112 may be provided at both longitudinal ends of the first auxiliary moving contactor 114, for example.

The first auxiliary moving contactor 114 is movable between an in-contact position and an out-of-contact position with respect to the respective first auxiliary fixed terminals 113. As used herein, the "in-contact position" refers to a position of the first auxiliary moving contactor 114 where the pair of first auxiliary moving contacts 112 are in contact with the pair of first auxiliary fixed contacts 111, respectively. The out-of-contact position refers herein to a position of the first auxiliary moving contactor 114 where the pair of first auxiliary moving contacts 112 are out of contact with the pair of first auxiliary fixed contacts 111. In other words, each of the first auxiliary moving contacts 112 is movable between a closed position where the first auxiliary moving contact 112 is in contact with its associated first auxiliary fixed contact 111 and an open position where the first auxiliary moving contact 112 is out of contact with the first auxiliary fixed contact 111.

The main contact device 61 includes a pair of main fixed contacts 611 and a pair of main moving contacts 612. The intermediate electrical path 210 of the main contact device 61 includes the pair of main fixed contacts 611 and the pair of main moving contacts 612.

The pair of main fixed contacts 611 may be provided for a pair of main fixed terminals 613 made of an electrically conductive material, for example. One of the pair of main fixed terminals 113 is connected to the first end 101 of the switch system 100. The other of the pair of main fixed terminals 613 is connected to the second end 102 of the switch system 100.

The pair of main moving contacts 612 may be provided for a plate-shaped main moving contactor 614 made of an electrically conductive material, for example. The pair of main moving contacts 612 may be provided at both longitudinal ends of the main moving contactor 614, for example.

The main moving contactor 614 is movable between an in-contact position and an out-of-contact position with respect to the respective main fixed terminals 613. As used herein, the "in-contact position" refers to a position of the main moving contactor 614 where the pair of main moving contacts 612 are in contact with the pair of main fixed contacts 611, respectively. The out-of-contact position refers herein to a position of the main moving contactor 614 where the pair of main moving contacts 612 are out of contact with the pair of main fixed contacts 611. In other words, each of the main moving contacts 612 is movable between a closed position where the main moving contact 612 is in contact with its associated main fixed contact 611 and an open position where the main moving contact 612 is out of contact with the main fixed contact 611.

The first operation control unit 62 includes a first excitation coil 621, a first mover 622, a first stator 623, and a shaft 624.

The first excitation coil 621 is connected to the control circuit 207. The first excitation coil 621 is energized and excited by the control circuit 207.

The first mover 622 is made of a magnetic material. The first mover 622 is coupled to the first auxiliary moving contactor 114 of the first auxiliary contact device 11. The first mover 622 is movable between a first position (i.e., the position shown in FIG. 25) and a second position (i.e., the position shown in FIG. 26). The first mover 622 is held at the first position by a first contact pressure spring (not shown). The first stator 623 is made of a magnetic material.

When the first excitation coil 621 is energized by the control circuit 207, the first operation control unit 62 has the first mover 622 attracted toward the first stator 623 by the magnetic field generated by the first excitation coil 621. This causes the first mover 622 to move from the first position (i.e., the position shown in FIG. 25) to the second position (i.e., the position shown in FIG. 26).

The shaft 624 couples the main moving contactor 614 and the first mover 622 together. Thus, as the first mover 622 moves, the main moving contactor 614 and the first auxiliary moving contactor 114 also move accordingly. In other words, as the first mover 622 moves, the main moving contacts 612 and the first auxiliary moving contacts 112 also move accordingly.

Figure 25:
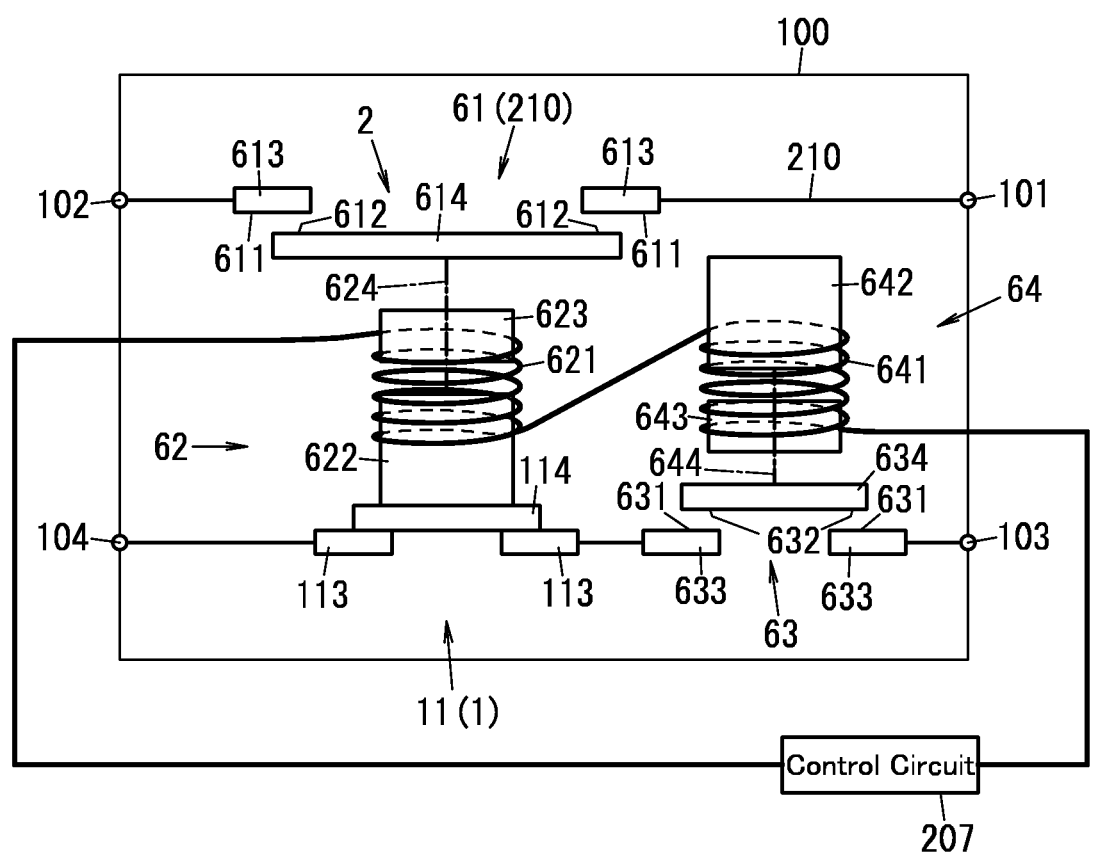
FIG. 25 is a configuration diagram of a switch system for a control system according to a ninth variation of the first embodiment.

Also, when the first mover 622 is located at the first position, the main moving contactor 614 assumes the out-of-contact position and the first auxiliary moving contactor 114 assumes the in-contact position (see FIG. 25). On the other hand, when the first mover 622 is located at the second position, the main moving contactor 614 assumes the in-contact position and the first auxiliary moving contactor 114 assumes the out-of-contact position (see FIG. 26).

The second auxiliary contact device 63 is connected, on the auxiliary electric circuit 920, to the first auxiliary contact device 11 in series. The second auxiliary contact device 63 includes a pair of second auxiliary fixed contacts 631 and a pair of second auxiliary moving contacts 632.

The pair of second auxiliary fixed contacts 631 may be provided for a pair of second auxiliary fixed terminals 633 made of an electrically conductive material, for example. One of the pair of second auxiliary fixed terminals 633 is connected to the other of the pair of first auxiliary fixed terminals 113 of the first auxiliary contact device 11. The other of the pair of second auxiliary fixed terminals 633 is connected to the third end 103 of the switch system 100.

The pair of second auxiliary moving contacts 632 may be provided for a plate-shaped second auxiliary moving contactor 634 made of an electrically conductive material, for example. The pair of second auxiliary moving contacts 632 may be provided at both longitudinal ends of the second auxiliary moving contactor 634, for example.

The second auxiliary moving contactor 634 is movable between an in-contact position and an out-of-contact position with respect to the respective second auxiliary fixed terminals 633. As used herein, the "in-contact position" refers to a position of the second auxiliary moving contactor 634 where the pair of second auxiliary moving contacts 632 are in contact with the pair of second auxiliary fixed contacts 631, respectively. The out-of-contact position refers herein to a position of the second auxiliary moving contactor 634 where the pair of second auxiliary moving contacts 632 are out of contact with the pair of second auxiliary fixed contacts 631. In other words, each of the second auxiliary moving contacts 632 is movable between a closed position (see FIG. 26) where the second auxiliary moving contact 632 is in contact with its associated second auxiliary fixed contact 631 and an open position (see FIG. 25) where the second auxiliary moving contact 632 is out of contact with the second auxiliary fixed contact 631.

The second operation control unit 64 includes a second excitation coil 641, a second mover 642, and a second stator 643.

The second excitation coil 641 is connected to the control circuit 207. The second excitation coil 641 is connected to the first excitation coil 621 in series. The second excitation coil 641 is, along with the first excitation coil 621, energized and excited by the control circuit 207.

The second mover 642 is made of a magnetic material. The second mover 642 is movable between a third position (i.e., the position shown in FIG. 25) and a fourth position (i.e., the position shown in FIG. 26). The second mover 642 is held at the third position (i.e., the position shown in FIG. 25) by a second contact pressure spring (not shown). The second stator 643 is made of a magnetic material.

When the second excitation coil 641 is energized by the control circuit 207, the second operation control unit 64 has the second mover 642 attracted toward the second stator 643 by the magnetic field generated by the second excitation coil 641. This causes the second mover 642 to move from the third position (i.e., the position shown in FIG. 25) to the fourth position (i.e., the position shown in FIG. 26).

The second auxiliary moving contactor 634 of the second auxiliary contact device 63 is coupled by a bar-shaped shaft 644 to the second mover 642. Thus, as the second mover 642 moves, the second auxiliary moving contactor 634 also moves accordingly. In other words, as the second mover 642 moves, the second auxiliary moving contacts 632 also move accordingly.

Also, when the second mover 642 is located at the third position, the second auxiliary moving contactor 634 assumes the out-of-contact position (see FIG. 25). On the other hand, when the second mover 642 is located at the fourth position, the second auxiliary moving contactor 634 assumes the in-contact position (see FIG. 26).

According to this variation, when the control circuit 207 energizes neither the first excitation coil 621 nor the second excitation coil 641, the main contact device 61 and the second auxiliary contact device 63 are opened and the first auxiliary contact device 11 is closed (see FIG. 25). Since the main contact device 61 is opened at this time, no current flows through the main electric circuit 930. In addition, since the second auxiliary contact device 63 is opened, no current flows through the auxiliary electric circuit 920, either.

Figure 26:
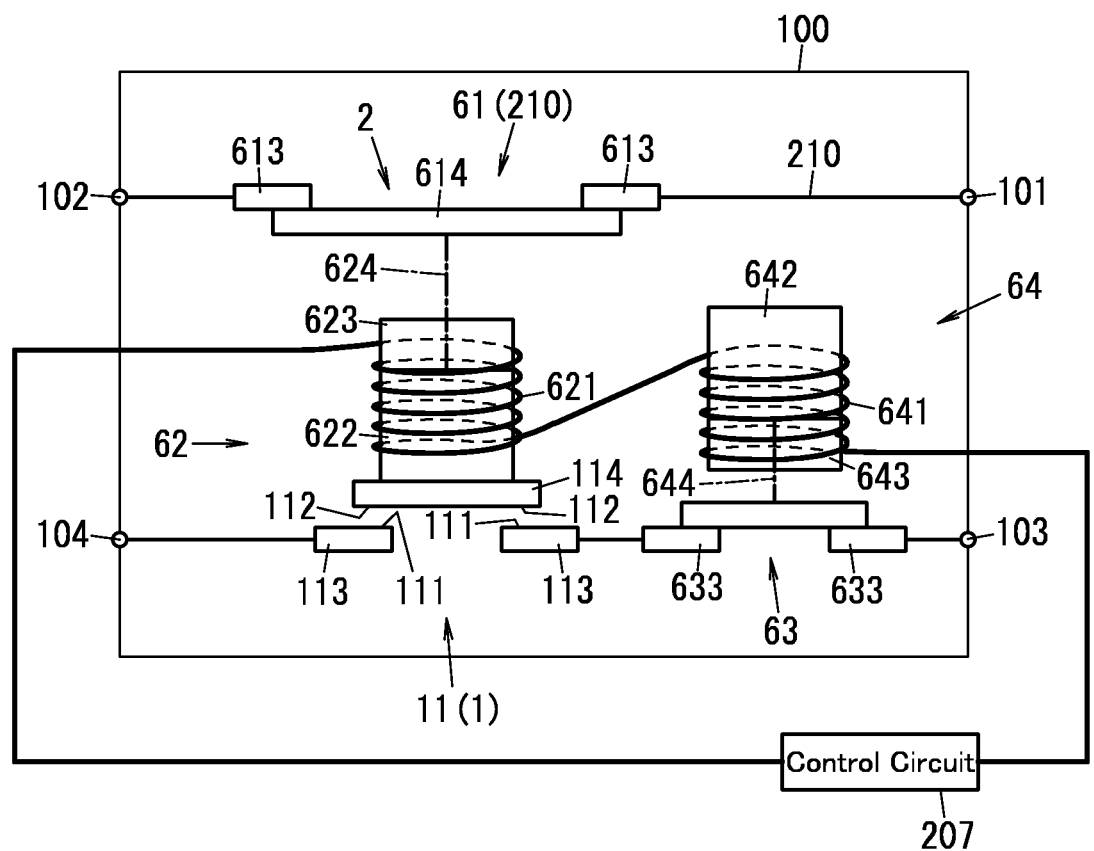
FIG. 26 is a configuration diagram illustrating another state of the switch system.
Figure 27:
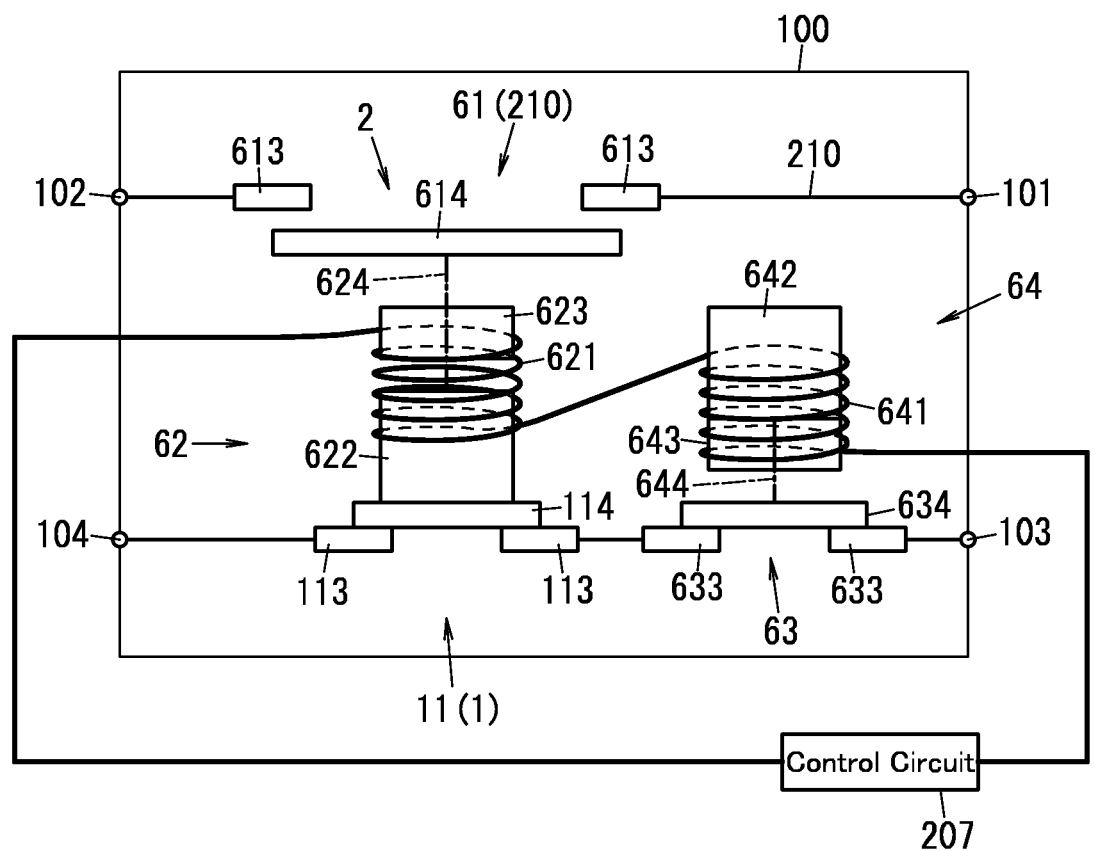
FIG. 27 is a configuration diagram illustrating still another state of the switch system.

On the other hand, when the control circuit 207 energizes the first excitation coil 621 and the second excitation coil 641, the main contact device 61 and the second auxiliary contact device 63 are closed and the first auxiliary contact device 11 is opened (see FIG. 26). Since the main contact device 61 is closed at this time, a current flows through the main electric circuit 930. Meanwhile, since the first auxiliary contact device 11 is opened, no current flows through the auxiliary electric circuit 920.

When an abnormal current flows through the main electric circuit while the control circuit 207 energizes the first excitation coil 621 and the second excitation coil 641, electromagnetic repulsion is produced between the main fixed contacts 611 and main moving contacts 612 of the main contact device 61. That is to say, the main fixed contacts 611 and the main moving contacts 612 go out of contact with each other. The electromagnetic repulsion gives the main moving contactor 614 force that causes the main moving contactor 614 to go away from the main fixed terminals 613. This electromagnetic repulsion causes the main moving contactor 614 to move from the in-contact position to the out-of-contact position. At this time, the first auxiliary moving contactor 114, as well as the main moving contactor 614, is subjected to force in the same direction via the first mover 622 and caused to move from the out-of-contact position to the in-contact position (see FIG. 27). This makes the first auxiliary contact device 11 and the second auxiliary contact device 63 both closed, thus allowing the startup current to be supplied from the current supply source 150 to the auxiliary electric circuit 920.

In this variation, the main fixed contacts 611 and main moving contacts 612 of the main contact device 61 form at least part of the intermediate electrical path 210 of driving unit 2. The driving unit 2 includes the main contact device 61 (including the main fixed contacts 611 and the main moving contacts 612) and the first mover 622 and shaft 624 of the first operation control unit 62.

In the switch system 100 according to this variation, when the abnormal current flows through the main electric circuit 930, the abnormal current also flows through the intermediate electrical path 210 of the driving unit 2. The switch system 100 closes the auxiliary electric circuit 920 by using the abnormal current flowing through the intermediate electrical path 210 as a drive source that causes the main fixed contacts 611 and the main moving contacts 612 to go out of contact with each other (i.e., as a drive source that causes the first mover 622 to move to the first position). Thus, the control system 800 and interrupter system 900 including the switch system 100 according to this variation may also shorten the time it takes to activate the interrupter 910.

Optionally, the main contact device 61 may be used in common as either the first main relay 202 or the second main relay 203 of the power supply system 200. That is to say, the power supply system 200 may include only the first main relay 202 and the second main relay 203 as relays to be connected to the main electric circuit 930. In addition, either the first main relay 202 or the second main relay 203 may include the main contact device 61, the first auxiliary contact device 11, and the first operation control unit 62.

According to this variation, particularly when the main contact device 61 is used in common as either the first main relay 202 or the second main relay 203, there is no need to change the structure of the main electric circuit 930 (power supply system 200) significantly.

Figure 28:
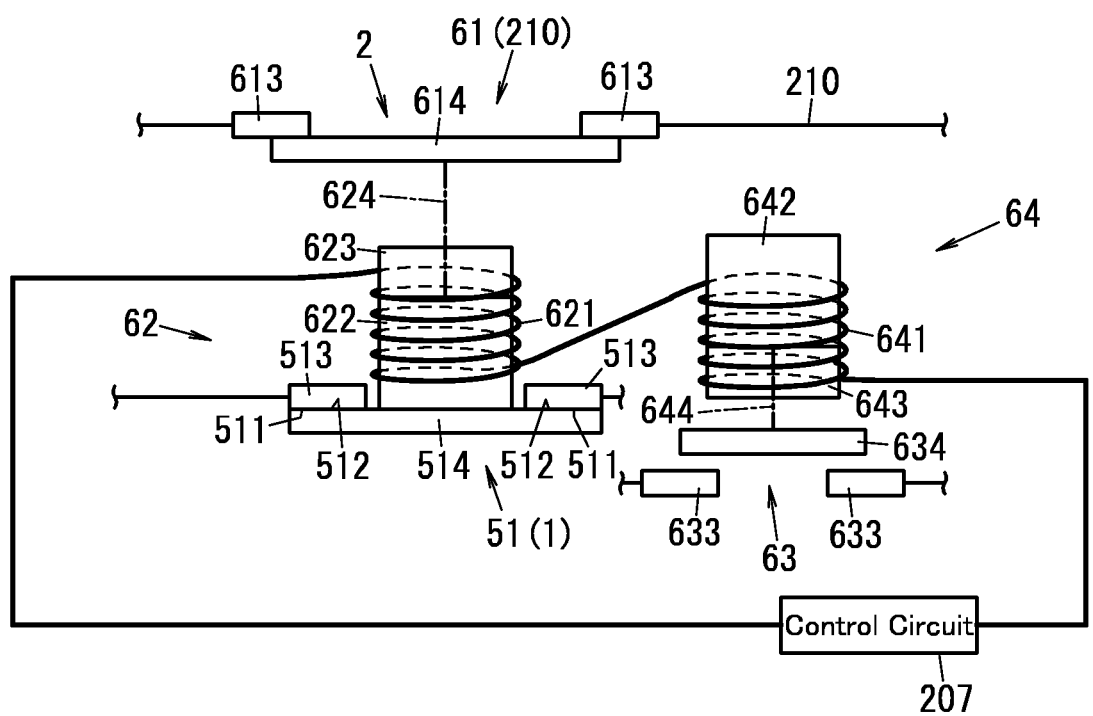
FIG. 28 is a configuration diagram of a driving unit and contact device for use in another exemplary control system.

Optionally, the structure according to this variation may be used in the switch system 100 according to the fourth variation. For example, the (Form A contact) structure of the first auxiliary contact device 11 according to this variation may be replaced with the (Form B contact) structure of the contact device 51 according to the fourth variation as shown in FIG. 28. Then, the respective outputs of the second auxiliary contact device 63 and the contact device 51 may be supplied to an OR circuit, the output of which may be inverted by the signal inverter circuit 52. This allows, when neither the first excitation coil 621 nor the second excitation coil 641 is energized, the contact device 51 to be opened and the second auxiliary contact device 63 to be closed, thus turning the output of the OR circuit ON. Meanwhile, when the first excitation coil 621 and the second excitation coil 641 are energized (see FIG. 28), the contact device 51 is closed and the second auxiliary contact device 63 is opened, thus turning the output of the OR circuit ON. On the other hand, if the abnormal current flows through the intermediate electrical path 210 when the first excitation coil 621 and the second excitation coil 641 are energized, then the contact device 51 and the second auxiliary contact device 63 are both opened, thus turning the output of the OR circuit OFF. Then, having the OFF output of the OR circuit inverted by the signal inverter circuit 52 allows the startup current to be supplied to the auxiliary electric circuit 920.

(1.3.10) Tenth Variation

Figure 29:
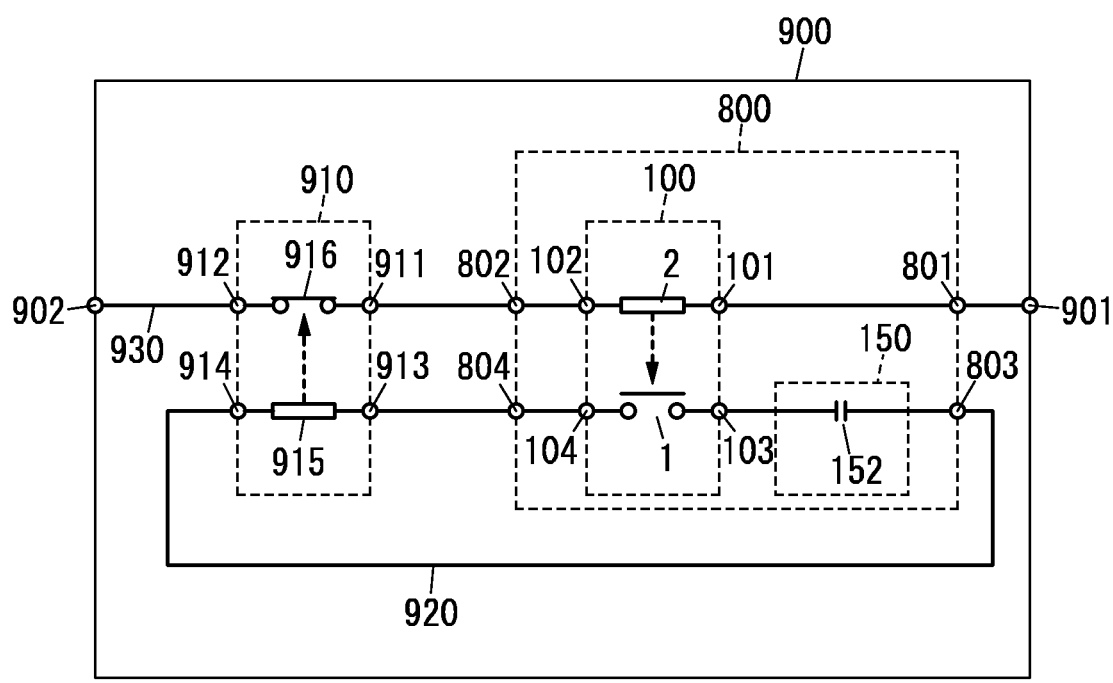
FIG. 29 is a configuration diagram of an interrupter system according to a tenth variation of the first embodiment.

According to a tenth variation of this embodiment, the current supply source 150 may include a capacitor 152 instead of the constant voltage source 151 as shown in FIG. 29. This allows the system to be downsized by omitting the constant voltage source 151 and/or omitting the wiring between the constant voltage source 151 and the control system 800. In addition, this also allows, even when the vehicle's 300 power supply, serving as the constant voltage source 151, goes out of order, for example, the interrupter system 900 to be activated.

Note that in a normal condition (i.e., when no abnormal current flows through the main electric circuit 930), the electrical path between the third end 103 and fourth end 104 of the switch system 100 is opened, and therefore, the auxiliary electric circuit 920 is interrupted. Therefore, in the normal condition, the electric charges stored in the capacitor 152 are hardly consumed (on the supposition that natural discharge is negligible).

(1.3.11) Eleventh Variation

Figure 30:
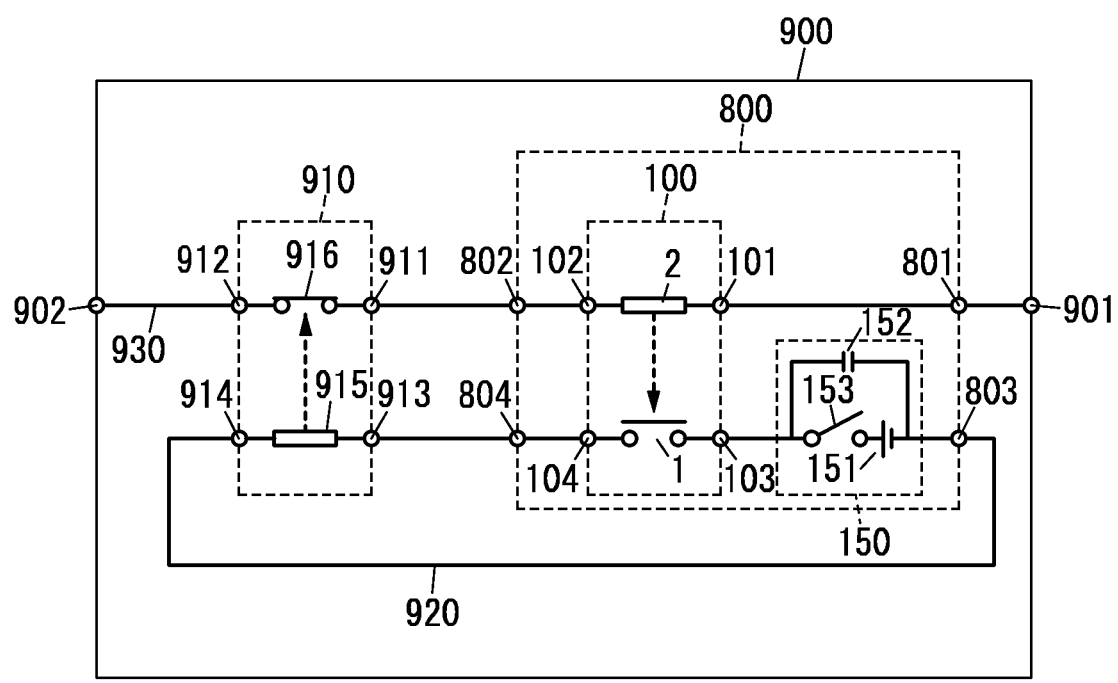
FIG. 30 is a configuration diagram of an interrupter system according to an eleventh variation of the first embodiment.

According to an eleventh variation of this embodiment, the current supply source 150 may include a capacitor 152 in addition to the constant voltage source 151 as shown in FIG. 30. In the interrupter system 900 shown in FIG. 30, a relay 153 is connected to the constant voltage source 151 in series. The capacitor 152 is connected in parallel to the series circuit of the constant voltage source 151 and the relay 153. The relay 153 may be controlled by the control circuit 207, for example.

In this case, the capacitor 152 may be supplemented with electric charges to compensate for the electric charges consumed by natural discharge by closing the relay 153 at regular intervals.

Optionally, in the current supply source 150, the constant voltage source 151 and the capacitor 152 may be connected in parallel without using the relay 153.

(1.3.12) Twelfth Variation

Figure 31:
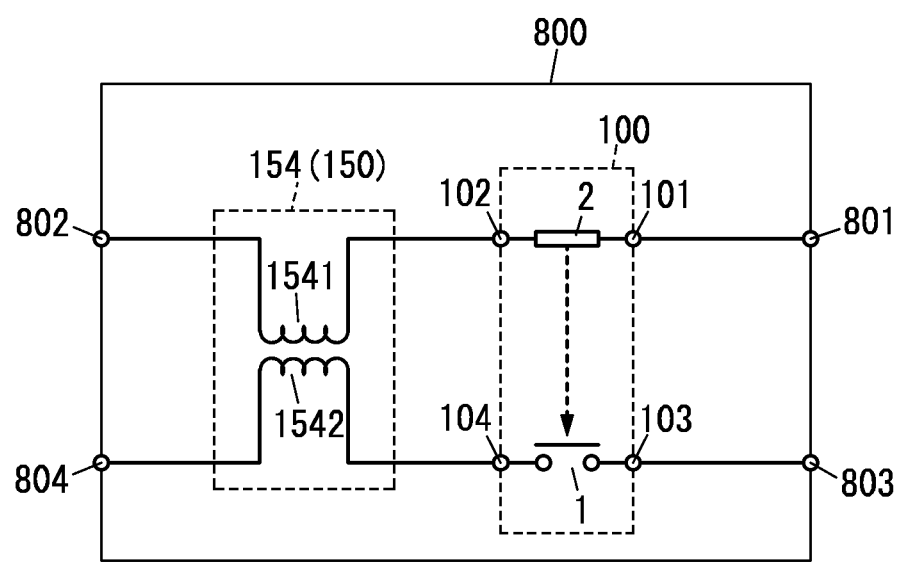
FIG. 31 is a configuration diagram of a control system according to a twelfth variation of the first embodiment.

According to a twelfth variation of this embodiment, the current supply source 150 may include a transformer 154 as shown in FIG. 31. The transformer 154 includes a primary winding 1541 and a secondary winding 1542.

The primary winding 1541 is connected between the second end 102 of the switch system 100 and the second end 802 of the control system 800. In other words, the primary winding 1541 is connected to the main electric circuit 930. The secondary winding 1542 is connected between the fourth end 104 of the switch system 100 and the fourth end 804 of the control system 800. In other words, the secondary winding 1542 is connected to the auxiliary electric circuit 920. The secondary winding 1542 is electromagnetically coupled to the primary winding 1541. The primary winding 1541 and the secondary winding 1542 may be wound around the same iron core and electromagnetically coupled together, for example.

When a current flows through the primary winding 1541, the secondary winding 1542 is excited. In this case, the transformer 154 according to this embodiment is configured such that when the abnormal current (i.e., a current having a current value equal to or greater than a prescribed value) flows through the primary winding 1541, a voltage high enough to supply the startup current (i.e., a current having a current value equal to or greater than the predetermined value) from the secondary winding 1542 is generated across the secondary winding 1542.

In addition, when the abnormal current flows through the main electric circuit 930, the switch system 100 operates, using the abnormal current as a drive source, to close the auxiliary electric circuit 920. Also, when no abnormal current flows through the main electric circuit 930, the auxiliary electric circuit 920 is opened in the switch system 100.

According to this variation, when the abnormal current flows through the main electric circuit 930, the switch system 100 closes the auxiliary electric circuit 920 and the startup current (induced current) flows from the secondary winding 1542 of the transformer 154 toward the auxiliary electric circuit 920. This allows, when the abnormal current flows through the main electric circuit 930, the interrupter 910 to be activated to interrupt the main electric circuit 930.

Note that according to this variation, if the current value of the current flowing through the intermediate electrical path 210 of the driving unit 2 of the switch system 100 is smaller than the prescribed value, the driven unit 1 is not driven, and therefore, the auxiliary electric circuit 920 is opened. Thus, even if the secondary winding 1542 of the transformer 154 is excited with the current flowing through the main electric circuit 930 (primary winding 1541), no induced current is output from the secondary winding 1542 and no current flows through the auxiliary electric circuit 920. This prevents a current from flowing from the auxiliary electric circuit 920 toward the interrupter 910 when no abnormal current flows through the main electric circuit 930.

(2) Second Embodiment

A control system 800A and interrupter system 900A according to a second embodiment will be described with reference to FIGS. 32 and 33. In the following description, any constituent element of this second embodiment, having the same function as a counterpart of the first embodiment (and its variations) described above, will be designated by the same reference numeral as that counterpart's, and description thereof will be omitted herein as appropriate.

The control system 800A according to this embodiment includes a driven unit 1 and a driving unit 2. The driven unit 1 is connected to an auxiliary electric circuit 920. The driving unit 2 includes an intermediate electrical path 210 to be connected to a main electric circuit 930. The intermediate electrical path 210 forms part of the main electric circuit 930. The driven unit 1 is driven by the driving unit 2.

Figure 32:
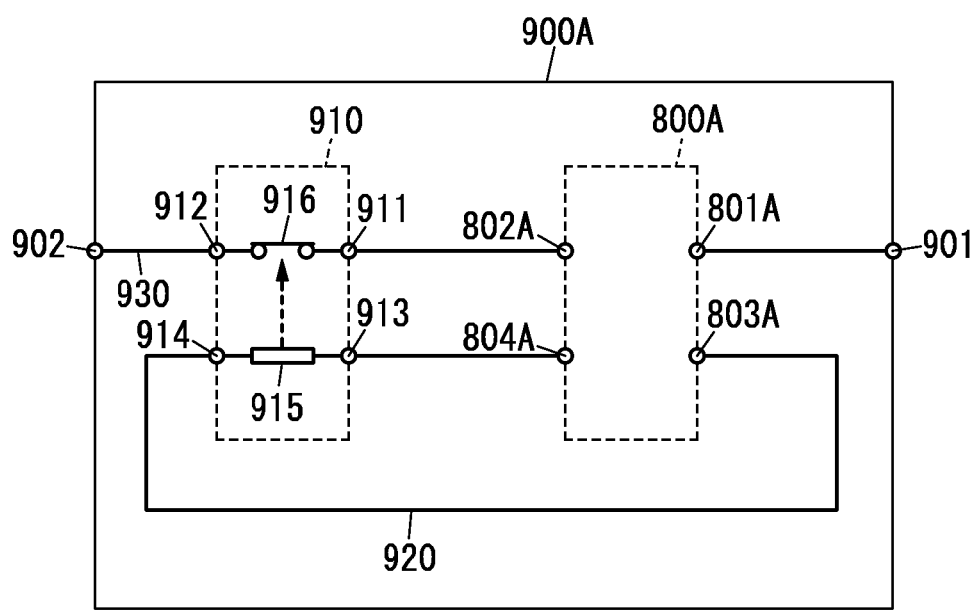
FIG. 32 is a configuration diagram of an interrupter system including a control system according to a second embodiment.

As shown in FIG. 32, the control system 800A includes a first end 801A and a second end 802A connected to the main electric circuit 930. The control system 800A also includes a third end 803A and a fourth end 804A connected to the auxiliary electric circuit 920. In other words, the driven unit 1 is connected between the third end 803A and the fourth end 804A. The intermediate electrical path 210 of the driving unit 2 is connected between the first end 801A and the second end 802A. The control system 800A uses, as a drive source for driving the driven unit 1 when an abnormal current flows through the main electric circuit 930, an abnormal current flowing through the intermediate electrical path 210. That is to say, in this control system 800A, the magnetic field generated by the abnormal current flowing through the intermediate electrical path 210 of the driving unit 2 is converted into electromotive force for driving a current flowing through the driven unit 1. This allows the control system 800A to supply a startup current to the interrupter 910 through the auxiliary electric circuit 920.

The connection pattern of the control system 800A in the interrupter system 900A may be the same as the connection pattern of the control system 800 in the interrupter system 900 according to the first embodiment, and description thereof will be omitted herein.

Figure 33:
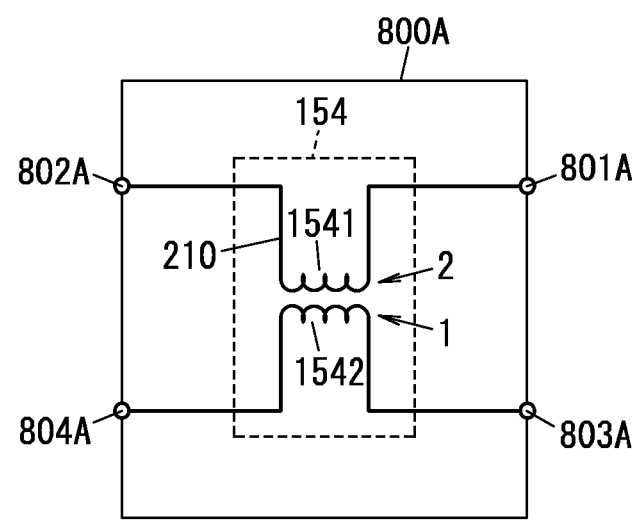
FIG. 33 is a configuration diagram of the control system.

More specifically, the control system 800A includes a transformer 154 as shown in FIG. 33. The transformer 154 includes a primary winding 1541 and a secondary winding 1542. The driven unit 1 includes the secondary winding 1542 and the driving unit 2 includes the primary winding 1541.

The primary winding 1541 is connected between the first end 801A and second end 802A of the control system 800A. In other words, the primary winding 1541 is connected to the main electric circuit 930. The primary winding 1541 forms at least part of the intermediate electrical path 210 of the driving unit 2. The secondary winding 1542 is connected between the third end 803A and fourth end 804A of the control system 800A. In other words, the secondary winding 1542 is connected to the auxiliary electric circuit 920. The secondary winding 1542 is electromagnetically coupled to the primary winding 1541. For example, the primary winding 1541 and the secondary winding 1542 may be wound around the same iron core and electromagnetically coupled together.

When a current flows through the primary winding 1541, an induced current flows through the secondary winding 1542. Thus, the induced current flows through the auxiliary electric circuit 920. In this case, when an abnormal current (i.e., a current having a current value equal to or greater than a prescribed value) flows through the primary winding 1541, the transformer 154 according to this embodiment outputs a startup current (i.e., a current having a current value equal to or greater than a predetermined value) from the secondary winding 1542.

When the abnormal current flows through the main electric circuit 930, the control system 800A according to this embodiment drives the current flowing through the secondary winding 1542 with the abnormal current flowing through the primary winding 1541. That is to say, an induced current is produced in the secondary winding 1542. The control system 800A outputs, as a startup current, the induced current flowing through the secondary winding 1542, thereby supplying the auxiliary electric circuit 920 with the startup current. That is to say, the control system 800A uses the abnormal current flowing through the primary winding 1541 as a drive source for driving the current on the secondary winding 1542 to supply the auxiliary electric circuit 920 with the startup current. This allows the interrupter 910 to be activated to interrupt the main electric circuit 930. This embodiment also shortens the time it takes to activate the interrupter 910 (i.e., the time it takes for the interrupter 910 to start operating) compared to the electric circuit of Patent Literature 1.

(2.1) First Variation

Figure 34:
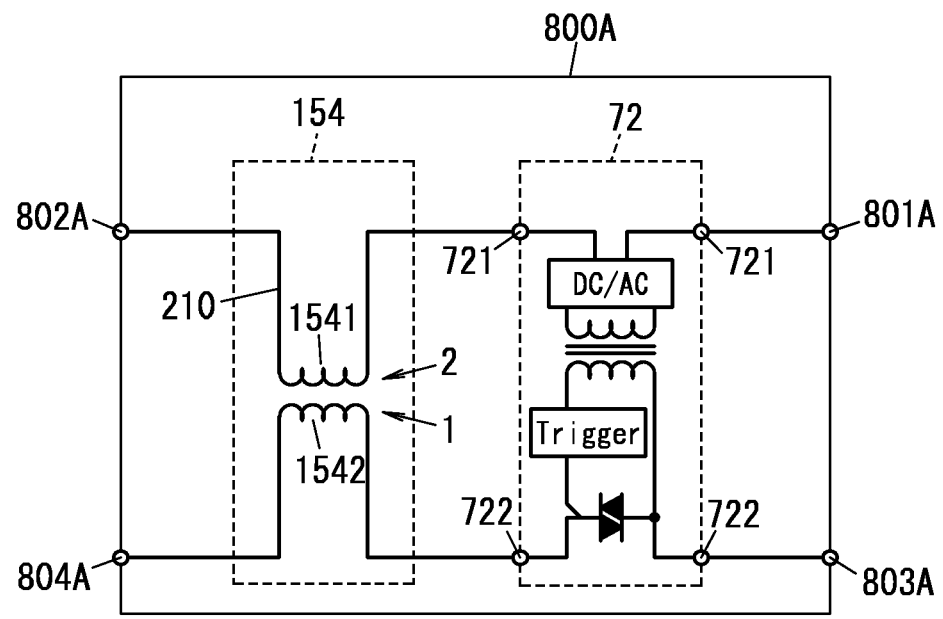
FIG. 34 is a configuration diagram of a control system according to a first variation of the second embodiment.

As a first variation of this embodiment, the control system 800A may include a semiconductor relay 72 as shown in FIG. 34.

The semiconductor relay 72 includes a pair of input ends 721 and a pair of output ends 722. One of the pair of input ends 721 of the semiconductor relay 72 is connected to a first end 801A of the control system 800A. A primary winding 1541 is connected between the other of the pair of input ends 721 and a second end 802A of the control system 800A. One of the pair of output ends 722 of the semiconductor relay 72 is connected to a third end 803A of the control system 800A. A secondary winding 1542 is connected between the other of the pair of output ends 722 and a fourth end 804A of the control system 800A. As shown in FIG. 34, the semiconductor relay 72 according to this embodiment is implemented as a transformer-coupled SSR.

The semiconductor relay 72 is turned ON by the abnormal current flowing through the main electric circuit 930 (intermediate electrical path 210). When the semiconductor relay 72 turns ON, the auxiliary electric circuit 920 is closed and an induced current is caused to flow through the secondary winding 1542 by the current flowing through the primary winding 1541 of the transformer 154. This causes the induced current (startup current) to flow through the auxiliary electric circuit 920.

As a result, the startup current is supplied from the current supply source 150 to the heat generating element of the interrupter 910 to activate the interrupter 910 and interrupt the main electric circuit 930.

According to this variation, the semiconductor relay 72 may prevent a current from flowing from the auxiliary electric circuit 920 to the interrupter 910 while no abnormal current is flowing through the main electric circuit 930.

(2.2) Second Variation

Figure 35A:
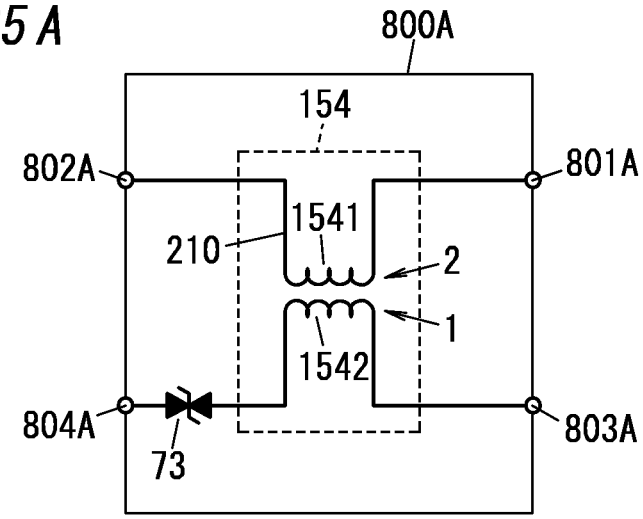
FIG. 35A is a configuration diagram of a control system according to a second variation of the second embodiment.

As a second variation of this embodiment, the control system 800A may include a current control element (bidirectional Zener diode 73) as shown in FIG. 35A.

A first end of the bidirectional Zener diode 73 is connected to a fourth end 804A of the control system 800A and a secondary winding 1542 of a transformer 154 is connected between a second end of the bidirectional Zener diode 73 and a third end 803A of the control system 800A. In other words, the bidirectional Zener diode 73 is connected to the auxiliary electric circuit 920.

The breakdown voltage of the bidirectional Zener diode 73 is set at a voltage approximately equal to the voltage generated on the secondary winding 1542 when an abnormal current flows through the primary winding 1541.

According to this variation, if the current flowing through the primary winding 1541 (intermediate electrical path 210) is smaller than a prescribed value, the voltage generated on the secondary winding 1542 is lower than the breakdown voltage of the bidirectional Zener diode 73, and therefore, no current flows through the auxiliary electric circuit 920. That is to say, the bidirectional Zener diode 73 prevents a current, having a current value equal to or less than a predetermined value, from flowing through the auxiliary electric circuit 920.

On the other hand, when an abnormal current larger than the prescribed value flows through the primary winding 1541, the voltage generated on the secondary winding 1542 becomes greater than the breakdown voltage of the bidirectional Zener diode 73, thus causing a current (i.e., a startup current having a current value equal to or greater than a predetermined value) to flow through the auxiliary electric circuit 920. As a result, the startup current is supplied from the current supply source 150 to the heat generating element of the interrupter 910 to activate the interrupter 910 and thereby interrupt the main electric circuit 930.

According to this variation, the bidirectional Zener diode 73 may prevent a current from flowing from the auxiliary electric circuit 920 to the interrupter 910 while no abnormal current is flowing through the main electric circuit 930.

Note that the current control element does not have to be the Zener diode 73 but may also be thyristor, for example.

Figure 35B:
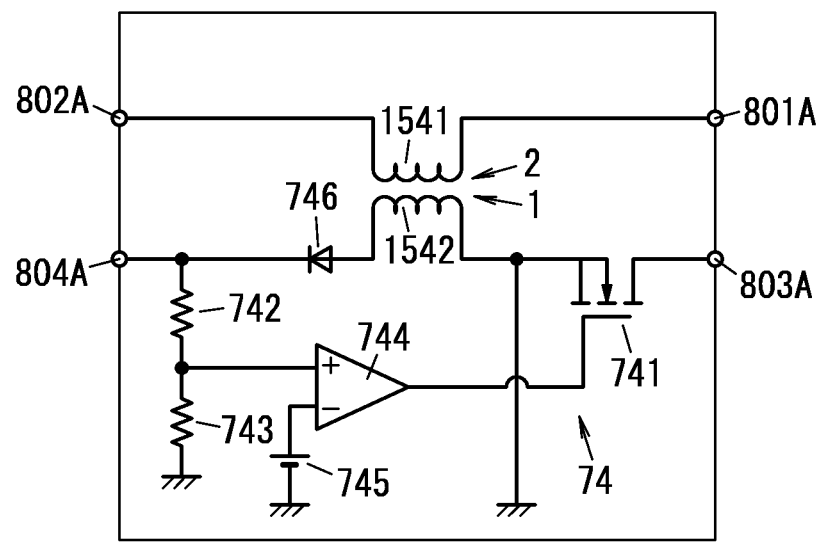
FIG. 35B is a configuration diagram of the control system according to the second variation of the second embodiment.

Alternatively, as shown in FIG. 35B, the control system 800A may include a current control circuit 74 that prevents a current having a current value less than a predetermined value (i.e., a current having a smaller current value than the startup current) from flowing through the auxiliary electric circuit 920. The current control circuit 74 includes a switch 741, voltage-dividing resistors 742, 743, a comparator 744, a constant voltage source 745, and a diode 746. The switch 741 is an enhancement n-channel MOSFET, of which the drain is connected to a third end 803A of the control system 800A, the source is connected to one end of a secondary winding 1542, and the gate is connected to an output terminal of the comparator 744. The voltage-dividing resistors 742, 743 are connected in series between a fourth end 804A of the control system 800A and the ground. The comparator 744 has its non-inverting input terminal connected to a node of connection between the voltage-dividing resistors 742, 743 and has its inverting input terminal connected to the ground via the constant voltage source 745. The diode 746 has its anode connected to the other end of the secondary winding 1542 and has its cathode connected to a fourth end 804A of the control system 800A. Also, the node of connection between the source of the switch 741 and the secondary winding 1542 is connected to the ground.

In this current control circuit 74, if the voltage generated across the secondary winding 1542 is less than the predetermined threshold voltage (specifically, if the voltage obtained by dividing the voltage generated across the secondary winding 1542 by the voltage-dividing resistors 742, 743 is less than the voltage of the constant voltage source 745), the switch 741 is turned OFF and no current flows through the auxiliary electric circuit 920. On the other hand, when the voltage generated across the secondary winding 1542 exceeds the predetermined threshold voltage, the switch 741 is turned ON to cause a current (startup current) to flow through the auxiliary electric circuit 920.

According to this variation, the current control circuit 74 may also prevent a current from flowing from the auxiliary electric circuit 920 to the interrupter 910 while no abnormal current is flowing through the main electric circuit 930.

(2.3) Third Variation

According to a third variation of this embodiment, the control system 800A may supply the startup current to the auxiliary electric circuit 920 in response to a steep variation in current flowing through the main electric circuit 930.

Figure 36:
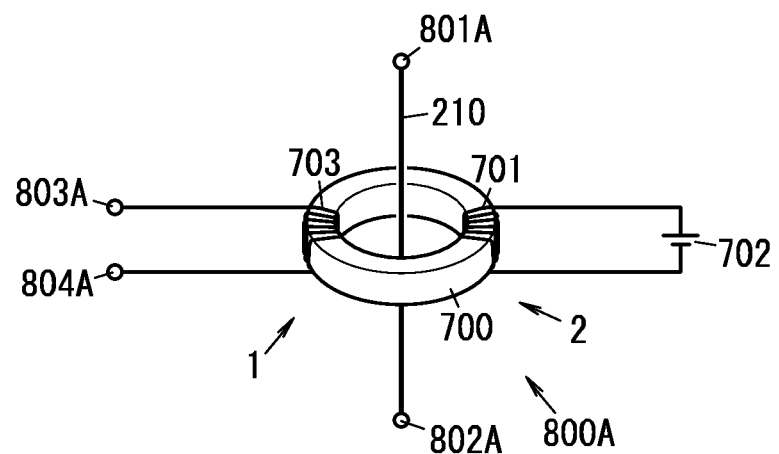
FIG. 36 is a configuration diagram of a control system according to a third variation of the second embodiment.

In one example, as shown in FIG. 36, the driving unit 2 of the control system 800A includes: an iron core 700 through which the intermediate electrical path 210 forming part of the main electric circuit 930 runs; a primary winding 701 wound around the iron core 700; and a current supply source 702 that supplies a steady-state current to the primary winding 701. The driven unit 1 includes a secondary winding 703 wound around the iron core 700.

According to this variation, the iron core 700 is magnetically saturated by a magnetic flux generated by the steady-state current supplied from the current supply source 702 to the primary winding 701. When an abnormal current flows through the intermediate electrical path 210 in this state, the current flowing through the intermediate electrical path 210 varies steeply. This causes a variation in the magnetic flux passing through the iron core 700 (i.e., the magnetic flux passing through the secondary winding 703) and also causes a current to flow through the secondary winding 703 to allow the startup current to be supplied to the auxiliary electric circuit 920.

Optionally, the control system 800A according to this variation may be used as the driving unit 2 for the switch system 100 according to the first embodiment and its variations. For example, both ends of the secondary winding 703 may be connected to the first end 101 and the second end 102, respectively, in the first variation of the first embodiment (see FIGS. 3 and 4). In that case, when a current flows through the secondary winding 703, the driving unit 2 may be activated to drive the driven unit 1 (i.e., turn the contact device 11 ON).

(3) Third Embodiment

A control system 800B and interrupter system 900B according to a third embodiment will be described with reference to FIG. 37. In the following description, any constituent element of this third embodiment, having the same function as a counterpart of the first and second embodiments (and their variations) described above, will be designated by the same reference numeral as that counterpart's, and description thereof will be omitted herein as appropriate.

The control system 800B according to this embodiment includes a first control system 810 and a second control system 820. The first control system 810 includes a first driving unit 2A and a first driven unit 1A. The second control system 820 includes a second driving unit 2B and a second driven unit 1B. The first driving unit 2A and first driven unit 1A and the second driving unit 2B and second driven unit 1B correspond to the driving unit 2 and driven unit 1 that have already been described for the first and second embodiments and their variations.

Figure 37:
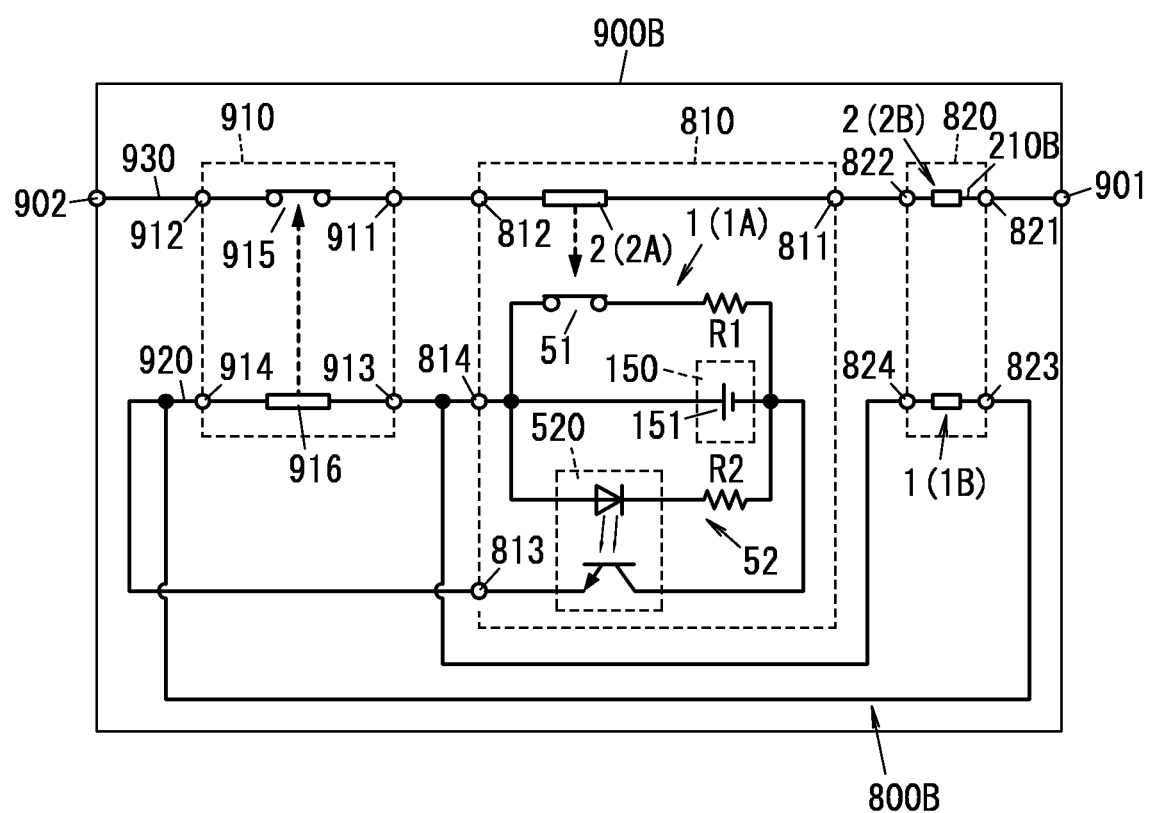
FIG. 37 is a configuration diagram of an interrupter system including a control system according to a third embodiment.

As shown in FIG. 37, the first control system 810 includes a first end 811 and a second end 812 that are connected to the main electric circuit 930. The first control system 810 also includes a third end 813 and a fourth end 814 that are connected to the auxiliary electric circuit 920. The second control system 820 includes a first end 821 and a second end 822 that are connected to the main electric circuit 930. The second control system 820 also includes a third end 823 and a fourth end 824 that are connected to the auxiliary electric circuit 920.

The first end 821 of the second control system 820 is connected to a first end 901 of an interrupter system 900B. The second end 822 of the second control system 820 is connected to the first end 811 of the first control system 810. The second end 812 of the first control system 810 is connected to a first end 911 of the interrupter 910. That is to say, the first control system 810 and the second control system 820 (more specifically, the first driving unit 2A and the second driving unit 2B) are connected to the main electric circuit 930 (i.e., an electrical conductor 916 of the interrupter 910) in series.

The third end 813 of the first control system 810 and the third end 823 of the second control system 820 are connected to a fourth end 914 of the interrupter 910. The fourth end 814 of the first control system 810 and the fourth end 824 of the second control system 820 are connected to a third end 913 of the interrupter 910.

The driven unit 1 (i.e., first driven unit 1A) of the first control system 810 is connected between the third end 813 and the fourth end 814. The intermediate electrical path 210 (first intermediate electrical path) of the driving unit 2 (first driving unit 2A) of the first control system 810 is connected between the first end 811 and the second end 812. When an abnormal current flows through the main electric circuit 930, the first control system 810 uses, as a drive source for driving the first driven unit 1A, the abnormal current flowing through the first intermediate electrical path 210. This allows the first control system 810 to supply the startup current to the interrupter 910 via the auxiliary electric circuit 920.

The driven unit 1 (i.e., second driven unit 1B) of the second control system 820 is connected between the third end 823 and the fourth end 824. The intermediate electrical path (second intermediate electrical path 210B) of the driving unit 2 (second driving unit 2B) of the second control system 820 is connected between the first end 821 and the second end 822. When an abnormal current flows through the main electric circuit 930, the second control system 820 uses, as a drive source for driving the second driven unit 1B, the abnormal current flowing through the second intermediate electrical path 210B. This allows the second control system 820 to supply the startup current to the interrupter 910 via the auxiliary electric circuit 920.

In the control system 800B according to this embodiment, if the driving unit 2 of either the first control system 810 or the second control system 820 drives its associated driven unit 1, then the startup current is supplied to the interrupter 910 via the auxiliary electric circuit 920. Thus, even if either the first control system 810 or the second control system 820 cannot operate normally due to a failure, for example, the startup current may be still be supplied by the other control system to the auxiliary electric circuit 920. This allows an unwanted situation where no startup current is supplied to the auxiliary electric circuit 920 when an abnormal current flows through the main electric circuit 930 to be avoided with more reliability.

In this embodiment, the first control system 810 is supposed to be the control system 800 according to the fourth variation of the first embodiment (i.e., the control system in which the driven unit 1 includes the contact device 51 and the signal inverter circuit 52). In addition, the second control system 820 is supposed to be the control system 800A according to the second embodiment (i.e., the control system in which the driving unit 2 includes the primary winding 1541 and the driven unit 1 includes the secondary winding 1542). If the first control system 810 and the second control system 820 include driven units 1 with different mechanisms, then their characteristics may be complementary ones. For example, the control system 800 according to the fourth variation of the first embodiment may operate with high reliability if the current value of the current is equal to or greater than the prescribed value but takes some time to be activated, which is a characteristic unique to the control system 800. On the other hand, the control system 800A according to the second embodiment is not easily activated unless the current value of the abnormal current is sufficiently large (i.e., the prescribed value for determining whether the given current is an abnormal current or not is relatively large) but is activated in a short time once the condition is met, which is a characteristic unique to the control system 800A. According to this embodiment, these two types of systems are combined, thus allowing the interrupter 910 to be activated in a short operating time with respect to an abnormal current having a current value falling within a broad range.

Figure 38:
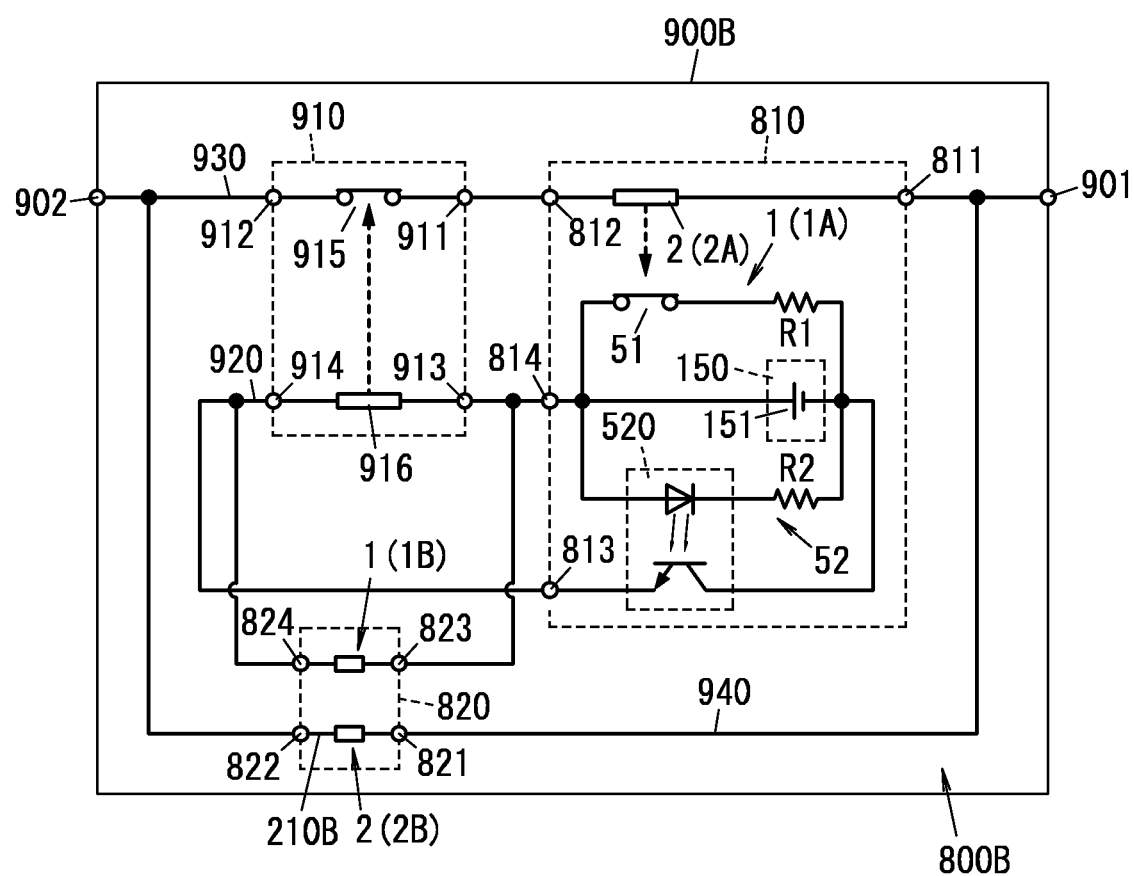
FIG. 38 is a configuration diagram illustrating a variation of the interrupter system.

Alternatively, in the control system 800B according to this embodiment, the first end 821 and second end 822 of the second control system 820 may be connected to a bypass electric circuit 940 which is connected to the main electric circuit 930 in parallel as shown in FIG. 38. In that case, when an abnormal current flows through a second intermediate electrical path 210B that forms part of the bypass electric circuit 940 connected to the main electric circuit 930, the second driving unit 2B of the second control system 820 drives the second driven unit 1B. In the example illustrated in FIG. 38, the bypass electric circuit 940 is connected in parallel to a series circuit of the interrupter 910 (between the first end 911 and second end 912 thereof) and the first control system 810 (between the first end 811 and second end 812 thereof). However, this is only an example of the present disclosure and should not be construed as limiting. Alternatively, the bypass electric circuit 940 may be connected in parallel to only the interrupter 910 or only the first control system 810.

Optionally, the control system 800B may include not only the first control system 810 and the second control system 820 but also another control system including the driving unit 2 and the driven unit 1.

That is to say, in the control system 800B according to this embodiment, the driving unit 2 includes a plurality of driving units 2 (namely, the first driving unit 2A and the second driving unit 2B). Each of the plurality of driving units 2 includes an intermediate electrical path (210, 210B) connected to the main electric circuit 930. In addition, the driven unit 1 includes a plurality of driven units 1 (namely, the first driven unit 1A and the second driven unit 1B) corresponding one to one to the plurality of driving units 2 (namely, the first driving unit 2A and the second driving unit 2B). Each of the plurality of driving units 2 uses, when an abnormal current flows through its associated intermediate electrical path 210, the abnormal current as a drive source for driving its corresponding driven unit 1. The driven unit 1 is driven by the corresponding driving unit 2, thereby supplying the startup current to the auxiliary electric circuit 920.

(4) Fourth Embodiment

A control system 800C and interrupter system 900C according to a fourth embodiment will be described with reference to FIG. 39.

In the interrupter system 900C according to this embodiment, the interrupter 910 is implemented as a pyro-fuse. As shown in FIG. 39, the interrupter 910 includes: a pyro-actuator 95 including the gas producer 915; a first fixed terminal 961 including a fixed contact F1; a second fixed terminal 962 including a fixed contact F2; and a moving contactor 963 including two moving contacts M1, M2. The interrupter 910 further includes a holder 964, a housing 965, and a yoke 966.

Inside the housing 965, arranged are a part of the first fixed terminal 961, a part of the second fixed terminal 962, the moving contactor 963, and the holder 964. The pyro-actuator 95 is held to pass through a through hole provided through the upper surface of the housing 965.

Each of the first fixed terminal 961 and the second fixed terminal 962 has electrical conductivity and may be formed integrally with the housing 965 by insert molding, for example. Part of each of the first fixed terminal 961 and second fixed terminal 962 is exposed outside of the housing 965 and another part thereof is arranged inside the housing 965. The respective parts, arranged inside the housing 965, of the first fixed terminal 961 and second fixed terminal 962 include portions serving as the fixed contacts F1, F2, respectively. That part, arranged outside the housing 965, of the first fixed terminal 961 is connected to a first end 901 of the interrupter system 900C. That part, arranged outside the housing 965, of the second fixed terminal 962 is connected to a second end 902 of the interrupter system 900C.

The moving contactor 963 is a plate-shaped member with electrical conductivity. The moving contactor 963 includes the moving contacts M1, M2 to come into contact with the fixed contacts F1, F2, respectively. The moving contactor 963 is held by the holder 964 (e.g., a coil spring in this embodiment) such that the moving contacts M1, M2 are connected to the fixed contacts F1, F2, respectively. The first fixed terminal 961 and the second fixed terminal 962 are short-circuited together via the moving contactor 963.

The pyro-actuator 95 includes the gas producer 915, a pressurizing chamber 951, and a piston (operating pin) 952. The gas producer 915 includes two pin electrodes 9151, a heat generating element 9152, and a fuel (explosive) such as nitrocellulose. The heat generating element 9152 may be a nichrome wire, for example. The heat generating element 9152 generates heat when a current flows therethrough. The heat generating element 9152 is connected to one end of each of the two pin electrodes 9151. The two pin electrodes 9151 are connected to terminals 923, 924, respectively.

When a current flows between the terminals 923 and 924, the current flows through the heat generating element 9152, thus causing the heat generating element 9152 to generate heat. The fuel in the gas producer 915 is ignited by the heat generated by the heat generating element 9152 and burns to cause the gas producer 915 to produce a gas. The gas produced by the gas producer 915 is introduced into the pressurizing chamber 951 to cause an increase in pressure inside the pressurizing chamber 951.

A portion around a first end (i.e., the upper end in FIG. 39) of the piston 952 forms part of an outer wall of the pressurizing chamber 951. The pressure of the gas in the pressurizing chamber 951 presses the first end of the piston 952, thus moving the piston 952. Then, the piston 952 presses the moving contactor 963 at the second end (lower end in FIG. 39). Thus, the piston 952 gives force to the moving contactor 963 in such a direction as to bring the moving contactor 963 out of contact with the two fixed contacts F1, F2 (i.e., force applied downward in FIG. 39), thus causing the moving contactor 963 to move.

Having the moving contactor 963 moved by being pressed by the piston 952 brings the moving contacts M1, M2 out of contact with the fixed contacts F1, F2, respectively, while having the holder 964 compressed. This causes the first fixed terminal 961 and the second fixed terminal 962 to be disconnected from each other, thus interrupting the main electric circuit 930.

Figure 39:
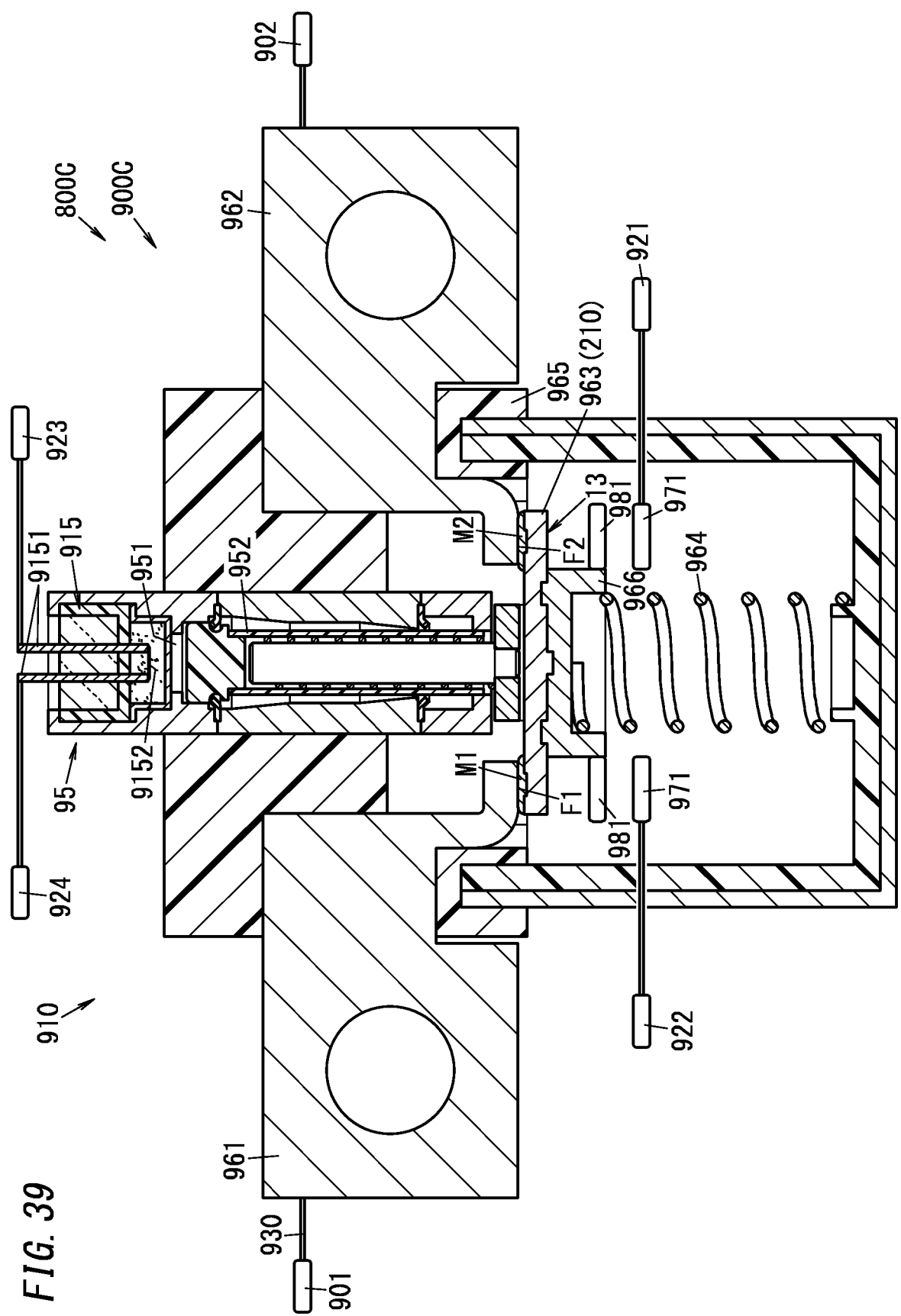
FIG. 39 is schematic cross-sectional view of an interrupter for use in an interrupter system including a control system according to a fourth embodiment.

As shown in FIG. 39, the interrupter 910 further includes auxiliary fixed contacts 971 (first contacts) and auxiliary moving contacts 981 (second contacts). The auxiliary moving contacts 981 are provided for a yoke 966 attached to one surface (the lower surface in FIG. 39) of the moving contactor 963 and move along with the moving contactor 963. The pair of moving contacts 981 is electrically continuous via an electrical conductor provided inside the yoke 966.

Each of the auxiliary fixed contacts 971 is arranged to face an associated auxiliary moving contact 981. One auxiliary fixed contact 971 is connected to a terminal 921 and the other auxiliary fixed contact 971 is connected to a terminal 922. In this embodiment, the terminal 921 is connected to a terminal 923 via the current supply source 150 and the auxiliary electric circuit 920. The terminal 922 is connected directly to a terminal 924.

In the interrupter system 900C according to this embodiment, when an abnormal current flows through the moving contactor 963 connected to the main electric circuit 930, electromagnetic repulsion is produced between the fixed contact F1 and the moving contact M1. This electromagnetic repulsion causes the moving contactor 963 to move downward in FIG. 39, thus bringing the pair of auxiliary moving contacts 981 into contact with the pair of auxiliary fixed contacts 971, respectively. This makes the electrical path between the pair of auxiliary fixed contacts 971 electrically continuous via the electrical conductor in the yoke 966, thus allowing the startup current to be supplied from the current supply source 150 to the gas producer 915 via the auxiliary electric circuit 920.

That is to say, in the interrupter system 900C according to this embodiment, the moving contactor 963 constitutes the intermediate electrical path 210 of the driving unit 2 and a contact device including the auxiliary moving contacts 981 and the auxiliary fixed contacts 971 constitutes the driven unit 1.

The interrupter system 900C according to this embodiment also shortens the time it takes to activate the interrupter 910 using a simple configuration.

Figure 40:
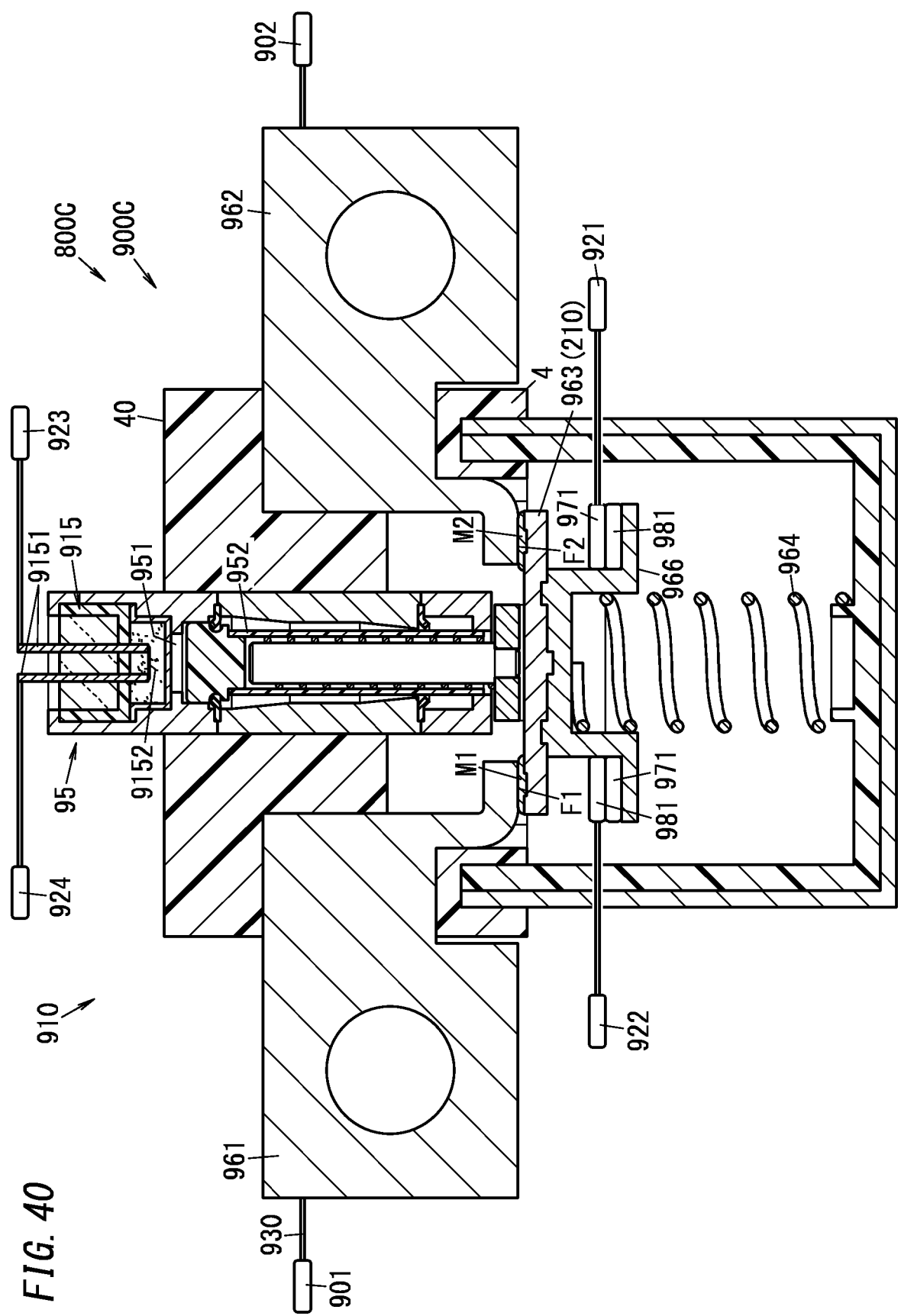
FIG. 40 is a schematic cross-sectional view of an interrupter according to a variation of the fourth embodiment.

Optionally, as shown in FIG. 40, the auxiliary fixed contacts 971 and the auxiliary moving contacts 981 may have the Form B contact structure.

(5) Other Variations

The interrupter system 900, 900A, 900B, 900C does not have to be used in the vehicle 300. Alternatively, the interrupter system 900, 900A may also be used to interrupt any arbitrary electric circuit through which a large current such as a short-circuit current could flow.

Optionally, the configurations of the first embodiment (including its variations), the second embodiment (including its variations), the third embodiment, and the fourth embodiment may be used in combination as appropriate.

(6) Aspects

As can be seen from the foregoing description of embodiments and their variations, a control system (800, 800A, 800B, 800C) according to a first aspect is designed to control an interrupter (910). The interrupter (910) is started by a startup current to interrupt a main electric circuit (930). The startup current flows through an auxiliary electric circuit (920) and has a current valve equal to or greater than a predetermined value. The control system (800, 800A, 800B, 800C) includes a driving unit (2) and a driven unit (1). The driving unit (2) includes an intermediate electrical path (210) to be connected to the main electric circuit (930). The driven unit (1) is to be connected to the auxiliary electric circuit (920). When an abnormal current having a current value equal to or greater than a prescribed value flows through the intermediate electrical path (210), the driving unit (2) uses, as a drive source for driving the driven unit (1), the abnormal current flowing through the intermediate electrical path (210). The driven unit (1) supplies the auxiliary electric circuit (920) with the startup current by being driven by the driving unit (2).

The control system (800, 800A, 800B, 800C) according to the first aspect is activated, when an abnormal current flows through the main electric circuit (930), to supply the auxiliary electric circuit (920) with the startup current. When the auxiliary electric circuit (920) is supplied with the startup current, the interrupter (910) interrupts the main electric circuit (930). This shortens the time it takes for the interrupter (910) to start operating when the abnormal current flows through the main electric circuit (930).

In a control system (800, 800B, 800C) according to a second aspect, which may be implemented in conjunction with the first aspect, the auxiliary electric circuit (920) is connected to a current supply source (150) to supply the startup current. The driven unit (1) is to be connected to the auxiliary electric circuit (920) in series with the current supply source (150) and is driven by the driving unit (2) to close the auxiliary electric circuit (920).

The second aspect allows the interrupter (910) to start operating in a shorter time using a simple configuration. In addition, the second aspect also prevents a current from flowing through the auxiliary electric circuit (920) when no abnormal current is flowing through the main electric circuit (930).

In a control system (800, 800B) according to a third aspect, which may be implemented in conjunction with the second aspect, the driven unit (1) includes a contact device (11). The contact device (11) includes a first contact (fixed contact 111, auxiliary fixed contact 421, fixed contact 511) and a second contact (moving contact 112, auxiliary moving contact 422, moving contact 512) to be connected to the auxiliary electric circuit (920). The second contact is movable between a closed position where the second contact is in contact with the first contact and an open position where the second contact is out of contact with the first contact. The driving unit (2) uses the abnormal current flowing through the intermediate electrical path (210) to move the second contact from the open position to the closed position.

According to the third aspect, the driven unit (1) is opened and closed by moving the second contact (moving contact 112) spatially (i.e., physically), thus increasing the reliability. In addition, the third aspect also prevents a current from flowing through the auxiliary electric circuit (920) when no abnormal current is flowing through the intermediate electrical path (210). Note that the first contact does not have to be fixed to a housing or any other member. That is to say, the first contact does not have to be a fixed contact.

In a control system (800, 800B) according to a fourth aspect, which may be implemented in conjunction with the third aspect, the driving unit (2) includes an excitation coil (211) and a mover (212). The excitation coil (211) forms at least part of the intermediate electrical path (210). The mover (212) is caused to move from a first position to a second position by the abnormal current flowing through the excitation coil (211). The contact device (11) is configured such that the second contact (moving contact 112) moves as the mover (212) moves, and that the second contact (moving contact 112) assumes the open position when the mover (212) is located at the first position and assumes the closed position when the mover (212) is located at the second position.

The fourth aspect allows the interrupter (910) to start operating in a shorter time using a simple configuration. In addition, the fourth aspect also prevents a current from flowing through the auxiliary electric circuit (920) when no abnormal current is flowing through the main electric circuit (930).

In a control system (800, 800B) according to a fifth aspect, which may be implemented in conjunction with the third aspect, the driving unit (2) includes a first yoke (221) and a second yoke (222). The first yoke (221) is fixed with respect to a wiring member (105) that forms at least part of the intermediate electrical path (210). The second yoke (222) is arranged to face the first yoke (221). The second yoke (222) is attracted toward the first yoke (221) and moves from the first position to the second position when the abnormal current flows through the wiring member (105). The contact device (11) is configured such that the second contact (moving contact 112) moves as the second yoke (222) moves, and that the second contact (moving contact 112) assumes the open position when the second yoke (222) is located at the first position and assumes the closed position when the second yoke (222) is located at the second position.

The fifth aspect allows the interrupter (910) to start operating in a shorter time using a simple configuration. In addition, the fifth aspect also prevents a current from flowing through the auxiliary electric circuit (920) when no abnormal current is flowing through the main electric circuit (930).

In a control system (800, 800B) according to a sixth aspect, which may be implemented in conjunction with the third aspect, the driving unit (2) includes a bimetallic plate (231). The bimetallic plate (231) is deformed from a first shape into a second shape by the abnormal current flowing through the intermediate electrical path (210). The contact device (11) is configured such that the second contact (moving contact 112) moves as the bimetallic plate (231) is deformed, and that the second contact (moving contact 112) assumes the open position when the bimetallic plate (231) has the first shape and assumes the closed position when the bimetallic plate (231) has the second shape.

The sixth aspect allows the interrupter (910) to start operating in a shorter time using a simple configuration. In addition, the sixth aspect also prevents a current from flowing through the auxiliary electric circuit (920) when no abnormal current is flowing through the main electric circuit (930).

In a control system (800, 800B) according to a seventh aspect, which may be implemented in conjunction with the third aspect, the driving unit (2) includes a main contact device (41). The main contact device (41) includes a main fixed contact (411) and a moving contactor (400). The moving contactor (400) constitutes the intermediate electrical path (210). The moving contactor (400) includes a main moving contact (412) to come into, and go out of, contact with the main fixed contact (411). The main contact device (41) moves the second contact (auxiliary moving contact 422) of the contact device (11) from the open position to the closed position using electromagnetic repulsion caused by the abnormal current flowing through the moving contactor (400).

The seventh aspect allows the interrupter (910) to start operating in a shorter time using a simple configuration. In addition, the seventh aspect also prevents a current from flowing through the auxiliary electric circuit (920) when no abnormal current is flowing through the main electric circuit (930).

In a control system (800, 800B) according to an eighth aspect, which may be implemented in conjunction with the third aspect, the driving unit (2) includes a main contact device (61) and a mover (first mover 622). The main contact device (61) includes a main fixed contact (611) and a main moving contact (612) to come into, and go out of, contact with the main fixed contact (411). The main contact device (61) forms at least part of the intermediate electrical path (210). The mover (first mover 622) moves as the main moving contact (612) moves. The mover (first mover 622) is caused to move from a first position to a second position by the abnormal current flowing through the main contact device (61). The contact device (11) is configured such that the second contact (moving contact 112) moves as the mover (first mover 622) moves, and that the second contact (moving contact 112) assumes the open position when the mover (first mover 622) is located at the first position and assumes the closed position when the mover (first mover 622) is located at the second position.

The eighth aspect allows the interrupter (910) to start operating in a shorter time using a simple configuration. In addition, the eighth aspect also prevents a current from flowing through the auxiliary electric circuit (920) when no abnormal current is flowing through the main electric circuit (930).

In a control system (800, 800B) according to a ninth aspect, which may be implemented in conjunction with the second aspect, the driven unit (1) includes a contact device (51) and a signal inverter circuit (52). The contact device (51) includes a first contact (fixed contact 511) and a second contact (moving contact 512) which are to be connected to the auxiliary electric circuit (920). The second contact is movable between a closed position where the second contact is in contact with the first contact and an open position where the second contact is out of contact with the first contact. The driving unit (2) uses the abnormal current flowing through the intermediate electrical path (210) to move the second contact from the closed position to the open position. The signal inverter circuit (52) prevents the startup current from being supplied to the auxiliary electric circuit (920) when the second contact assumes the closed position. The signal inverter circuit (52) allows the startup current to be supplied to the auxiliary electric circuit (920) when the second contact assumes the open position.

The ninth aspect allows the interrupter (910) to start operating in a shorter time using a simple configuration. In addition, the ninth aspect also prevents a current from flowing through the auxiliary electric circuit (920) when no abnormal current is flowing through the main electric circuit (930). Furthermore, the ninth aspect also reduces the chances of a bounceback being caused in the driven unit (1) (contact device 51) even when the abnormal current flows through the intermediate electrical path (210) to cause the driven unit 1 (contact device 51) to be driven by the driving unit (2).

In a control system (800, 800B) according to a tenth aspect, which may be implemented in conjunction with the ninth aspect, the driving unit (2) includes an excitation coil (211) and a mover (212). The excitation coil (211) forms at least part of the intermediate electrical path (210). The mover (212) is caused to move from a first position to a second position by the abnormal current flowing through the excitation coil (211). The contact device (51) is configured such that the second contact (moving contact 512) moves as the mover (212) moves, and that the second contact (moving contact 512) assumes the closed position when the mover (212) is located at the first position and assumes the open position when the mover (212) is located at the second position.

The tenth aspect allows the interrupter (910) to start operating in a shorter time using a simple configuration. In addition, the tenth aspect also prevents a current from flowing through the auxiliary electric circuit (920) when no abnormal current is flowing through the main electric circuit (930). Furthermore, the tenth aspect also reduces the chances of a bounceback being caused in the driven unit (1) (contact device 51).

In a control system (800, 800B) according to an eleventh aspect, which may be implemented in conjunction with the ninth aspect, the driving unit (2) includes a first yoke (221) and a second yoke (222). The first yoke (221) is fixed with respect to a wiring member (105) that forms at least part of the intermediate electrical path (210). The second yoke (222) is arranged to face the first yoke (221). The second yoke (222) is attracted toward the first yoke (221) and moves from the first position to the second position when the abnormal current flows through the wiring member (105). The contact device (51) is configured such that the second contact (moving contact 512) moves as the second yoke (222) moves, and that the second contact (moving contact 512) assumes the closed position when the second yoke (222) is located at the first position and assumes the open position when the second yoke (222) is located at the second position.

The eleventh aspect allows the interrupter (910) to start operating in a shorter time using a simple configuration. In addition, the eleventh aspect also prevents a current from flowing through the auxiliary electric circuit (920) when no abnormal current is flowing through the main electric circuit (930). Furthermore, the eleventh aspect also reduces the chances of a bounceback being caused in the driven unit (1) (contact device 51).

In a control system (800, 800B) according to a twelfth aspect, which may be implemented in conjunction with the ninth aspect, the driving unit (2) includes a bimetallic plate (231). The bimetallic plate (231) is caused to be deformed from a first shape into a second shape by the abnormal current flowing through the intermediate electrical path (210). The contact device (51) is configured such that the second contact (moving contact 512) moves as the bimetallic plate (231) is deformed, and that the second contact (moving contact 512) assumes the closed position when the bimetallic plate (231) has the first shape and assumes the open position when the bimetallic plate (231) has the second shape.

The twelfth aspect allows the interrupter (910) to start operating in a shorter time using a simple configuration. In addition, the twelfth aspect also prevents a current from flowing through the auxiliary electric circuit (920) when no abnormal current is flowing through the main electric circuit (930). Furthermore, the twelfth aspect also reduces the chances of a bounceback being caused in the driven unit (1) (contact device 51).

In a control system (800, 800B) according to a thirteenth aspect, which may be implemented in conjunction with the ninth aspect, the driving unit (2) includes a main contact device (41). The main contact device (41) includes a main fixed contact (411) and a moving contactor (400). The moving contactor (400) constitutes the intermediate electrical path (210). The moving contactor (400) includes a main moving contact (412) to come into, and go out of, contact with the main fixed contact (411). The main contact device (41) moves the second contact (auxiliary moving contact 422) of the contact device (11) from the closed position to the open position using electromagnetic repulsion caused by the abnormal current flowing through the moving contactor (400).

The thirteenth aspect allows the interrupter (910) to start operating in a shorter time using a simple configuration. In addition, the thirteenth aspect also prevents a current from flowing through the auxiliary electric circuit (920) when no abnormal current is flowing through the main electric circuit (930). Furthermore, the thirteenth aspect also reduces the chances of a bounceback being caused in the driven unit (1) (contact device 51).

In a control system (800, 800B) according to a fourteenth aspect, which may be implemented in conjunction with the ninth aspect, the driving unit (2) includes a main contact device (61) and a mover (first mover 622). The main contact device (61) includes a main fixed contact (611) and a main moving contact (612) to come into, and go out of, contact with the main fixed contact (611). The main contact device (61) forms at least part of the intermediate electrical path (210). The mover (first mover 622) moves as the main moving contact (612) moves. The mover (first mover 622) is caused to move from a first position to a second position by the abnormal current flowing through the main contact device (61). The contact device (51) is configured such that the second contact (moving contact 112) moves as the mover (first mover 622) moves, and that the second contact (moving contact 512) assumes the closed position when the mover (first mover 622) is located at the first position and assumes the open position when the mover (first mover 622) is located at the second position.

The fourteenth aspect allows the interrupter (910) to start operating in a shorter time using a simple configuration. In addition, the fourteenth aspect also prevents a current from flowing through the auxiliary electric circuit (920) when no abnormal current is flowing through the main electric circuit (930). Furthermore, the fourteenth aspect also reduces the chances of a bounceback being caused in the driven unit (1) (contact device 51).

In a control system (800, 800B) according to a fifteenth aspect, which may be implemented in conjunction with any one of the third to fourteenth aspects, the driven unit (1) includes not only a first contact device (11, 51) serving as the contact device (11, 51) but also a second contact device (13). The first contact device (11, 51) includes a first fixed contact (111, 511) serving as the first contact (fixed contact 111, 511) and a first moving contact (112, 512) serving as the second contact (moving contact 112, 512). The second contact device (13) includes a second fixed contact (131) and a second moving contact (132). The second fixed contact (131) and the second moving contact (132) are to be connected to the auxiliary electric circuit (920). The second moving contact (132) is movable between a closed position where the second moving contact (132) is in contact with the second fixed contact (131) and an open position where the second moving contact (132) is out of contact with the second fixed contact (131). A direction in which the first moving contact (112, 512) moves is different from a direction in which the second moving contact (132) moves.

The fifteenth aspect reduces the chances of the startup current flowing unnecessarily through the auxiliary electric circuit (920) due to impact, for example.

In a control system (800, 800B) according to a sixteenth aspect, which may be implemented in conjunction with the second aspect, the driven unit (1) includes a semiconductor relay (12) to be connected to the auxiliary electric circuit (920). The driving unit (2) includes a first winding (241) forming at least part of the intermediate electrical path (210) and a second winding (242) electromagnetically coupled to the first winding (241). The semiconductor relay (12) is driven by an induced current to close the auxiliary electric circuit (920). The induced current is produced in the second winding (242) by the abnormal current flowing through the first winding (241).

The sixteenth aspect allows the interrupter (910) to start operating in a shorter time using a simple configuration.

A control system (800, 800B) according to a seventeenth aspect, which may be implemented in conjunction with any one of the second to sixteenth aspects, includes not only a first switch unit (1) serving as the driven unit (1) but also a second switch unit (3) and a third switch unit (4). The second switch unit (3) is connected, on the auxiliary electric circuit (920), to the first switch unit (1) in series to open and close the auxiliary electric circuit (920). The third switch unit (4) is to be connected to the main electric circuit (930) to open and close the main electric circuit (930). The second switch unit (3) opens and closes the auxiliary electric circuit (920) in synch with opening and closing of the main electric circuit (930) by the third switch unit (4). The second switch unit (3) closes the auxiliary electric circuit (920) when the third switch unit (4) closes the main electric circuit (930) and opens the auxiliary electric circuit (920) when the third switch unit (4) opens the main electric circuit (930).

The seventeenth aspect reduces the chances of the startup current flowing unnecessarily through the auxiliary electric circuit (920).

A control system (800, 800B) according to an eighteenth aspect, which may be implemented in conjunction with any one of the second to seventeenth aspects, further includes the current supply source (150).

The eighteenth aspect allows the interrupter (910) to start operating in a shorter time using a simple configuration.

In a control system (800, 800B) according to a nineteenth aspect, which may be implemented in conjunction with any one of the second to eighteenth aspects, the current supply source (150) includes a constant voltage source (151) to output a predetermined voltage.

The nineteenth aspect allows, when the auxiliary electric circuit (920) is closed, the startup current to be supplied with good stability from the constant voltage source (151) to the auxiliary electric circuit (920).

In a control system (800, 800B) according to a twentieth aspect, which may be implemented in conjunction with any one of the second to nineteenth aspects, the current supply source (150) includes a transformer (154). The transformer (154) includes a primary winding (1541) and a secondary winding (1542). The primary winding (1541) is connected to the main electric circuit (930). The secondary winding (1542) is electromagnetically coupled to the primary winding (1541) and connected to the auxiliary electric circuit (920). The current supply source (150) uses the abnormal current flowing through the primary winding (1541) to supply the startup current from the secondary winding (1542).

The twentieth aspect allows the interrupter (910) to start operating in a shorter time using a simple configuration.

In a control system (800, 800B) according to a twenty-first aspect, which may be implemented in conjunction with any one of the second to twentieth aspects, the current supply source (150) includes a capacitor (152).

The twenty-first aspect allows the interrupter (910) to start operating in a shorter time using a simple configuration.

In a control system (800A, 800B) according to a twenty-second aspect, which may be implemented in conjunction with the first aspect, the driving unit (2) includes a primary winding (1541). The primary winding (1541) forms at least part of the intermediate electrical path (210). The driven unit (1) includes a secondary winding (1542). The secondary winding (1542) is electromagnetically coupled to the primary winding (1541) and connected to the auxiliary electric circuit (920). The control system (800A) uses the abnormal current flowing through the primary winding (1541) to supply the startup current from the secondary winding (1542).

The twenty-second aspect allows the interrupter (910) to start operating in a shorter time using a simple configuration.

In a control system (800, 800A, 800B) according to a twenty-third aspect, which may be implemented in conjunction with the first aspect, the driving unit (2) includes an iron core (700), a primary winding (701), and a current supply source (702). The iron core (700) allows the intermediate electrical path (210) to run therethrough. The primary winding (701) is wound around the iron core (700). The current supply source (702) supplies a current to the primary winding (701). The driven unit (1) includes a secondary winding (703) wound around the iron core (700).

The twenty-third aspect allows the interrupter (910) to start operating in a shorter time using a simple configuration.

A control system (800A, 800B) according to a twenty-fourth aspect, which may be implemented in conjunction with the twenty-second or twenty-third aspect, further includes a semiconductor relay (72). The semiconductor relay (72) is to be connected to the auxiliary electric circuit (920) to open and close the auxiliary electric circuit (920). The semiconductor relay (72) uses, as a drive source, the abnormal current flowing through the intermediate electrical path (210) to close the auxiliary electric circuit (920).

The twenty-fourth aspect prevents a current (induced current from the secondary winding 1542) from flowing through the auxiliary electric circuit (920) when no abnormal current is flowing through the main electric circuit (930).

A control system (800A, 800B) according to a twenty-fifth aspect, which may be implemented in conjunction with any one of the twenty-second to twenty-fourth aspects, further includes a current control element (Zener diode 73) or current control circuit (74). Each of the current control element (Zener diode 73) and the current control circuit (74)

is connected to the auxiliary electric circuit (920). Either the current control element (Zener diode 73) or the current control circuit (74) prevents a current, having a current value smaller than the predetermined value, from flowing through the auxiliary electric circuit (920).

The twenty-fifth aspect prevents a current (induced current from the secondary winding 1542) from flowing through the auxiliary electric circuit (920) when no abnormal current is flowing through the main electric circuit (930).

A control system (800B) according to a twenty-sixth aspect, which may be implemented in conjunction with any one of the first to twenty-fifth aspects, includes not only a first driving unit (2A) serving as the driving unit (2) but also a second driving unit (2B). The control system (800B) includes not only a first driven unit (1A) serving as the driven unit (1) but also a second driven unit (1B). The second driving unit (2B) includes a second intermediate electrical path (210B) to be connected to the main electric circuit (930). The second driven unit (1B) is to be connected to the auxiliary electric circuit (920). The second driving unit (2B) uses the abnormal current as a drive source for driving the second driven unit (1B) when the abnormal current flows through the second intermediate electrical path (210B). The second driven unit (1B) supplies the startup current to the auxiliary electric circuit (920) by being driven by the second driving unit (2B).

The twenty-sixth aspect allows the interrupter (910) to start operating with more reliability when the abnormal current flows through the main electric circuit (930), compared to a situation where only one of the first driven unit or the second driven unit is provided.

In a control system (800B) according to a twenty-seventh aspect, which may be implemented in conjunction with the twenty-sixth aspect, the first driven unit (1A) includes a contact device (51) and a signal inverter circuit (52). The contact device (51) includes a first contact (fixed contact 511) and a second contact (moving contact 512) which are to be connected to the auxiliary electric circuit (920). The second contact is movable between a closed position where the second contact is in contact with the first contact and an open position where the second contact is out of contact with the first contact. The first driving unit (2A) uses the abnormal current flowing through the intermediate electrical path (210) to move the second contact from the closed position to the open position. The signal inverter circuit (52) prevents the startup current from being supplied to the auxiliary electric circuit (920) when the second contact assumes the closed position. The signal inverter circuit (52) allows the startup current to be supplied to the auxiliary electric circuit (920) when the second contact assumes the open position. The second driving unit (2B) includes a primary winding (1541). The primary winding (1541) forms at least part of the second intermediate electrical path (210B). The second driven unit (1B) includes a secondary winding (1542). The secondary winding (1542) is electromagnetically coupled to the primary winding (1541) and connected to the auxiliary electric circuit (920). The control system (800B) uses the abnormal current flowing through the primary winding (1541) to supply the startup current from the secondary winding (1542) to the auxiliary electric circuit (920).

The control system (800B) according to the twenty-seventh aspect allows the interrupter (910) to start operating with more reliability when the abnormal current flows through the main electric circuit (930).

In a control system (800C) according to a twenty-eighth aspect, which may be implemented in conjunction with the first or second aspect, the interrupter (910) includes a moving contactor (963), a fixed terminal (961), a holder (964), an auxiliary moving contact (971), and an auxiliary fixed contact (981). The moving contactor (963) constitutes the intermediate electrical path (210) of the driving unit (2). The fixed terminal (961) comes into contact with the moving contactor (963). The holder (964) gives the moving contactor (963) holding force for keeping the moving contactor (963) in contact with the fixed terminal (961). The auxiliary moving contact (981) moves as the moving contactor (963) moves. The auxiliary fixed contact (971) faces the auxiliary moving contact (981). The moving contactor (963) moves from a first position to a second position by overcoming the holding force with electromagnetic repulsion caused by the abnormal current flowing through the moving contactor (963). One position selected from the group consisting of the first position and the second position is a position where the auxiliary moving contact (981) is out of contact with the auxiliary fixed contact (971). The other position selected from the group consisting of the first position and the second position is a position where the auxiliary moving contact (981) is in contact with the auxiliary fixed contact (971).

The control system (800C) according to the twenty-eighth aspect allows the interrupter (910) to start operating in a shorter time using a simple configuration.

An interrupter system (900, 900A, 900B, 900C) according to a twenty-ninth aspect includes the control system (800, 800A, 800B, 800C) according to any one of the first to twenty-eighth aspects and the interrupter (910).

The twenty-ninth aspect allows, when an abnormal current flows through the main electric circuit (930), the interrupter (910) to start operating in a shorter time.

Note that the constituent elements according to the second to twenty-eighth aspects are not essential constituent elements for the control system (800, 800A, 800B, 800C) but may be omitted as appropriate.

REFERENCE SIGNS LIST

105 Wiring Member
1 Driven Unit, First Switch Unit
11 Contact Device, First Contact Device
111 Fixed Contact, First Fixed Contact (First Contact)
112 Moving Contact, First Moving Contact (Second Contact)
12 Semiconductor Relay
13 Second Contact Device
131 Second Fixed Contact
132 Second Moving Contact
1A First Driven Unit
1B Second Driven Unit
2 Driving Unit
210 Intermediate Electrical Path
211 Excitation Coil
212 Mover
221 First Yoke
222 Second Yoke
231 Bimetallic Plate
241 First Winding
242 Second Winding
3 Second Switch Unit
4 Third Switch Unit
2A First Driving Unit
2B Second Driving Unit
210B Intermediate Electrical Path
150 Current Supply Source
151 Constant Voltage Source 152 Capacitor
154 Transformer
1541 Primary Winding
1542 Secondary Winding
400 Moving Contactor
41 Main Contact Device
411 Main Fixed Contact
412 Main Moving Contact
421 Auxiliary Fixed Contact
422 Auxiliary Moving Contact
51 Contact Device
511 Fixed Contact
512 Moving Contact
52 Signal Inverter Circuit
61 Main Contact Device
611 Main Fixed Contact
612 Main Moving Contact
622 First Mover (Mover)
700 Iron Core
701 Primary Winding
702 Current Supply Source
703 Secondary Winding
72 Semiconductor Relay
73 Bidirectional Zener Diode (Current Control Element)
800, 800A, 800B, 800C Control System
900, 900A, 900B, 900C Interrupter System
910 Interrupter
920 Auxiliary Electric Circuit
930 Main Electric Circuit
961 Fixed Terminal
963 Moving Contactor
964 Holder
971 Auxiliary Moving Contact
981 Auxiliary Fixed Contact

What is claimed is:

1. An interrupter system, comprising:
a first coil; and
an interrupter electrically connected to the first coil,
wherein the interrupter includes:
   a first terminal;
   a second terminal electrically connected to the first terminal;
   a third terminal electrically separated from the first terminal and the second terminal;
   a heat generating element electrically connected to the third terminal; and
   an explosive configured to be ignited by the heat generating element to produce a gas for interrupting an electrical connection path between the first terminal and the second terminal by rupturing the electrical connection path via pressure of the gas,
the first coil is electrically connected to the heat generating element via the third terminal,
the first coil is configured to, when an abnormal current flows between the first terminal and the second terminal, generate an electric power for igniting the explosive from the abnormal current,
the interrupter further includes a switch which is electrically connected to the first coil, and
when the abnormal current flows between the first terminal and the second terminal, the switch supplies the electric power to the heat generating element.

2. The interrupter system of claim 1, wherein
the switch includes a Zener diode or a thyristor, and
the interrupter system is configured such that the electric power generated by the first coil is supplied to the heat generating element when a voltage of the electric power generated by the first coil is greater than a certain voltage depending on the Zener diode or the thyristor.

3. The interrupter system of claim 2, wherein
the certain voltage depending on the Zener diode or the thyristor is greater than or equal to a voltage allowing the heat generating element to ignite the explosive.

4. The interrupter system of claim 1, wherein
the switch is configured to be:
   turned off when a voltage across the first coil is less than a threshold voltage; and
   turned on when the voltage across the first coil is greater than the threshold voltage.

5. The interrupter system of claim 4, wherein the threshold voltage corresponds to a voltage generated across the first coil when the abnormal current flows through, the threshold voltage being greater than or equal to a voltage allowing the heat generating element to ignite the explosive.

6. The interrupter system of claim 1, further comprising:
a second coil electrically connected the first terminal and magnetically coupled to the first coil, wherein
the first coil is configured to generate an electric power for igniting the explosive by the abnormal current flowing through the second coil.

7. The interrupter system of claim 6, further comprising:
an iron core to which the first coil and the second coil are provided.

8. The interrupter system of claim 1, further comprising:
an iron core to which the first coil is provided.

9. The interrupter system of claim 8, wherein
the iron core has a ring shape, and
the abnormal current passes through a ring of the iron core.

10. The interrupter system of claim 9, further comprising:
a second coil provided to the iron core.

* * * * *